(12) United States Patent
Hiroki

(10) Patent No.: US 9,312,153 B2
(45) Date of Patent: Apr. 12, 2016

(54) SUBSTRATE PROCESSING SYSTEM, TRANSFER MODULE, SUBSTRATE PROCESSING METHOD, AND METHOD FOR MANUFACTURING SEMICONDUCTOR ELEMENT

(75) Inventor: Tsutomu Hiroki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/814,358

(22) PCT Filed: Aug. 3, 2011

(86) PCT No.: PCT/JP2011/004401
§ 371 (c)(1),
(2), (4) Date: Apr. 19, 2013

(87) PCT Pub. No.: WO2012/017653
PCT Pub. Date: Feb. 9, 2012

(65) Prior Publication Data
US 2013/0202387 A1 Aug. 8, 2013

(30) Foreign Application Priority Data

Aug. 6, 2010 (JP) .................................. 2010-178165

(51) Int. Cl.
*H01L 21/67* (2006.01)
*H01L 21/677* (2006.01)

(52) U.S. Cl.
CPC ...... *H01L 21/67184* (2013.01); *H01L 21/6719* (2013.01); *H01L 21/67161* (2013.01);
(Continued)

(58) Field of Classification Search
CPC .................. H01L 21/67201; H01L 21/67742; H01L 21/67772; H01L 21/68707; H01L 21/67745; H01L 21/67748; H01L 21/67778; H01L 21/67781; H01L 21/67167; H01L 21/67173; H01L 21/67178; H01L 21/67184
USPC .................................. 414/217, 935, 937, 939
See application file for complete search history.

(56) References Cited

U.S. PATENT DOCUMENTS 5,846,328 A * 12/1998 Aruga et al. .................. 118/718
6,053,980 A * 4/2000 Suda et al. .................... 118/719
(Continued)

FOREIGN PATENT DOCUMENTS

CN 1517769 A 8/2004
JP 4-240721 A 8/1992
(Continued)

OTHER PUBLICATIONS

Written Opinion of the International Search Authority (Form PCT/ISA/237) mailed Nov. 1, 2011.
(Continued)

*Primary Examiner* — Glenn Myers
(74) *Attorney, Agent, or Firm* — Rothwell, Figg, Ernst & Manbeck, P.C.

(57) ABSTRACT

A substrate processing system is provided with: a first transfer unit, which extends from a loader module to a first processing chamber for processing substrates, to transfer the substrates; and a second transfer unit, which is provided below or above the first transfer unit and extends from the loader module to a second processing chamber for processing substrates, to transfer the substrates. The first processing chamber and the second processing chamber do not overlap in the vertical direction, and are disposed at positions separated from each other in a plan view. At the same time, at least a part of the first transfer unit and at least a part of the second transfer unit overlap each other in the vertical direction.

35 Claims, 28 Drawing Sheets

(52) U.S. Cl.
CPC .... *H01L21/67178* (2013.01); *H01L 21/67196* (2013.01); *H01L 21/67201* (2013.01); *H01L 21/67703* (2013.01); *H01L 21/67739* (2013.01); *H01L 21/67167* (2013.01)

(56) References Cited

U.S. PATENT DOCUMENTS

| | | | |
|---|---|---|---|
| 6,176,667 B1 * | 1/2001 | Fairbairn et al. | 414/217 |
| 6,270,306 B1 * | 8/2001 | Otwell et al. | 414/222.13 |
| 6,382,895 B1 | 5/2002 | Konishi et al. | |
| 6,391,114 B1 * | 5/2002 | Kirimura | 118/719 |
| 6,428,262 B1 * | 8/2002 | Vanderpot et al. | 414/217 |
| 6,540,869 B2 * | 4/2003 | Saeki et al. | 156/345.31 |
| 6,634,845 B1 * | 10/2003 | Komino | 414/217 |
| 6,930,050 B2 | 8/2005 | Kim et al. | 438/716 |
| 7,010,388 B2 * | 3/2006 | Mitchell et al. | 700/218 |
| 7,244,086 B2 * | 7/2007 | Ostermann et al. | 414/217 |
| 7,246,985 B2 * | 7/2007 | Ferrara | 414/217 |
| 7,949,425 B2 * | 5/2011 | Mitchell et al. | 700/228 |
| 8,277,161 B2 * | 10/2012 | Aburatani et al. | 414/217 |
| 8,292,563 B2 * | 10/2012 | Haris | 414/217 |
| 8,408,158 B2 * | 4/2013 | Akimoto et al. | 118/695 |
| 2004/0043513 A1 | 3/2004 | Ishizawa et al. | |
| 2004/0141832 A1 | 7/2004 | Jang et al. | |
| 2006/0245852 A1 * | 11/2006 | Iwabuchi | 414/217 |
| 2007/0183869 A1 * | 8/2007 | Cho et al. | 414/217 |
| 2007/0237608 A1 * | 10/2007 | Jang et al. | 414/217 |
| 2008/0232947 A1 * | 9/2008 | van der Meulen et al. | 414/805 |
| 2009/0162170 A1 * | 6/2009 | Yamagishi et al. | 414/217 |
| 2009/0203211 A1 | 8/2009 | Kim et al. | |

FOREIGN PATENT DOCUMENTS

| | | |
|---|---|---|
| JP | 10-12695 A | 1/1998 |
| JP | 10-107124 A | 4/1998 |
| JP | 2000-100922 A | 4/2000 |
| JP | 2000-195925 A | 7/2000 |
| JP | 2002-151568 A | 5/2002 |
| JP | 2002-343848 A | 11/2002 |
| JP | 2004-6665 A | 1/2004 |
| JP | 2004-140406 A | 5/2004 |
| JP | 2009-76705 A | 4/2009 |
| JP | 2009-147368 A | 7/2009 |
| JP | 2010-103486 A | 5/2010 |

OTHER PUBLICATIONS

International Search Report mailed Nov. 1, 2011 in PCT/JP2011/004401.

* cited by examiner

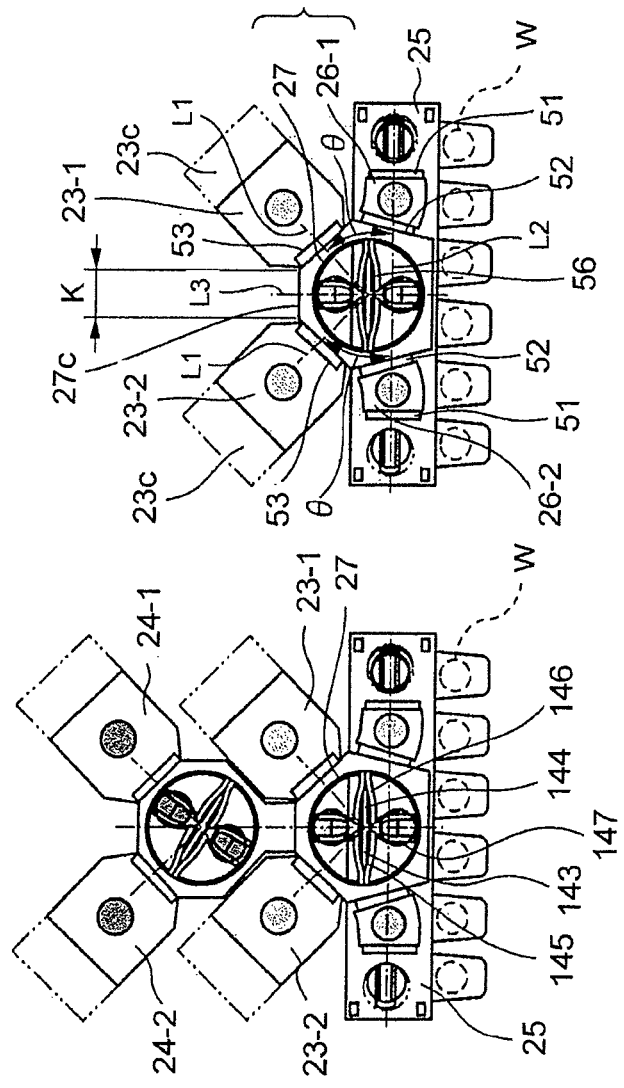
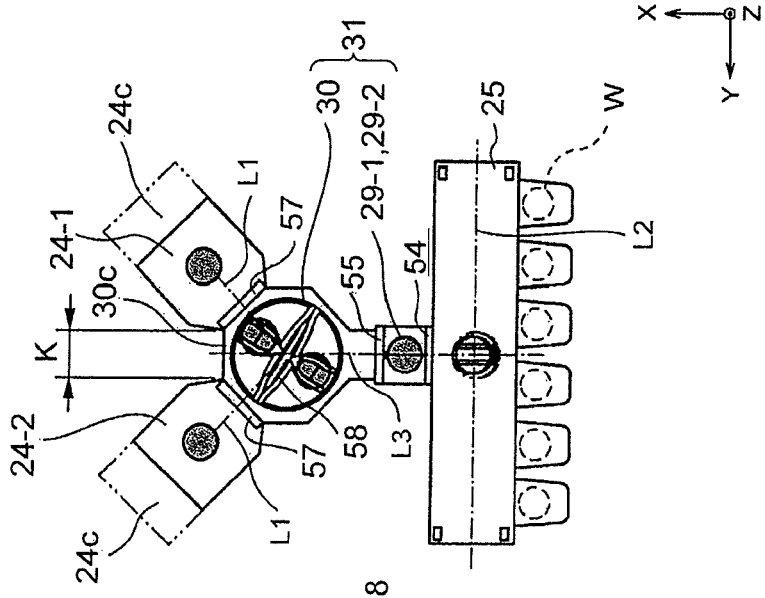

SUBSTRATE PROCESSING SYSTEM, TRANSFER MODULE, SUBSTRATE PROCESSING METHOD, AND METHOD FOR MANUFACTURING SEMICONDUCTOR ELEMENT

CROSS REFERENCE TO RELATED APPLICATION

This application is a 35 U.S.C. 371 National Phase Entry Application from PCT/JP2011/004404, filed Aug. 3, 2011, which claims the benefit of Japanese Patent Application No. 2010-178165, filed on Aug. 6, 2010, the disclosures of which are incorporated herein in its entirety by reference.

FIELD OF THE INVENTION

The present invention relates to a substrate processing system and a substrate transfer module which transfers a substrate such as a semiconductor substrate, a liquid crystal substrate, an organic EL element and the like into a plurality of processing chambers.

BACKGROUND OF THE INVENTION

In a manufacturing process of a semiconductor device, a FPD (flat panel display), an organic EL (Electro Luminescence) element, a solar cell and the like, a semiconductor substrate, a glass substrate or the like is subjected to various processes such as film forming, etching, ashing, oxidation, nitriding, doping, diffusion and the like. These processes are performed in depressurized processing chambers if plasma is used.

A multi-chamber type substrate processing system for performing simultaneous substrate processing in a plurality of processing chambers is commonly used to improve a throughput. FIG. 1 shows a substrate processing system as an example of conventional multi-chamber type substrate processing systems in which sets of a processing chamber 1 and a load-lock chamber 2 in one-to-one correspondence are connected to a loader module 3 (see, e.g., Japanese Patent Application Publication No. JP 2002-151568). A plurality of cassette ports 4 is provided with the loader module 3. An atmospheric transfer robot 5 in the loader module 3 transfers substrates in the cassettes 6 into the load-lock chambers 2. The interior of each load-lock chamber 2 alternates between a vacuum condition and an atmospheric condition. A vacuum transfer robot 7 to transfer a substrate, which has been transferred into the load-lock chamber 2, into a corresponding processing chamber 1 is provided in the load-lock chamber 2. When the atmospheric transfer robot 7 transfers the substrate into the load-lock chamber 2, the interior of the load-lock chamber 2 goes into the atmospheric condition. When the vacuum transfer robot 7 transfers the substrate into the processing chamber 1, the interior of the load-lock chamber goes into the vacuum condition.

The substrate processing system shown in FIG. 1 has a merit in that substrate processing can be carried out without interruption by one vacuum transfer robot 7 even in a case where the other is out of order. However, the substrate processing system has a drawback in that the substrate cannot be continuously processed under vacuum condition when the substrate has to be moved between the processing chambers 1 because the substrate needs to pass through the atmosphere of the loader module 3 before it is passed over from one processing chamber 1 to another.

In order to overcome the drawback of the above substrate processing system, there has been proposed a cluster type substrate processing system as shown in FIG. 2. As shown, a transfer chamber 10 provided with a vacuum transfer robot 9 is disposed in the center of this substrate processing system. A plurality of processing chambers 11 is arranged around the transfer chamber 10 in such a manner that they surround the transfer chamber 10. The transfer chamber 10 is connected to a loader module 13 via two load-lock chambers 12. The loader module 13 is provided with an atmospheric transfer robot 14. The atmospheric transfer robot 14 transfers a substrate in a cassette placed on each port 15 into the load-lock chamber 12. The vacuum transfer robot 9 in the transfer chamber 10 transfers the substrate, which has been transferred into the load-lock chamber 12, into the processing chamber 11.

The substrate processing system shown in FIG. 2 has a merit in that the substrates can be continuously processed in vacuum without being exposed to the atmosphere since the substrates pass through the transfer chamber 10 when the substrates are moved from one processing chamber 11 to another. However, since one vacuum transfer robot 9 has to cope with the plurality of processing chambers 11, if a time taken for a process performed in each processing chamber 11 is relatively short, a throughput (number of substrates processed per unit time) cannot be improved due to restriction on a transfer speed of the vacuum transfer robot 9. That is, if the process time of each processing chamber 11 is short, the transfer speed of the vacuum transfer robot 9 becomes a rate-determining factor and there occurs a delay time during which processed substrates wait within the processing chambers 11 without being unloaded. In other words, the transfer speed of the vacuum transfer robot 9 determines a process speed of the whole system. Moreover, as substrate size tends to be increased (e.g., from 300 mm to 450 mm in diameter for semiconductor wafers) in recent years, the whole substrate processing system including the processing chambers 11 is required to be extended. However, such simple extension of the substrate processing system may result in a bulky footprint.

For the purpose of reducing the footprint of the above-mentioned cluster type substrate processing system, Patent Document 3 discloses a multi-stage substrate processing system in which processing chambers 101 and 102 and load-lock chambers 2 are vertically stacked in a two-stage, respectively, and a vacuum transfer robot 42 provided in a central transfer chamber 3 is vertically moved so that the vacuum transfer robot 42 can transfer a substrate between the vertical two-stage load-lock chambers 2 and the vertical two-stage processing chambers 101 and 102.

In addition, for the purpose of reducing the footprint of the above-mentioned cluster type substrate processing system, Patent Document 4 discloses a multi-stage substrate processing system in which an elevatable robot arm 18 is placed in a central transfer chamber 30a, vertical multi-stage processing chambers 32a and vertical multi-stage load-lock chambers 34a are connected such that they surround the transfer chamber 30a, and the robot arm 18 transfers a substrate between the multi-stage processing chambers 32a and the multi-stage load-lock chambers 34a. In the substrate processing system of Patent Document 4, the respective multi-stage processing chambers 32a and the respective multi-stage load-lock chambers 34a can be vertically overlapped with each other either entirely or partially.

For the purpose of reducing the footprint of the substrate processing system, Patent Document 5 discloses a substrate processing system in which a rectangular transfer passage for transferring semiconductor wafers in an atmosphere is connected to a cassette stage 42 on which a plurality of cassettes 41 is loaded, vertical two-stage load-lock chambers 43 are connected to both sides of the rectangular transfer passage, and vertical two-stage processing chambers 45 are connected to the respective vertical two-stage load-lock chambers. In the rectangular transfer passage, there is provided with a transfer device 52 which receives the semiconductor wafer from the cassette and transfers the semiconductor wafer to the load-lock chamber 43.

Each load-lock chamber 43 is provided with a vacuum transfer device which receives the semiconductor wafer from the transfer device 52 and transfers the semiconductor wafer to the processing chamber 45. The interior of the load-lock chamber 43 alternates between a vacuum condition and an atmospheric condition. When the atmospheric transfer device 52 transfers the semiconductor wafer to the vacuum transfer device of the load-lock chamber 43, the interior of the load-lock chamber 43 turns into an atmospheric condition. On the other hand, when the vacuum transfer device of the load-lock chamber 43 transfers the semiconductor wafer to the processing chamber 45, the interior of the load-lock chamber 43 turns into a vacuum condition.

Patent Documents

Patent Document 1: Japanese Patent Application Publication No. 2002-151568

Patent Document 2: Japanese Patent Application Publication No. 2009-76705

Patent Document 3: Japanese Patent Application Publication No. 2000-195925

Patent Document 4: Japanese Patent Application Publication No. 2002-343848

Patent Document 5: Japanese Patent Application Publication No. 2009-147368

However, the substrate processing system disclosed in Patent Document 3 has a problem in that a throughput (number of substrates processed per unit time) is not improved because it cannot change the structure in which the vacuum transfer robot in the central transfer chamber has to cope with the plurality of processing chambers arranged thereabout.

Although the plurality of processing chambers overlap with each other in a vertical multi-stage as in the substrate processing system disclosed in Patent Document 4, as equipments essential for process performance, such as a gas supply system, a gas exhaust system, an RF power supply unit and the like, have to be provided at an upper portion and/or at a lower portion of the processing chambers and the processing chambers tend to be made larger, it is difficult in the aspect of practicability and space to arrange the multi-stage processing chambers in a factory clean room in the state-of-art. Even if the processing chambers may be arranged in multi-stage, this takes a space where the equipments essential for process performance are arranged at the upper portion and/or the lower portion of the processing chambers. Therefore, these equipments have to be arranged in places distant from the processing chambers.

The substrate processing system disclosed in Patent Document 5 has a problem in that a throughput of the whole system cannot be improved due to restriction on a transfer device provided in a single rectangular transfer passage since the plurality of processing chambers is connected to the single rectangular passage and semiconductor wafers have to pass through the transfer device of the single rectangular transfer passage in transferring the semiconductor wafers from the cassette stage into the plurality of processing chambers. In addition, like the substrate processing system disclosed in Patent Document 4, since the processing chambers overlap with each other in multi-stage, it is difficult in the aspect of space to make vertical overlap of the processing chambers, and, even if possible, the equipments have to be arranged in places distant from the processing chambers.

Furthermore, if upper and lower processing chambers are arranged with no gap, since a length of an exhaust passage of the upper processing chamber is different from that of the lower processing chamber, there occurs a difference in exhaust capability between the upper processing chamber and the lower processing chamber.

SUMMARY OF THE INVENTION

The present invention provides a substrate processing system which is capable of providing a planar discrete arrangement of a plurality of processing chambers to reduce a footprint.

In addition, the present invention provides a substrate processing system which is capable of providing a planar discrete arrangement of a plurality of processing chambers to improve a throughput (number of substrates processed per unit time).

In addition, the present invention provides a substrate processing system which is capable of providing a planar discrete arrangement of a plurality of processing chambers so that equipments essential for process performance can be arranged at the upper portion and/or the lower portion of the processing chambers, thereby reducing an individual difference between the processing chambers.

Furthermore, the present invention provides a substrate processing system which is capable of providing a planar discrete arrangement of a plurality of processing chambers to achieve at least two of reduction of a footprint, improvement of a throughput, and reduction of an individual difference between the processing chambers.

In accordance with a first aspect of the present invention, there is provided a substrate processing system including: a loader module which is provided with a plurality of ports on which a plurality of cassettes is placed, and an atmospheric transfer robot configured to transfer substrates within the cassettes placed on the ports; a first transfer unit configured to transfer the substrates between the loader module and at least one first processing chamber for processing the substrates; and a second transfer unit which is provided at a height different from that of the first transfer unit and is configured to transfer the substrates between the loader module and at least one second processing chamber for processing the substrates.

The first transfer unit includes a first load-lock chamber into which the substrates are transferred by the atmospheric transfer robot, and a first transfer chamber provided with a first vacuum transfer robot for transferring the substrates, which have been loaded into the first load-lock chamber, into the first processing chamber.

The second transfer unit includes a second load-lock chamber into which the substrates are transferred by the atmospheric transfer robot, and a second transfer chamber provided with a second vacuum transfer robot for transferring the substrates, which have been loaded into the second load-lock chamber, into the second processing chamber.

The first processing chamber and the second processing chamber are not vertically overlapped and at least a portion of the first transfer unit and at least a portion of the second transfer unit are vertically overlapped.

In accordance with a second aspect of the present invention, there is provided a substrate processing system including: a loader module which is provided with a plurality of ports on which a plurality of cassettes is placed, and an atmospheric transfer robot configured to transfer substrates within the cassettes placed on the ports; and a first transfer unit configured to transfer the substrates between the loader module and at least one first processing chamber for processing the substrates.

The first transfer unit includes a first load-lock chamber into which the substrates are transferred by the atmospheric transfer robot, and a first transfer chamber provided with a first vacuum transfer robot for transferring the substrates, which have been loaded into the first load-lock chamber, into the first processing chamber.

The loader module is provided with a connection port configured to connect a second transfer unit, which is provided at a position having a height different from that of the first transfer unit and transfers the substrates between the loader module and at least one second processing chamber for processing the substrates.

The second transfer unit includes a second load-lock chamber into which the substrates are transferred by the atmospheric transfer robot, and a second transfer chamber provided with a second vacuum transfer robot for transferring the substrates, which have been loaded into the second load-lock chamber, into the second processing chamber.

At least a portion of the first transfer unit and at least a portion of the second transfer unit are vertically overlapped, and the first processing chamber and the second processing chamber are not vertically overlapped.

In accordance with a third aspect of the present invention, there is provided a substrate processing system including: a loader module which is provided with a plurality of ports on which a plurality of cassettes is placed, and an atmospheric transfer robot configured to transfer substrates within the cassettes placed on the ports; a first transfer unit configured to transfer the substrates between the loader module and at least one first processing chamber for processing the substrates; and a second transfer unit which is provided at a height different from that of the first transfer unit and is configured to transfer the substrates between the loader module and at least one second processing chamber for processing the substrates.

The first transfer unit includes a first load-lock chamber and a first transfer chamber, which communicate to each other. The second transfer unit includes a second load-lock chamber and a second transfer chamber, which communicate to each other. The first processing chamber and the second processing chamber are not vertically overlapped and at least a portion of the first transfer unit and at least a portion of the second transfer unit are vertically overlapped.

In accordance with a fourth aspect of the present invention, there is provided a substrate processing system including: a loader module which is provided with a plurality of ports on which a plurality of cassettes is placed, and an atmospheric transfer robot configured to transfer substrates within the cassettes placed on the ports; a load-lock chamber which is connected to the loader module and into which the substrates are transferred by the atmospheric transfer robot; a first transfer chamber which is provided with a first vacuum transfer robot for transferring the substrates, which have been transferred into the load-lock chamber, into at least one first processing chamber for executing a process; a vacuum connection chamber connected to the first transfer chamber; and a second transfer chamber which is connected to the connection chamber and is provided with a second vacuum transfer robot for transferring the substrates, which have been transferred into the connection chamber by the first vacuum transfer robot, into at least one second processing chamber for executing a process.

The first transfer chamber and the second transfer chamber are provided at positions having different vertical heights and transfer the substrates therebetween by using a substrate elevation mechanism provided within the connection chamber, and the first processing chamber and the second processing chamber are not vertically overlapped.

In accordance with a fifth aspect of the present invention, there is provided a substrate processing system including: a loader module which is provided with a plurality of ports on which a plurality of cassettes is placed, and an atmospheric transfer robot for transferring substrates within the cassettes placed on the ports; a load-lock chamber which is connected to the loader module and into which the substrates are transferred by the atmospheric transfer robot; and a transfer chamber which is provided with a vacuum transfer robot for transferring the substrates, which have been transferred into the load-lock chamber, into at least one processing chamber for executing a process.

At least a portion of the load-lock chamber or the transfer chamber is vertically overlapped with the loader module.

In accordance with a sixth aspect of the present invention, there is provided a transfer module including: a loader module which is provided with a plurality of ports on which a plurality of cassettes is placed, and an atmospheric transfer robot for transferring substrates within the cassettes placed on the ports; a first transfer unit including a first load-lock chamber which is connected to the loader module and into which the substrates are transferred by the atmospheric transfer robot, and a first transfer chamber which is connected to the first load-lock chamber and is provided with a first vacuum transfer robot for transferring the substrates transferred into the first load-lock chamber; and a second transfer unit including a second load-lock chamber which is connected to the loader module and into which the substrates are transferred by the atmospheric transfer robot, and a second transfer chamber which is connected to the second load-lock chamber and is provided with a second vacuum transfer robot for transferring the substrates transferred into the second load-lock chamber.

The first transfer unit and the second transfer unit are provided at positions having different heights, at least a portion of the first transfer unit and at least a portion of the second transfer unit are vertically overlapped, and the second transfer chamber is arranged farther from the loader module than the first transfer chamber.

In accordance with a seventh aspect of the present invention, there is provided a transfer module including: a loader module which is provided with a plurality of ports on which a plurality of cassettes is placed, and an atmospheric transfer robot for transferring substrates within the cassettes placed on the ports; a first transfer unit including a first load-lock chamber which is connected to the loader module and into which the substrates are transferred by the atmospheric transfer robot, and a first transfer chamber which is connected to the first load-lock chamber and is provided with a first vacuum transfer robot for transferring the substrates transferred into the first load-lock chamber; and a second transfer unit including a second load-lock chamber which is connected to the loader module and into which the substrates are transferred by the atmospheric transfer robot, and a second transfer chamber which is connected to the second load-lock chamber and is provided with a second vacuum transfer robot for transferring the substrates transferred into the second load-lock chamber.

The first transfer unit and the second transfer unit are provided at positions having different heights, at least a portion of the first transfer unit and at least a portion of the second transfer unit are vertically overlapped, and the second transfer chamber is arranged farther from the loader module than the first transfer chamber.

In accordance with an eighth aspect of the present invention, there is a transfer module including: a loader module which is provided with a plurality of ports on which a plurality of cassettes is placed and an atmospheric transfer robot for transferring substrates within the cassettes placed on the ports; a load-lock chamber which is connected to the loader module and into which the substrates are transferred by the atmospheric transfer robot; and a transfer chamber which is provided with a vacuum transfer robot for transferring the substrates transferred into the load-lock chamber. At least a portion of the load-lock chamber or the transfer chamber is vertically overlapped with the loader module.

In accordance with a ninth aspect of the present invention, there is provided a transfer module including: a loader module which is provided with a plurality of ports on which a plurality of cassettes is placed, and an atmospheric transfer robot for transferring substrates within the cassettes placed on the ports; a first transfer unit including a first load-lock chamber which is connected to the loader module and into which the substrates are transferred by the atmospheric transfer robot, and a first transfer chamber which is connected to the first load-lock chamber and is provided with a first vacuum transfer robot for transferring the substrates transferred into the first load-lock chamber; and a second transfer unit including a second load-lock chamber which is connected to the loader module and into which the substrates are transferred by the atmospheric transfer robot, and a second transfer chamber which is connected to the second load-lock chamber and is provided with a second vacuum transfer robot for transferring the substrates transferred into the second load-lock chamber.

The first transfer unit and the second transfer unit are provided at positions having different heights, at least a portion of the first transfer chamber of the first transfer unit and at least a portion of the second load-lock chamber of the second transfer unit are vertically overlapped, and the second transfer chamber of the second transfer unit is arranged farther from the loader module than the first transfer chamber of the second transfer unit.

In accordance with a tenth aspect of the present invention, there is provided a transfer module including: a loader module which is provided with a plurality of ports on which a plurality of cassettes is placed and an atmospheric transfer robot for transferring substrates within the cassettes placed on the ports; and a first transfer unit including a first load-lock chamber which is connected to the loader module and into which the substrates are transferred by the atmospheric transfer robot, and a first transfer chamber which is provided with a first vacuum transfer robot for transferring the substrates transferred into the first load-lock chamber.

At least a portion of the first load-lock chamber or the first transfer chamber are vertically overlapped with the loader module, and the loader module is provided with a connection port configured to connect with a second transfer unit which is provided at a position having a height different from that of the first transfer unit and transfers the substrates.

In accordance with an eleventh aspect of the present invention, there is provided with a substrate processing method including: atmospheric transferring in which an atmospheric transfer robot within a loader module transfers substrates within a cassette placed on a port into a first load-lock chamber and a second load-lock chamber; first vacuum transferring in which a first vacuum transfer robot within a first transfer chamber connected to the first load-lock chamber transfers a substrate, which has been transferred into the first load-lock chamber, into at least one first processing chamber; and second vacuum transferring performed in parallel to said first vacuum transferring, in which a second vacuum transfer robot within a second transfer chamber connected to the second load-lock chamber transfers a substrate, which has been transferred into the second load-lock chamber, into at least one second processing chamber.

A first transfer route in which the first vacuum transfer robot transfers the substrate from the first load-lock chamber to the first processing chamber and a second transfer route in which the second vacuum transfer robot transfers the substrate from the second load-lock chamber to the second processing chamber are provided at positions having different heights, at least a portion of the first transfer route and at least a portion of the second transfer route are vertically overlapped, and the second transfer route is configured to transfer the substrate to a position farther from the loader module than the first transfer route.

In accordance with a twelfth aspect of the present invention, there is provided a method of manufacturing a semiconductor device using a substrate processing system. The substrate processing system includes: a loader module which is provided with a plurality of ports on which a plurality of cassettes is placed, and an atmospheric transfer robot configured to transfer substrates within the cassettes placed on the ports; a first transfer unit configured to transfer the substrates between the loader module and at least one first processing chamber for processing the substrates; and a second transfer unit which is provided at a height different from that of the first transfer unit and is configured to transfer the substrates between the loader module and at least one second processing chamber for processing the substrates.

The first transfer unit includes a first load-lock chamber into which the substrates are transferred by the atmospheric transfer robot, and a first transfer chamber provided with a first vacuum transfer robot for transferring the substrates, which have been loaded into the first load-lock chamber, into the first processing chamber.

The second transfer unit includes a second load-lock chamber into which the substrates are transferred by the atmospheric transfer robot, and a second transfer chamber provided with a second vacuum transfer robot for transferring the substrates, which have been loaded into the second load-lock chamber, into the second processing chamber.

The first processing chamber and the second processing chamber are not vertically overlapped and at least a portion of the first transfer unit and at least a portion of the second transfer unit are vertically overlapped.

The present invention provides a substrate processing system which is capable of increasing a throughput per unit area and/or unit time over conventional substrate processing system.

BRIEF DESCRIPTION OF THE DRAWINGS

FIGS. 5A to 5C show plan views of a layer structure of the substrate processing system, FIG. 5A showing the whole system, FIG. 5B showing a transfer unit in a first layer, and FIG. 5C showing a transfer unit in a second layer.

DETAILED DESCRIPTION OF THE EMBODIMENTS

Hereinafter, embodiments of the present invention will be described with reference to the accompanying drawings.

(Embodiment 1)

Figure 1:
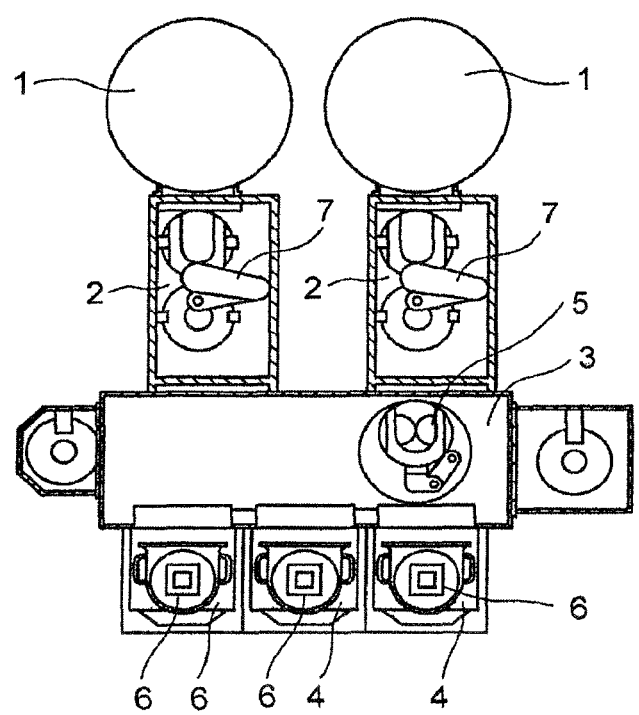
FIG. 1 is a plan view of a conventional multi-chamber type substrate processing system.
Figure 2:
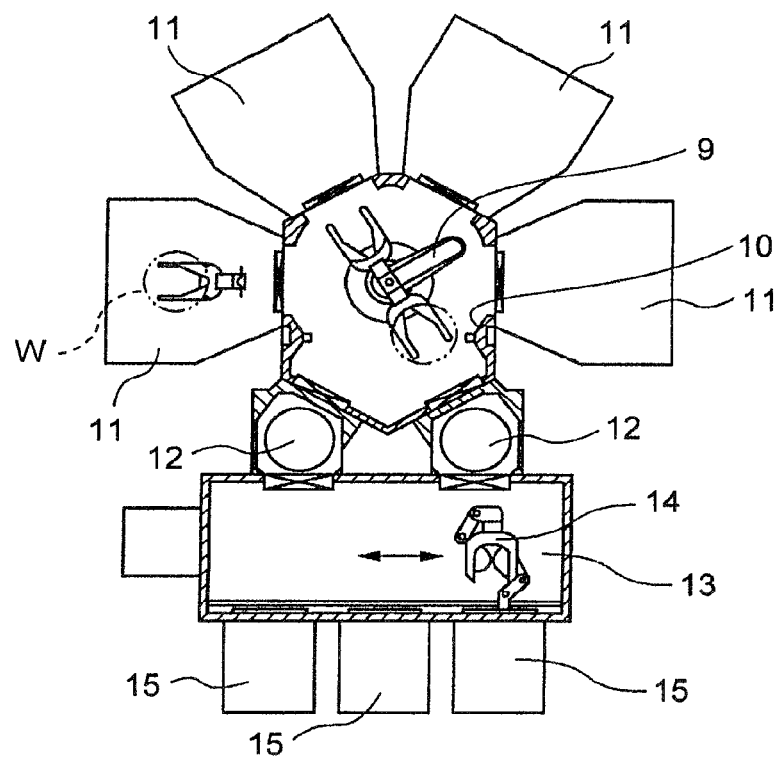
FIG. 2 is a plan view of a conventional cluster type substrate processing system.
Figure 3:
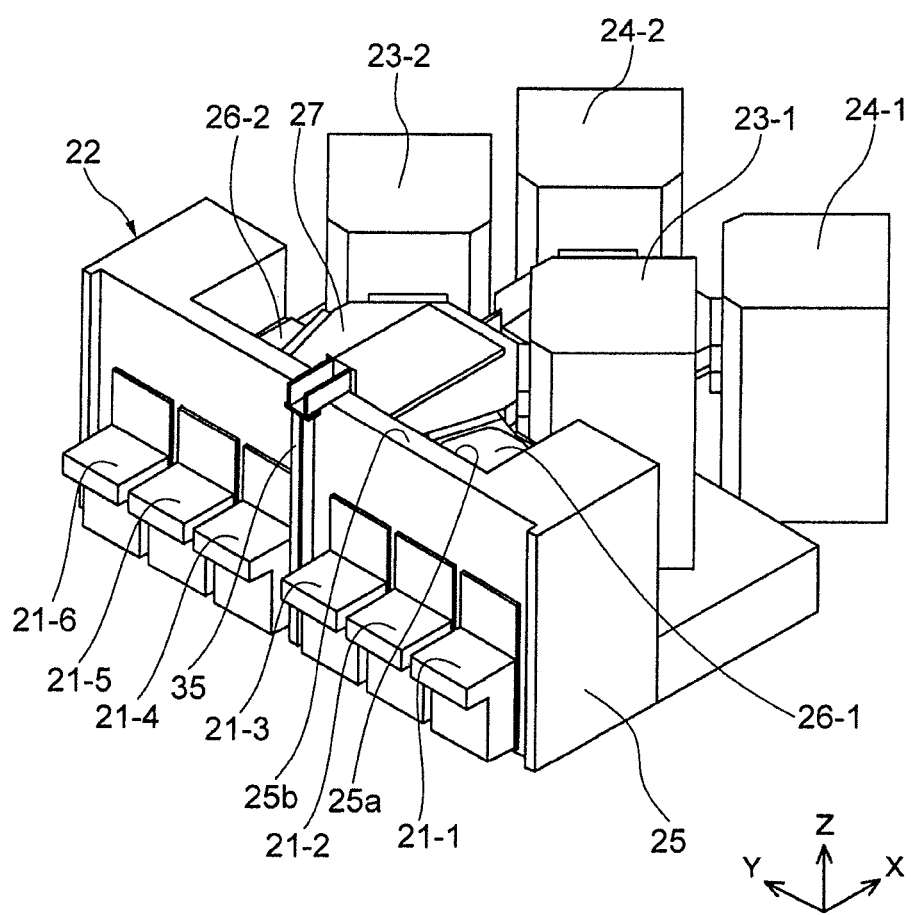
FIG. 3 is a perspective view of a front side of a substrate processing system in accordance with a first embodiment of the invention.

FIG. 3 shows a configuration (mainly, a front side system configuration) of a substrate processing system in accordance with a first embodiment of the present invention. The substrate processing system includes an elongated rectangular parallelepiped loader module 22 provided with a plurality of (e.g., six) ports 21-1 to 21-6 on which a plurality of cassettes (not shown) is arranged in a horizontal direction, and a plurality of (e.g., four) processing chambers 23-1, 23-2, 24-1 and 24-2.

The loader module 22 includes a rectangular parallelepiped atmospheric transfer chamber 25 extending in one direction (Y direction). The plurality of ports 21-1 to 21-6 is traversely arranged in a line at one side of the atmospheric transfer chamber 25. In a plan view, the atmospheric transfer chamber 25 is extended in the arrangement direction (Y direction) of the plurality of ports 21-1 to 21-6. A cassette in which a plurality of unprocessed substrates W is accommodated is loaded or set on each of the ports 21-1 to 21-6. The cassette may be set on each port 21-1 to 21-6 either manually by an operator or automatically by a cassette transfer system. The unprocessed substrates W in the cassette are taken out of the cassette, one by one, by an atmospheric transfer robot provided in the atmospheric transfer chamber 25. Substrates W processed in the processing chambers 23-1, 23-2, 24-1 and 24-2 are returned to the cassette, one by one, by the atmospheric transfer robot provided in the atmospheric transfer chamber 25.

The four processing chambers 23-1, 23-2, 24-1 and 24-2 may be divided into at least one (two in the shown example) first processing chamber, e.g., first processing chambers 23-1 and 23-2, closer to the loader module 22 and at least one (two in the shown example) second processing chamber, e.g., second processing chambers 24-1 and 24-2, farther from the loader module 22. The two first processing chambers 23-1 and 23-2 and the two second processing chambers 24-1 and 24-2 are arranged from the loader module 22 in a planar manner. That is, the first processing chambers 23-1 and 23-2 and the second processing chambers 24-1 and 24-2 are arranged at separated planar positions without overlapping on a plane.

Distances from the loader module 22 to the two first processing chambers 23-1 and 23-2 are equal to each other and distances from the loader module 22 to the two second processing chambers 24-1 and 24-2 are equal to each other. When viewed from the loader module 22, the right first processing chamber 23-1 and the right second processing chamber 24-1 are arranged in a line in a direction (X direction) perpendicular to the longitudinal direction (Y direction) of the loader module 22. When viewed from the loader module 22, the left first processing chamber 23-2 and the left second processing chamber 24-2 are arranged in a line in the direction (X direction) perpendicular to the longitudinal direction (Y direction) of the loader module 22.

Each of the first processing chambers 23-1 and 23-2 and the second processing chambers 24-1 and 24-2 is configured to perform at least one process or a set of processes selected from a group consisting of film forming, etching, ashing, oxidation, nitriding, doping, diffusion and the like. For example, in a case of processing chamber performing a plasma etching process, various controllers, a gas supply system, an RF power supply unit and the like are provided at an upper portion of the processing chamber, and a gas exhaust unit for exhausting the chamber interior into vacuum or the like is provided at lower portion of the processing chamber.

Figure 4:
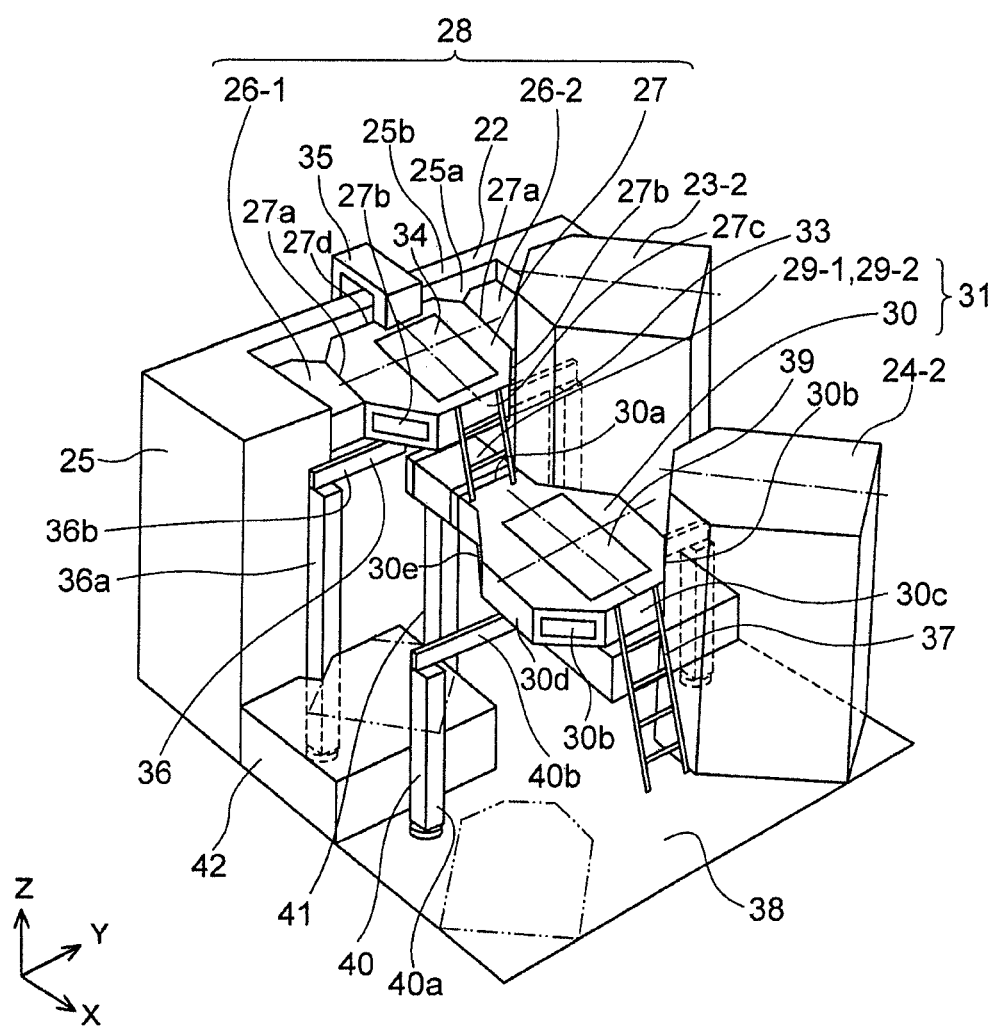
FIG. 4 is a perspective view of a rear side of the substrate processing system.

FIG. 4 shows a configuration of the rear side of the substrate processing system. In FIG. 4, the first processing chamber 23-1 and the second processing chamber 24-1 in front are not shown to make first and second transfer units 28 and 31 more visible. The loader module 22 and the two first processing chambers 23-1 and 23-2 are connected via first load-lock chambers 26-1 and 26-2 and a first transfer chamber 27 connected to the first load-lock chambers. Here, the first load-lock chambers 26-1 and 26-2 and the first transfer chamber 27 are collectively referred to as the first transfer unit 28. The loader module 22 and the second processing chambers 24-1 and 24-2 are connected via second load-lock chambers 29-1 and 29-2 and a second transfer chamber 30 connected to the second load-lock chambers. Here, the second load-lock chambers 29-1 and 29-2 and the second transfer chamber 30 are collectively referred to as the second transfer unit 31.

The first and second transfer units 28 and 31 extend in the direction (X direction) perpendicular to the longitudinal direction (Y direction) of the loader module 22. The second processing chambers 24-1 and 24-2 are positioned farther from the loader module 22 than the first processing chambers 23-1 and 23-2, and thus, the length of the second transfer unit 31 in the depth direction (X direction) is longer than the length of the first transfer unit 28 in the depth direction (X direction). Here, the first transfer unit 28 is placed above the second transfer unit 31.

The atmospheric transfer robot in the atmospheric transfer chamber 25 takes unprocessed substrates W out of the cassettes set on the ports 21-1 to 21-6, one by one, and carries them, one by one, into one of the first load-lock chambers 26-1 and 26-2. A first vacuum transfer robot within the first transfer chamber 27 transfers the corresponding substrate W loaded into the first load-lock chamber 26-1 or 26-2 into the first processing chamber 23-1 or 23-2. When a predetermined process is completed in the first processing chamber 23-1 or 23-2 into which the corresponding substrate W has been loaded, the first vacuum transfer robot within the first transfer chamber 27 takes the processed substrate W out of the first processing chamber 23-1 or 23-2 and loads the taken-out processed substrate W into the first load-lock chamber 26-1 or 26-2. The atmospheric transfer robot within the atmospheric transfer chamber 25 takes the processed substrate W out of the first load-lock chamber 26-1 or 26-2 into which the substrate W has been loaded, under the atmospheric pressure, and puts it into a cassette mounted in one of the ports 21-1 to 21-6. Here, a flow of a substrate W from one of the first load-lock chambers 26-1 and 26-2 to one of the first processing chambers 23-1 and 23-2 by means of the first vacuum transfer robot is referred to as a "first transfer route."

Each of the first load-lock chambers 26-1 and 26-2 has one side connected to the atmospheric transfer chamber 25 and the other side connected to the first transfer chamber 27. In the present embodiment, the two first load-lock chambers 26-1 and 26-2 are provided in both sides of the first transfer chamber 27, respectively. A stepped concave portion 25a is formed on the top of the atmospheric transfer chamber 25. At least a portion (preferably, all) of the first load-lock chambers 26-1 and 26-2 and a portion of the first transfer chamber 27 are arranged on the concave portion 25a in such a manner that they are vertically overlapped with the atmospheric transfer chamber 25. The two first load-lock chambers 26-1 and 26-2 connected to both sides of the first transfer chamber 27 are also connected to walls at both ends in the longitudinal direction (Y direction) of the concave portion 25a of the atmospheric transfer chamber 25. Alternatively, only one of the load-lock chambers 26-1 and 26-2 may be provided in one side of the first transfer chamber 27.

The first transfer chamber 27 is formed to have a planar polygonal shape (preferably, a polygonal shape having at least six sides). The first load-lock chambers 26-1 and 26-2 are connected to two sides 27a of the first transfer chamber 27 via gate valves, respectively, the two sides 27a facing with each other in the longitudinal direction (Y direction) of the atmospheric transfer chamber 25. Further, the two first processing chambers 23-1 and 23-2 are connected to two sides 27b, which are adjacent to the two sides 27a and are inclined with respect to the longitudinal direction (Y direction), via gate valves, respectively. Although portions (sides 27a and 27d) of the first transfer chamber 27 are vertically overlapped with the loader module 22, the two sides 27b of the first transfer chamber 27 are not vertically overlapped with the atmospheric transfer chamber 25. This is for avoiding interference between the atmospheric transfer chamber 25 and the first processing chambers 23-1 and 23-2.

With respect to the first transfer chamber 27, a ladder 33 by which an operator climbs up/down for maintenance of the atmospheric transfer chamber 25, the first processing chambers 23-1 and 23-2, the first transfer chamber 27 and the like may be provided on one side 27c (a side extending in parallel to the longitudinal direction (Y direction)) between the two sides 27b to which the two first processing chambers 23-1 and 23-2 are connected respectively. The ladder 33 is provided between the top of the lower second transfer chamber 30 and the side 27c of the upper first transfer chamber 27. An openable/closable cover 34 is attached to the top of the first transfer chamber 27. The operator can climb up to the top of the first transfer chamber 27 by using the ladder and open the cover 34 for check and maintenance of the interiors (the first vacuum transfer robot and the like) of the first transfer chamber 27.

Two support members 35 and 36 are provided to support the first transfer chamber 27. The first support member 35 extends from the front side of the loader module 22 and the second support member 36 is disposed in the rear side of the loader module 22. As shown in FIG. 3, the first support member 35 extends upward from the floor in the vertical direction between the ports 21-3 and 21-4 in the front side of the loader module 22, is bent beyond the wall of the concave portion 25a of the loader module 22 over the loader module 22 and is connected to the vicinity of the side 27d of the first transfer chamber 27 at a leading end of the bent portion, thereby suspending and supporting the first transfer chamber 27. Due to its bulky volume, the atmospheric transfer chamber 25 is bisected at the center of the longitudinal direction (that is, between the central ports 21-3 and 21-4) in consideration of transportability and assemblability. This bisection leaves a dead space between the central ports 21-3 and 21-4. The first support member 35 is placed in the dead space left by this bisection. As shown in FIG. 4, the second support member 36 is formed in a gate shape including a pair of left and right columns 36a and a beam 36b provided between the columns 36a to support the first transfer chamber 27 by contacting a portion of the first transfer chamber 27 projecting from the loader module 22 with the beam 36b.

As described above, the first transfer chamber 27 has a modified hexagonal planar shape including the two sides 27a connected to the first load-lock chambers 26-1 and 26-2, respectively, the two sides 27b connected to the first processing chambers 23-1 and 23-2, respectively, the side 27c on which the ladder 33 can be provided, and the side 27d connected to the first support member 35. Lengths of the sides 27a, 27b, 27c and 27d may be independent and are different from each other in the shown example. As one alternative, the first transfer chamber 27 may be in a different polygonal shape such as a modified octagonal shape or a regular octagonal shape.

The atmospheric transfer robot within the atmospheric transfer chamber 25 may be required to move up to above the height of the first load-lock chambers 26-1 and 26-2, e.g., up to 2 m, in order to transfer the substrates W into/out of the first load-lock chambers 26-1 and 26-2. A box-like expansible/contractible telescopic type robot has a limit in rising height and therefore, a gate type robot is preferably used as the atmospheric transfer robot. When the gate type robot is used, a gate type frame (Z axis guide 64) is longitudinally slid within a non-cave portion 25b of the atmospheric transfer chamber 25 (see FIG. 9). By bending the first support member 35 from the outside of the atmospheric transfer chamber 25 and suspending the first transfer chamber 27 at the leading end of the first support member 35, the first support member 35 is prevented from interfering in movement of the gate type robot. In addition, when the second support member 36 is in the form of a gate, a maintenance space can be formed below the first transfer chamber 27.

The atmospheric transfer robot in the atmospheric transfer chamber 25 takes an unprocessed substrate W out of one of the cassettes set on the ports 21-1 to 21-6, and loads it into the second load-lock chamber 29-1 and 29-2. A second vacuum transfer robot within the second transfer chamber 30 loads the unprocessed substrate W from the second load-lock chamber 29-1 or 29-2 into the second processing chamber 24-1 or 24-2 under a depressurized state. When a predetermined process is completed in the second processing chamber 24-1 or 24-2, the second vacuum transfer robot within the second transfer chamber 30 takes the processed substrate W out of the second processing chamber 24-1 or 24-2 and loads the taken-out processed substrate W into the second load-lock chamber 29-1 or 29-2. The atmospheric transfer robot within the atmospheric transfer chamber 25 takes the processed substrate W out of the second load-lock chamber 29-1 or 29-2 under the atmospheric pressure, and puts it into a cassette mounted on one of the ports 21-1 to 21-6. Here, a flow of a substrate W from one of the second load-lock chambers 29-1 and 29-2 to one of the second processing chambers 24-1 and 24-2 by means of the second vacuum transfer robot is referred to as a "second transfer route."

The second processing chambers 24-1 and 24-2 are positioned farther from the loader module 22 than the first processing chambers 23-1 and 23-2 and the length of the second transfer unit 31 in a depth direction (X direction) is longer than the length of the first transfer unit 28 in a depth direction (X direction). In this way, although the first transfer unit and the second transfer unit have different shapes, the first vacuum transfer robot within the first transfer chamber 27 and the second vacuum transfer robot within the second transfer chamber 30 perform substantially the same transferring operation. That is, both of the first and second vacuum transfer robots perform the transferring operation of taking the unprocessed substrates W out of the load-lock chambers, transferring them into the processing chambers, taking the processed substrates W out of the processing chambers, and transferring them into the load-lock chambers, respectively.

In addition, the atmospheric transfer robot placed in the loader module also performs a transferring operation similar to that of the vacuum transfer robot between a cassette and the load-lock chambers under the atmospheric pressure. This is possible since the load-lock chambers, the transfer chamber and the processing chambers can be arranged with substantially the same positional relationship between the first and second transfer units 28 and 31, i.e., by making at least portions of the first load-lock chambers 26-1 and 26-2 and a portion of the first transfer chamber 27 vertically overlap with the loader module 22. This provides an effect that there is no need to provide a movable stage to move substrates to the second load-lock chambers 29-1 and 29-2 in the second transfer unit 31 and a vacuum transfer robot compatible between the first and second transfer chambers 27 and 30. This is also of great significance in that the first load-lock chambers 26-1 and 26-2 and the first transfer chamber 27 make overlap with the loader module 22.

The second load-lock chambers 29-1 and 29-2 are connected to a side of a rear surface of the atmospheric transfer chamber 25 and one side 30a of the second transfer chamber 30. In the present embodiment, a pair of second load-lock chambers 29-1 and 29-2 is provided to vertically overlap with each other (see FIG. 12). Alternatively, only one of the second load-lock chambers 29-1 and 29-2 may be provided.

The second transfer chamber 30 is formed to have a planar polygonal shape (preferably, a polygonal shape having eight sides). The upper and lower two second load-lock chambers 29-1 and 29-2 are connected to the side 30a of the polygon (a side being opposite to the loader module 22) via gate valves, and the two second processing chambers 24-1 and 24-2 are connected to two sides 30b (sides inclined with respect to the longitudinal direction (Y direction) of the loader module 22 at the opposite side to the side 30a) via gate valves, respectively. A ladder 37 for maintenance of the second processing chambers 24-1 and 24-2, the second transfer chamber 30 and the like may be provided at one side 30c extending in parallel to the longitudinal direction (Y direction) between the two sides 30b. The ladder 37 is provided between a floor 38 and the second transfer chamber 30. An openable/closable cover 39 is attached to the top of the second transfer chamber 30. The operator can climb on the ladder to open the cover 39 for maintenance of the interiors (the second vacuum transfer robot and the like) of the second transfer chamber 30. In addition, for the purpose of maintenance of the first transfer chamber 27, the operator moves away from the second transfer chamber 30 and climbs on the ladder 33 provided at the first transfer chamber 27.

The second transfer chamber 30 and the second load-lock chambers 29-1 and 29-2 are supported by support members 40 and 41. The first support member 41 extends upward from the floor along the rear surface of the loader module 22 to support the second load-lock chambers 29-1 and 29-2. The second support member 40 is formed in a gate shape including a pair of left and right columns 40a and a beam 40b provided horizontally between these columns 40a to support the second transfer chamber 30 by mounting it on the beam 40b. By forming the first support member 41 along the rear surface of the loader module 22 and the second support member 40 in the gate shape, a maintenance space can be provided below the second transfer chamber 30.

The second transfer chamber 30 has a modified octagonal planar shape including the side 30a connected to the second load-lock chambers 29-1 and 29-2, the two sides 30b connected to the second processing chambers 24-1 and 24-2, respectively, the side 30c on which the ladder 37 can be installed, the two sides 30d intersecting the beam 40b, and two inclined sides 30e to prevent interference with the first processing chambers 23-1 and 23-2. Lengths of the sides 30a, 30b, 30c, 30d and 30e may be independent and are different from each other in the shown example.

In the shown example, when the first transfer chamber 27 has the modified hexagonal planar shape and the second transfer chamber 30 has the modified octagonal planar shape as mentioned above, a footprint of the entire apparatus may be reduced to be as small as possible. In addition, it is possible to secure a distance (610 mm or more) sufficient for an operator to move between the first processing chambers 23-1 and 23-2 connected to the sides 27b of the first transfer chamber 27 and the second processing chambers 24-1 and 24-2 connected to the sides 30b of the second transfer chamber 30.

As described above, the first transfer unit 28 is positioned to be higher than the second transfer unit 31. The first processing chambers 23-1 and 23-2 are mounted on a base 42 disposed on the floor 38 such that an installation plane on which the first processing chambers 23-1 and 23-2 are installed becomes higher than that on which the second processing chambers 24-1 and 24-2 are installed. Accordingly, processing chambers in a substantially same shape can be applied as the first processing chambers 23-1 and 23-2 and the second processing chambers 24-1 and 24-2. A controller to control the loader module 22 may be accommodated in the base 42.

Figure 6A:
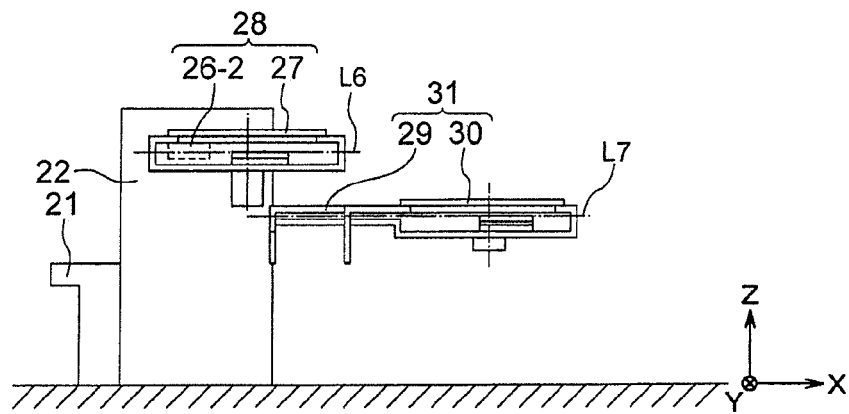
FIGS. 6A to 6C are vertical sectional views showing the layer structure of the substrate processing system, FIG. 6A showing the whole system, FIG. 6B showing the transfer unit in the first layer, and FIG. 6C showing the transfer unit in the second layer.
Figure 6B:
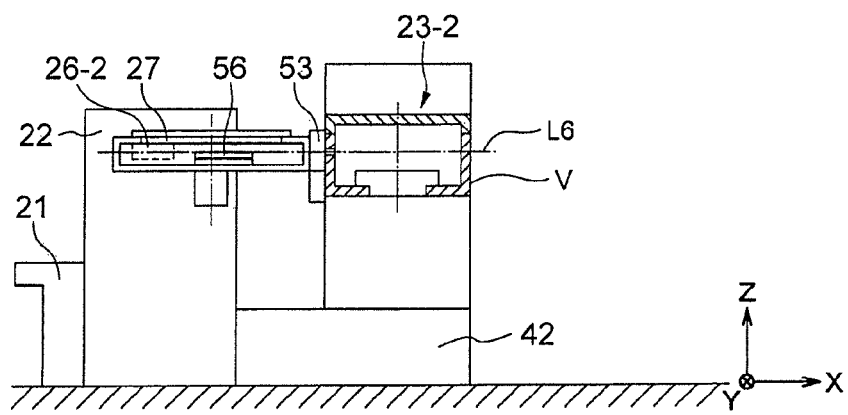
Figure 6C:
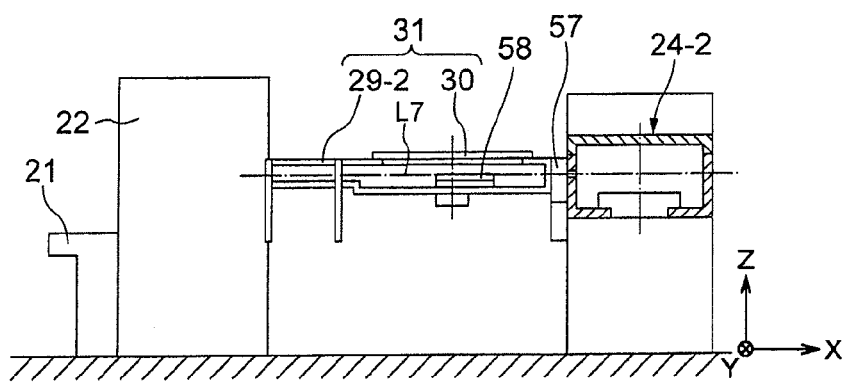

FIGS. 5A to 5C show plan views for respective layers of the substrate processing system and FIGS. 6A to 6C present vertical cross sectional views for the respective layers of the substrate processing system. FIGS. 5A and 6A show the entire substrate processing system, FIGS. 5B and 6B show the first transfer unit 28 and the first processing chambers 23-1 and 23-2 in an upper layer connected to the loader module 22, and FIGS. 5C and 6C show the second transfer unit 31 and the second processing chambers 24-1 and 24-2 in a lower layer connected to the loader module 22.

As shown in FIG. 5B, the two first processing chambers 23-1 and 23-2 are connected to the first transfer chamber 27 of the first transfer unit 28. Lines L1 connecting the respective centers of the first processing chambers 23-1 and 23-2 to the center of the first transfer chamber 27 extend to intersect at acute angles with a line L2 in parallel to the longitudinal direction of the atmospheric chamber 25, i.e., the arrangement direction (Y direction) of the plurality of ports 21-1 to 21-6. The angle θ between each line L1 and the line L2 in the longitudinal direction (Y direction) of the atmospheric transfer chamber 25 is set to be in a range, e.g., from 40° to 50°. Checking spaces 23c for checking the first processing chambers 23-1 and 23-2 from their rear surfaces are provided on the respective lines L1 extending to the opposite sides to the first transfer chamber 27. It is preferable that the two first processing chambers 23-1 and 23-2 are arranged in bilateral symmetry with respect to a line L3 perpendicular to the longitudinal direction (Y direction) of the atmospheric transfer chamber 25. In addition, the lines L1 connecting the respective centers of the two first processing chambers 23-1 and 23-2 to the center of the first transfer chamber 27 form a V shape and the first processing chambers 23-1 and 23-2 are arranged along the respective lines L1. Substrates are loaded into or unloaded from the first processing chambers 23-1 and 23-2 along the V line.

Nothing is connected to the side 27c of the first transfer chamber 27 extending in parallel to the longitudinal direction (Y direction) of the loader module 22 between the two first processing chambers 23-1 and 23-2 and thus, a gap K remains between the two first processing chambers 23-1 and 23-2. As shown in FIG. 6C, this gap K is used as a space to expand the second transfer unit 31 and also as a passage for maintenance. Gate valves 51 are provided between the atmospheric transfer chamber 25 and the first load-lock chambers 26-1 and 26-2 and gate valves 52 are provided between the first load-lock chambers 26-1 and 26-2 and the first transfer chamber 27. Gate valves 53 are provided between the first transfer chamber 27 and the first processing chambers 23-1 and 23-2. A first vacuum transfer robot 56 is provided in the first transfer chamber 27. The first vacuum transfer robot 56 transfers a substrate W between the first load-lock chamber 26-1 or 26-2 and the first processing chamber 23-1 or 23-2 under a depressurized state.

As shown in FIG. 5C, the two second processing chambers 24-1 and 24-2 are connected to the second transfer chamber 30 of the second transfer unit 31. Lines L1 connecting the respective centers of the second processing chambers 24-1 and 24-2 to the center of the second transfer chamber 30 extends to intersect at acute angles with a line L2 in parallel to the longitudinal direction of the atmospheric chamber 25, i.e., the arrangement direction (Y direction) of the plurality of ports 21-1 to 21-6. The angle between each line L1 and the line L2 in the longitudinal direction (Y direction) of the atmospheric transfer chamber 25 is set to be in a range, e.g., from 40° to 50°. Maintenance spaces 24c for maintenance of the second processing chambers 24-1 and 24-2 from their rear surfaces are provided on the respective lines L1 extending to the opposite side to the second transfer chamber 30. The two second processing chambers 24-1 and 24-2 are arranged in bilateral symmetry with respect to a line L3 perpendicular to the longitudinal direction (Y direction) of the atmospheric transfer chamber 25. In addition, the lines L1 connecting the centers of the two second processing chambers 24-1 and 24-2 to the center of the second transfer chamber 30 forms a V shape and the second processing chambers 24-1 and 24-2 are arranged along the respective lines L1. Substrates are loaded into or unloaded from the second processing chambers 24-1 and 24-2 along the V line.

Nothing is connected to the side 30c of the second transfer chamber 30 extending in parallel to the longitudinal direction (Y direction) of the loader module 22 between the two second processing chambers 24-1 and 24-2 and thus, a gap K remains between the two second processing chambers 24-1 and 24-2. The gap K is used as a space to expand and connect a third transfer unit (which will be described later), an inspection device and the like and also as a passage for maintenance. Gate valves 54 are provided between the atmospheric transfer chamber 25 and the second load-lock chambers 29-1 and 29-2 and gate valves 55 are provided between the second load-lock chambers 29-1 and 29-2 and the second transfer chamber 30. Gate valves 57 are provided between the second transfer chamber 30 and the second processing chambers 24-1 and 24-2. A second vacuum transfer robot 58 is provided in the second transfer chamber 30. The second vacuum transfer robot 58 transfers substrates W between the second load-lock chambers 29-1 and 29-2 and the second processing chambers 24-1 and 24-2 under a depressurized state.

In accordance with the present embodiment, since the first processing chambers 23-1 and 23-2 are arranged at acute angles (i.e., in acute angle directions) with respect to the line L2 in parallel to the longitudinal direction (Y direction) of the atmospheric transfer chamber 25 and the second processing chambers 24-1 and 24-2 are arranged at acute angles (i.e., in acute directions) with respect to the line L2 in parallel to the longitudinal direction (Y direction) of the atmospheric transfer chamber 25, a horizontal width of the substrate processing system can be reduced as compared to when first processing chambers 23-1 and 23-2 and the second processing chambers 24-1 and 24-2 are arranged in parallel to the longitudinal direction (Y direction) of the atmospheric transfer chamber 25. Further, by arranging the two first processing chambers 23-1 and 23-2 and the two second processing chambers 24-1 and 24-2 in the V shape, the horizontal width of the substrate processing system can be further reduced.

To facilitate a stepwise investment, a substrate transfer system only having the configuration shown in FIG. 6B or FIG. 6C may be employed. Since the first transfer unit 28 and the second transfer unit 31 are independent, the substrate transfer system may be completed with either of them. Therefore, the configuration shown in FIG. 6C may be later added to the configuration shown in FIG. 6B and vice versa. In this case, a connection port to connect the first transfer unit 28 or the second transfer unit 31 later may be provided in the loader module 22.

An alternated long and short dash line L6 in FIG. 6B presents a height at which the first vacuum transfer robot 56 of the first transfer chamber 27 transfers a substrate from the first load-lock chamber 26-2 to the first processing chamber 23-2. The first vacuum transfer robot 56 transfers the substrate W from the first load-lock chamber 26-2 to the first processing chamber 23-2 (or vice versa) at substantially a constant height. An alternated long and short dash line L7 in FIG. 6C presents a height at which the second vacuum transfer robot 58 transfers a substrate W from the second load-lock chamber 29-2 to the second processing chamber 24-2 (or vice versa). The second vacuum transfer robot 58 transfers the substrate from the second load-lock chamber 29-2 to the second processing chamber 24-2 (or vice versa) at substantially a constant height. The height at which the first vacuum transfer robot 56 shown in FIG. 6B transfers a substrate W is greater than the height at which the second vacuum transfer robot 58 shown in FIG. 6C transfers a substrate W. In order to cope with a difference in height between the first transfer unit 28 and the second transfer unit 31, the first processing chamber 23-2 is mounted on the base 42.

In accordance with the present embodiment, since the first transfer unit 28 of the upper layer shown in FIG. 6B and the second transfer unit 31 of the lower layer shown in FIG. 6C transfer the substrates W independently without mutual interference or dependency, they can transfer the substrates W into/out of the loader module 22 with high transfer efficiency depending on process conditions within the plurality of processing chambers 23-1, 23-2, 24-1 and 24-2 to which the respective transfer units 28 and 31 are connected. This can provide a higher throughput, i.e., a higher number of substrates W processed per unit time in the whole system. In addition, since the first vacuum transfer robot 56 and the second vacuum transfer robot 58 are independent, one of the vacuum transfer robots 56 and 58 can be operated while the other is out of order, without stoppage of the whole substrate processing system.

By employing the layer structure to make vertical overlap between the first and second transfer units 28 and 31, an excellent effect of reduction of the overall system footprint (i.e., an occupied area) can be achieved. The layer structure is also supported by a technique for lessening a vertical thickness of the vertically overlapping load-lock chambers 26-1, 26-2, 29-1 and 29-2 and transfer chambers 27 and 30. Non-provision of transfer robots in the load-lock chambers 26-1, 26-2, 29-1 and 29-2 can minimize volumes of the load-lock chambers 26-1, 26-2, 29-1 and 29-2, lessen their thickness and restrict the overall height even in the case of overlapping them in the layer structure. In addition, the minimized volumes of the load-lock chambers 26-1, 26-2, 29-1 and 29-2 may result in reduction of time taken to increase/decrease a pressure for switching between the atmosphere and the vacuum. For the transfer chambers 27 and 30, restriction on a height dimension of an employed vacuum transfer arm facilitates the restriction on the overall height even in the case of overlapping in the layer structure.

Further, when at least portions of the first load-lock chambers 26-1 and 26-2 and/or at least a portion of the first transfer chambers 27 are vertically overlapped with the loader module 22, a depth dimension of the substrate processing system can be lessened, and thus, a footprint can be further reduced. In addition, by making the first transfer unit 28 vertically overlap with the loader module 22, since the second transfer unit 31 can be disposed in proximity to the loader module 22, the atmospheric transfer robot in the atmospheric transfer chamber 25 and the second vacuum transfer robot 58 in the second transfer chamber 30 can make direct exchange of the substrates W via the second load-lock chambers 29-1 and 29-2. In addition, volumes of the second load-lock chambers 29-1 and 29-2 can be kept at minimum without providing a substrate moving mechanism (which will be described later) therein.

If a semiconductor wafer as a substrate W is processed, a wafer diameter is requested to be enlarged from, e.g., 300 mm to, e.g., 450 mm. When a size of the substrate processing system is simply increased by one and a half times in compliance with the enlarged wafer diameter, the installing area is increased by 2.25 times. When a large-diameter wafer is processed, reduction of a footprint is of great significance.

Although a vacuum vessel (V) surrounding a vacuum region for executing a process is vertically short, a housing surrounding the vacuum vessel (V) is vertically long, as shown in FIGS. 6A to 6C. Therefore, it is difficult for the processing chambers 23-1, 23-2, 24-1 and 24-2 shown in FIGS. 6A to 6C to be vertically overlapped with each other. Examples of equipments which are preferably provided at the upper portion of the processing chambers 23-1, 23-2, 24-1 and 24-2 may include an RF power supply, a microwave supply device, a matching circuit, a gas supply device and the like. Examples of equipments which are preferably provided at the lower portion of the processing chambers 23-1, 23-2, 24-1 and 24-2 may include a turbo molecular pump, an RF power supply and the like. These equipments are provided in upper and lower parts of the housing surrounding the vacuum vessel (V), occupy a vertical space exclusively, and form the processing chambers 23-1, 23-2, 24-1 and 24-2 as a whole. Since each of the processing chambers 23-1, 23-2, 24-1 and 24-2 is configured to occupy the vertical space exclusively, it is possible to optimize the arrangement of the equipments and lessen a machine deviation between the processing chambers 23-1, 23-2, 24-1 and 24-2 in process performance. These processing chambers are suitable for fulfilling process conditions with high reproducibility when a 22 nm design rule is applied to a 450 mm wafer in the state-of-art.

Further, since the shorter first transfer unit 28 is disposed above the longer second transfer unit 31, the first transfer chamber 27 of the first transfer unit 28 may overlap with the second load-lock chambers 29-1 and 29-2 of the second transfer unit 31; however, the first transfer chamber 27 and the second transfer chamber 30 may not overlap with each other. This may facilitate maintenance of the first transfer chamber 27 and the second transfer chamber 30.

Figure 7:
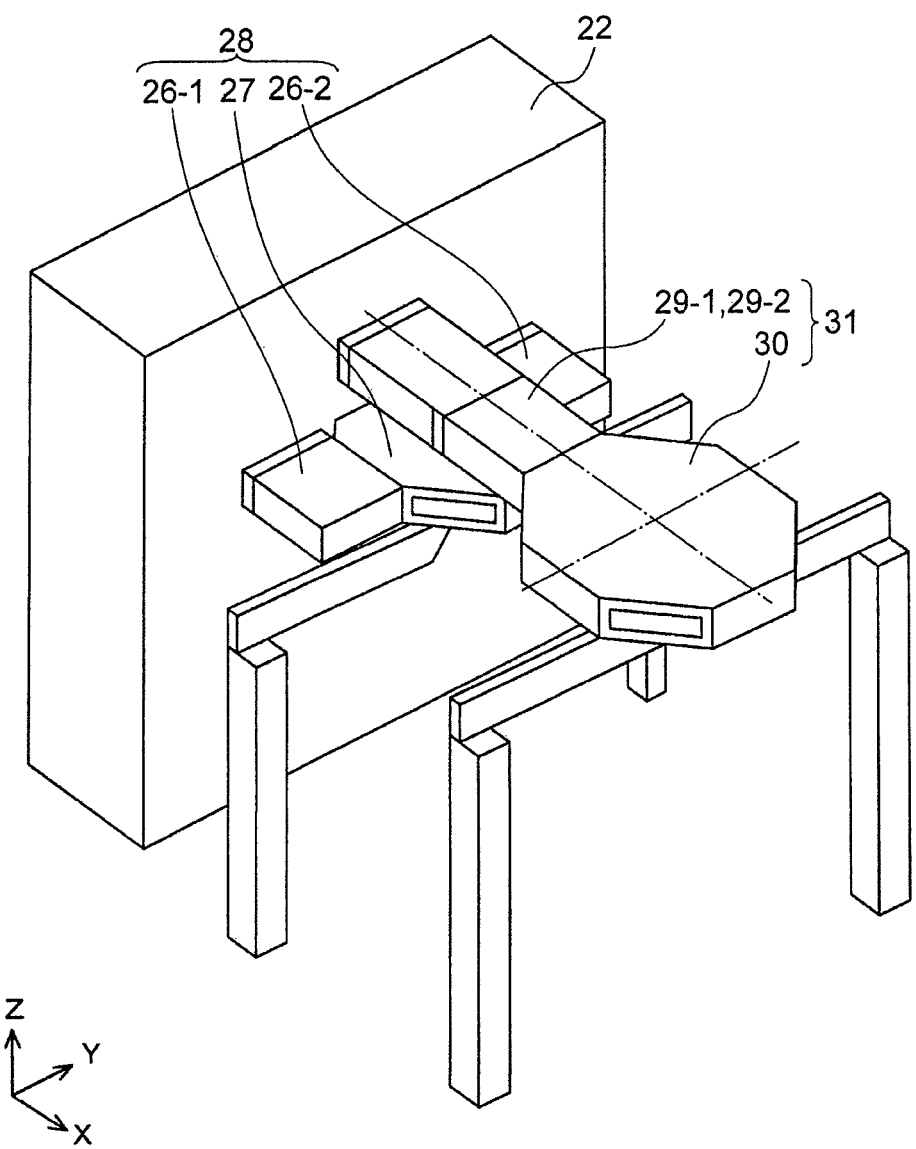
FIG. 7 is a perspective view showing a comparative example in which a first transfer unit and a second transfer unit are vertically inverted.

FIG. 7 shows a comparative example in which the first transfer unit 28 and the second transfer unit 31 are vertically inverted. Vertical inversion of these units allows the second load-lock chambers 29-1 and 29-2 to be disposed above the first transfer chamber 27. In this case, although a cover for maintenance of the first transfer chamber 27 cannot be opened, the configuration in which the first transfer unit 28 and the second transfer unit 31 are vertically inverted may be possible. Also in this case, it is possible to achieve a smaller footprint and a high throughput than those in conventional techniques.

Figure 8:
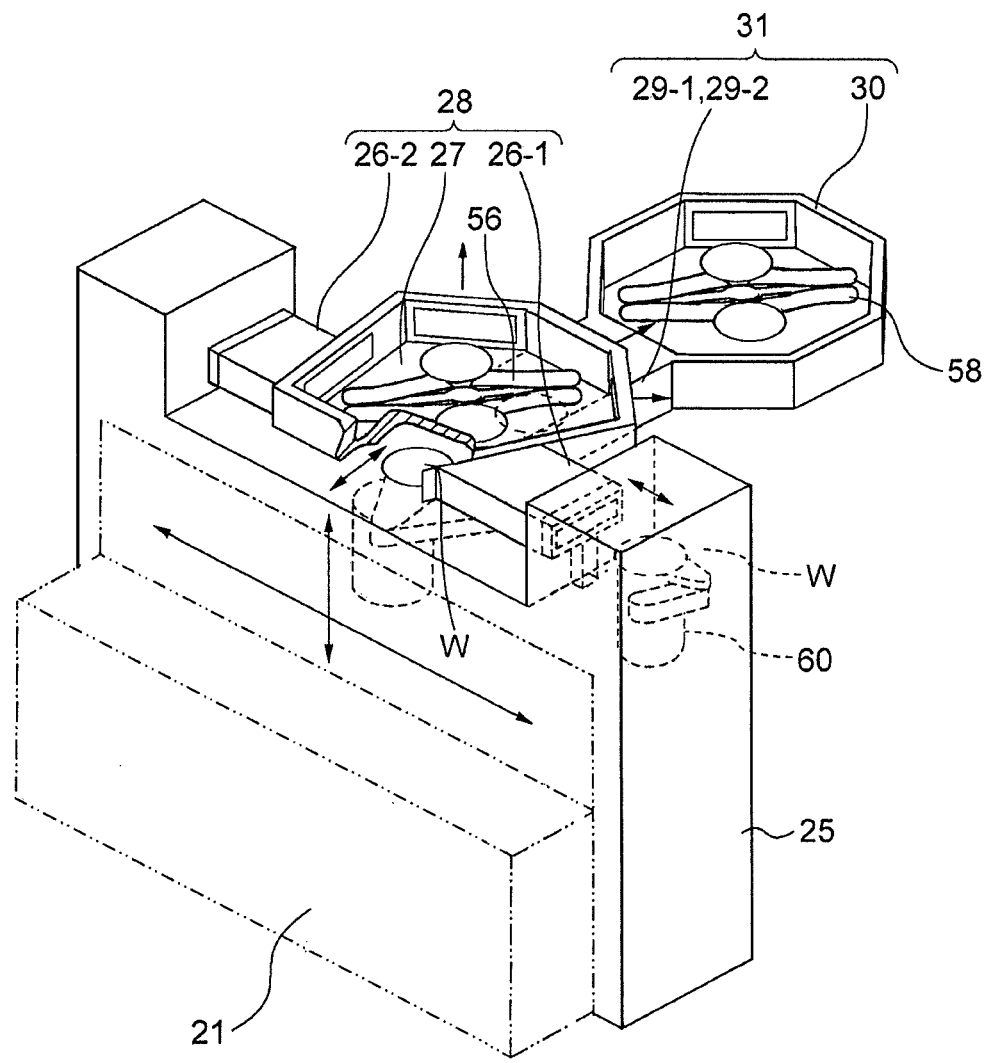
FIG. 8 is a perspective view of the first transfer unit and the second transfer unit.

FIG. 8 is a schematic perspective view of the entire configuration of the first and second transfer units 28 and 31. An atmospheric transfer robot 60 accesses one of cassettes on the ports 21 provided along the loader module 22 and includes a scalar type transfer arm which can load/unload substrates W on/from the cassette. The scalar type transfer arm is moved in the atmospheric transfer chamber in the vertical direction (Z direction) and the longitudinal direction (Y direction) by means of a movement mechanism (not shown). The first load-lock chambers 26-1 and 26-2 and the second load-lock chambers 29-1 and 29-2 are disposed at accessible positions of the atmospheric transfer robot 60. The atmospheric transfer robot 60 transfers the substrate W into the first load-lock chamber 26-1 or 26-2 under the atmospheric pressure. The substrate W loaded into the first load-lock chamber 26-1 or 26-2 is transferred into one of the first processing chambers 23-1 and 23-2 by the first vacuum transfer robot 56 under a depressurized state. Also, the atmospheric transfer robot 60 transfers the substrate W into the second load-lock chambers 29-1 or 29-2. The substrate W loaded into one of the second load-lock chambers 29-1 and 29-2 is transferred into one of the second processing chambers 24-1 and 24-2 by the second vacuum transfer robot 58 under a depressurized state.

Figure 9:
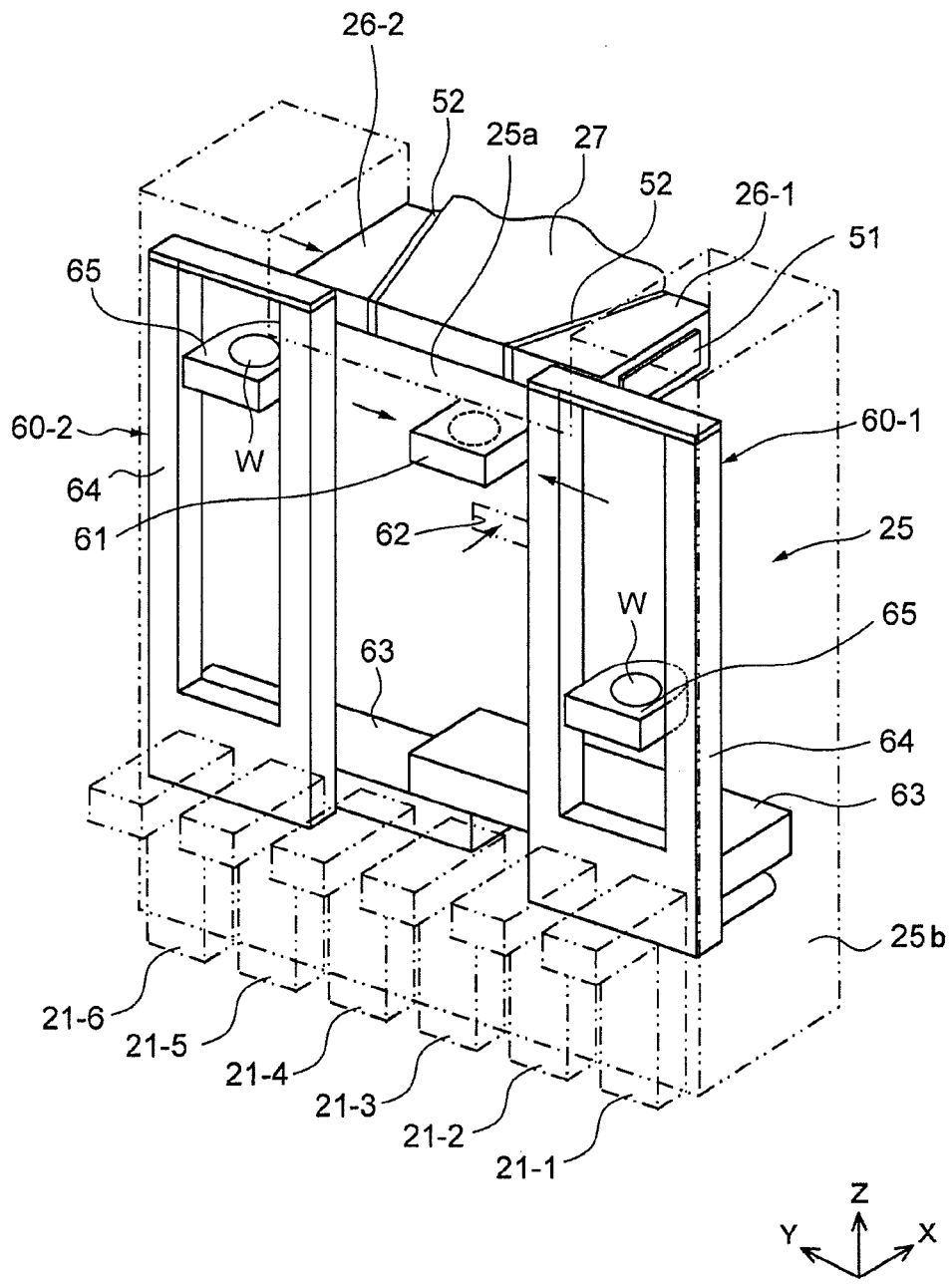
FIG. 9 is a perspective view showing an internal structure of a loader module.

FIG. 9 is a perspective view of the atmospheric transfer chamber 25 and the atmospheric transfer robot 60. In FIG. 9, an example of gate type robot replaced for the scalar type robot is shown. The atmospheric transfer chamber 25 is formed to have an elongated cubic shape in the arrangement direction of the ports 21. The top surface of the atmospheric transfer chamber 25 is provided with a concave portion 25a on which the first load-lock chambers 26-1 and 26-2 and the first transfer chamber 27 are mounted. A FFU (Fan Filter Unit, not shown) is provided in the upper part of the atmospheric transfer chamber 25 and a down flow of air is formed in the atmospheric transfer chamber 25.

The dual systematic first transfer unit 28 and the second transfer unit 31 are connected to the atmospheric transfer chamber 25. If the number of atmospheric transfer robots 60 is one, transferring by the atmospheric transfer robot 60 may become slower during a process. Accordingly, two atmospheric transfer robots 60-1 and 60-2 are provided in both sides of the atmospheric transfer chamber 25 in the longitudinal direction (Y direction), respectively. In the center of the atmospheric transfer chamber 25 in the longitudinal direction (Y direction) is provided an orienter 61 which recognizes notches and the like of the substrates W to perform alignment (positioning) thereof. A connection port 62 connected to the second load-lock chambers 29-1 and 29-2 is provided below the orienter 61. Both of the two atmospheric transfer robots 60-1 and 60-2 can access the central orienter 61 and the second load-lock chambers 29-1 and 29-2. Each of atmospheric transfer robots 60-1 and 60-2 accesses to a closer one among the two first load-lock chambers 26-1 and 26-2 which are separated from each other in the longitudinal direction (Y direction) of the atmospheric transfer chamber 25. That is, only the atmospheric transfer robot 60-1 accesses the load-lock chamber 26-1 and only the atmospheric transfer robot 60-2 accesses the load-lock chamber 26-2.

As shown in FIG. 9, the gate type atmospheric transfer robots 60-1 and 60-2 include respective Y axis guides 63 extending in parallel to the longitudinal direction (Y direction) of the atmospheric transfer chamber 25 and respective Z axis guides 64 extending in the vertical direction (Z direction). The substrates W can be freely moved in the atmospheric transfer chamber 25 in both of the longitudinal direction (Y direction) and the vertical direction (Z direction) by means of these Y axis guides 63 and the Z axis guides 64. A slide rest 65 acting as a scalar type robot is attached to each of the Z axis guides 64. An arm (not shown) to hold the substrates W is attached to the slide rest 65. The arm slides through the slide rest, and thus, the substrates W can be transferred into/out of the ports 21-1 to 21-6 or the first and second load-lock chambers 26-1, 26-2, 29-1 and 29-2.

Among the ports 21-1 to 21-6, ports in charge of each of the two atmospheric transfer robots 60-1 and 60-2 are predetermined. The atmospheric transfer robots 60-1 and 60-2 put the substrates W on the orienter 61 in addition to loading/unloading the substrates W on/from the cassettes placed on the ports 21-1 to 21-6. The substrate aligned in the orienter 61 is taken out by one of the atmospheric transfer robots 60-1 and 60-2 and is transferred into one of the first load-lock chambers 26-1 and 26-2 or one of the second load-lock chambers 29-1 and 29-2. Here, one of the atmospheric transfer robots 60-1 and 60-2 may put the substrate W on the orienter 61 and then, the other may take the substrate W out of the orienter 61.

In accordance with the present embodiment, the atmospheric transfer robots 60-1 and 60-2 are provided, which are moved in the longitudinal direction (Y direction) of the atmospheric transfer chamber 25 configuring the loader module 22 to take an unprocessed substrate W out of the cassette and transfer it into one of the load-lock chambers 26-1, 26-2, 29-1 and 29-2. Since the atmospheric transfer chamber 25 extends in the arrangement direction (Y direction) of the plurality of ports 21-1 to 21-6, a transfer area within the atmospheric transfer chamber 25 may be horizontally divided into two subareas in the longitudinal direction (Y direction), in which the two atmospheric transfer robots 60-1 and 60-2 capable of transferring the substrates W independently may be provided, respectively.

For example, when six cassettes are loaded on the ports 21-1 to 21-6, respectively, the left atmospheric transfer robot 60-2 may be in charge of loading/unloading the substrates W on/from the cassettes of the left half three ports 21-4 to 21-6 and the right atmospheric transfer robot 60-1 may be in charge of loading/unloading the substrates W on/from the cassettes of the right half three ports 21-1 to 21-3, whereby it is possible to improve transfer efficiency. In addition, by making both of the left and right atmospheric transfer robots 60-1 and 60-2 access the two cassettes loaded on the central ports 21-3 and 21-4, the substrate W can be transferred into any one of the load-lock chambers 26-1, 26-2, 29-1 and 29-2 and the processed substrate W can be received in the common cassette on the port 21-3 or 21-4 via any one of the load-lock chambers 26-1, 26-2, 29-1 and 29-2.

In addition, a selection of assigning a process of a substrate passing through the upper transfer unit for cassettes on the three left ports 21-1 to 21-3 and assigning a process of a substrate passing through the lower transfer unit for cassettes on the three right ports 21-4 to 21-6 or a selection of taking substrates W out of the common cassettes on the ports 21-3 and 21-4 and receiving processed substrates in the common cassettes is performed in accordance with a software instruction of a controller.

Figure 10:
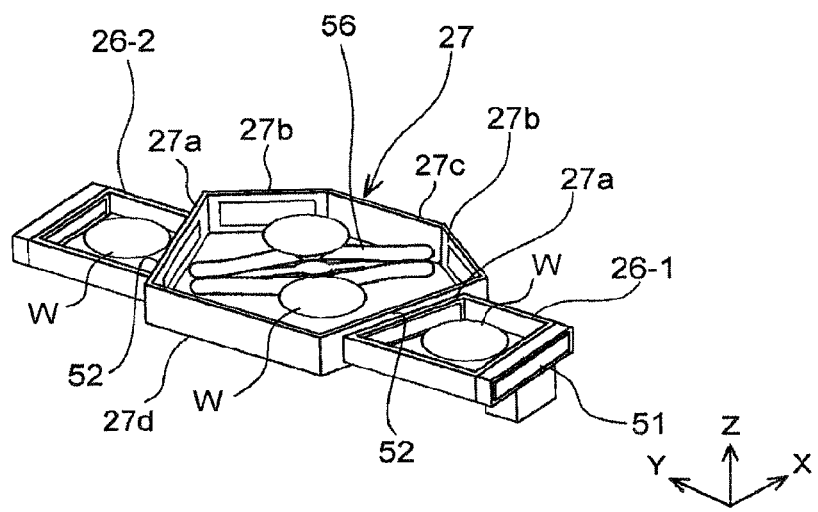
FIG. 10 is a perspective view of first load-lock chambers and a first transfer chamber forming the first transfer unit.

FIG. 10 is a perspective view of the first load-lock chambers 26-1 and 26-2 and the first transfer chamber 27. The two first load-lock chambers 26-1 and 26-2 are connected to the two sides 27a of the first transfer chamber 27 of a planar polygonal shape via gate valves 52, respectively.

Each of the first load-lock chambers 26-1 and 26-2 is formed in a small room where vacuum exhaustion and atmospheric pressure restoration are alternately performed. An exhausting device for vacuum exhaustion and a purge gas supply system of nitrogen gas or air for atmospheric pressure restoration are connected to the first load-lock chambers 26-1 and 26-2. For the purpose of pressure control, the internal pressure of each of the first load-lock chambers 26-1 and 26-2 is measured by a pressure gauge. In order to facilitate the vacuum exhaustion and the atmospheric pressure restoration, volumes of the first load-lock chambers 26-1 and 26-2 are set to be as small as possible after satisfying necessary functions. The first load-lock chambers 26-1 and 26-2 and the atmospheric transfer chamber 25 are interconnected via respective gate valves 51.

The first load-lock chambers 26-1 and 26-2 are provided with a lifter (not shown) for supporting the substrate W and a lifter drive (not shown) for elevating the lifter. When the atmospheric transfer robot 60-1 or 60-2, or the first vacuum transfer robot 56 carries the substrate W into the first load-lock chamber 26-1 or 26-2, the lifter is in a descending state without any substrate W thereon. When carrying-in of the substrate W is completed, the lifter ascends to receive the substrate W from the atmospheric transfer robot 60-1 or 60-2, or the first vacuum transfer robot 56. Meanwhile, when the atmospheric transfer robot 60-1 or 60-2, or the first vacuum transfer robot 56 unloads the substrate W from the first load-lock chamber 26-1 or 26-2, the lifter is in an ascending state with holding the substrate W. In a phase where the atmospheric transfer robot 60-1 or 60-2, or the first vacuum transfer robot 56 puts an end effector into the first load-lock chamber 26-1 or 26-2, the lifter is descended to pass over the substrate W from the lifter to the atmospheric transfer robot 60-1 or 60-2, or the first vacuum transfer robot 56. A first load-lock module is configured with the first load-lock chambers 26-1 and 26-2, the exhausting device, the purge gas supply system, the pressure gauge, the lifter and the lift drive. In addition, the first load-lock module may include a heating/cooling device.

The interior of the first transfer chamber 27 is vacuum-exhausted by the exhausting device. The cover 34 (see FIG. 4) can be opened to clean the interior of the first transfer chamber 27 or check the first vacuum transfer robot 56. The first vacuum transfer robot 56 is provided within the first transfer chamber 27. A first transfer module is configured with the first transfer chamber 27 and the first vacuum transfer robot 56.

The first vacuum transfer robot 56 includes a pair of frog leg type transfer mechanisms. As shown in FIG. 5A, each frog leg type transfer mechanism includes first and second driving arms 143 and 144 driven to be rotated around the center of the transfer chamber 27, a first link 145 rotatably connected to a leading end of the first driving arm 143, a second link 146 rotatably connected to a leading end of the second driving arm 144, and holding plates 147 rotatably connected to leading ends of the first and second links 145 and 146. A frog leg type diamond-shaped link mechanism is formed by the arrangement of the first and second driving arms 143 and 144 and first and second links 145 and 146 and the holding plates 147. The pair of frog leg type transfer mechanisms is formed in lateral symmetry with respect to a line including the center of the transfer chamber 27. The first vacuum transfer robot 56 may include a Z axis movement mechanism which elevates the pair of frog leg type transfer mechanisms.

When the first and second driving arms 143 and 144 are rotated in the opposite directions by a motor, one frog leg type transfer mechanism extends and one holding plate 147 moves in the radial direction. A substrate held on the one holding plate 147 taken out through a slit of the first transfer chamber 27 enters into one of the first load-lock chambers 26-1 and 26-2 or the first transfer chamber 27. At this time, the other holding plate 147 slightly approaches the center of the first transfer chamber 27 with almost no change in a shape of the frog leg type transfer mechanism. When the first and second driving arms 143 and 144 are rotated in the same direction by the motor, the pair of frog leg type transfer mechanisms is rotated in a horizontal plane and the substrate W held on the holding plate 147 is also rotated in the horizontal plane. As the first vacuum transfer robot 56, a scalar type robot or a cylindrical-coordinate robot may be used instead of the frog leg type transfer mechanism. The first vacuum transfer robot 56 may include a Z axis movement mechanism which elevates the pair of frog leg type transfer mechanisms.

Operations of the first load-lock module and the first transfer module are as follows. As shown in FIG. 9, when the atmospheric transfer robot 60-1 or 60-2 loads a substrate W into the first load-lock chamber 26-1 or 26-2, the gate valve 51 of the atmospheric transfer chamber 25 side of the first load-lock chamber 26-1 or 26-2 is closed so that the first load-lock chamber 26-1 or 26-2 can be vacuum-exhausted. When the first load-lock chamber 26-1 or 26-2 is in a vacuum state, the gate valve 52 of the first transfer chamber 27 side is opened so that the first load-lock chamber 26-1 or 26-2 can communicate with the first transfer chamber 27. The first vacuum transfer robot 56 introduces (carries) an unprocessed substrate W from the first load-lock chamber 26-1 or 26-2 into the first transfer chamber 27 under a depressurized state and loads the carried-in unprocessed substrate W into the first processing chamber 23-1 or 23-2.

When a predetermined process is completed in the first processing chamber 23-1 or 23-2, the first vacuum transfer robot 56 receives the processed substrate W from the first processing chamber 23-1 or 23-2, carries it into the first transfer chamber 27, and then passes the carried-in substrate W to the other first processing chamber 23-1 or 23-2 for subsequent process or one of the first load-lock chambers 26-1 and 26-2. When the substrate W is passed to the first load-lock chamber 26-1 or 26-2, the gate valve 52 of the first transfer chamber 27 can be closed. Thereafter, the first load-lock chamber 26-1 or 26-2 into which the substrate W is loaded is restored to the atmospheric pressure and then, the gate valve 51 of the atmospheric transfer chamber 25 side can be opened. The atmospheric transfer robot 60-1 or 60-2 takes the processed substrate W out of the first load-lock chamber 26-1 or 26-2 and returns the taken substrate W to one of the cassettes on the ports 21-1 to 21-6.

Figure 11:
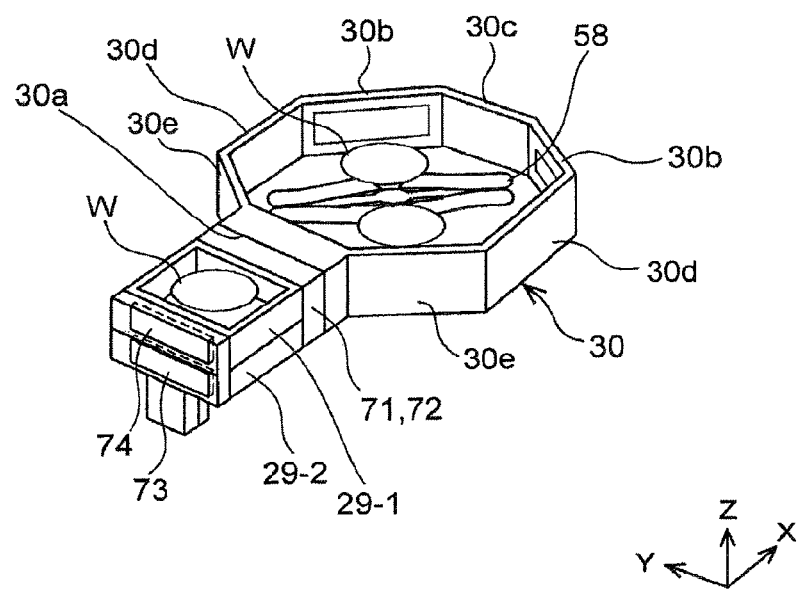
FIG. 11 is a perspective view of a second load-lock chamber and a second transfer chamber forming the second transfer unit.

FIG. 11 is a perspective view of the second load-lock chambers 29-1 and 29-2 and the second transfer chamber 30.

Figure 12:
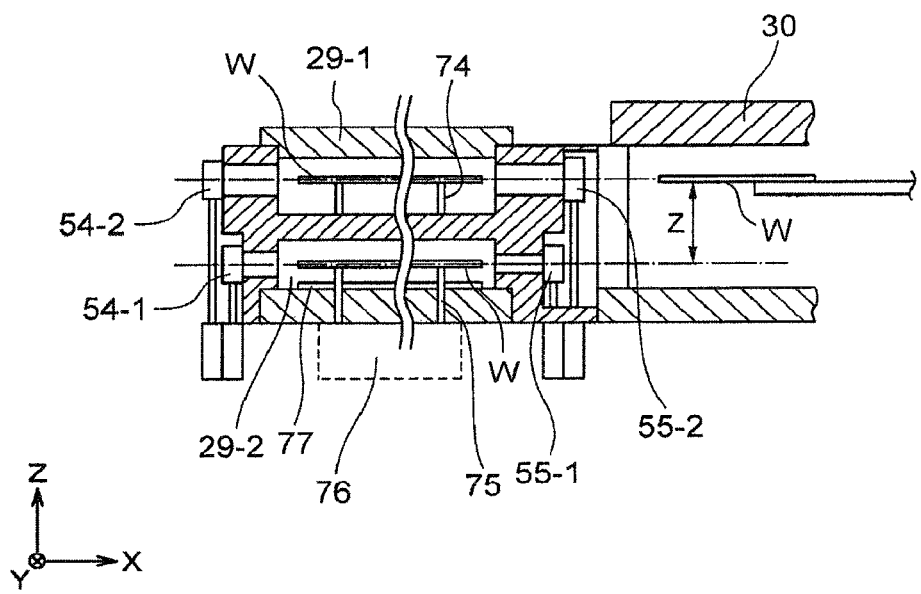
FIG. 12 is a cross-sectional view of two second load-lock chambers.

The two upper and lower second load-lock chambers 29-1 and 29-2 are connected to the side 30a of the second transfer chamber 30 of a planar polygonal shape, the side 30a being opposite to the loader module 22, via respective upper and lower gate valves 71 and 72. Each of the second load-lock chambers 29-1 and 29-2 is formed in a small room where vacuum exhaustion and atmospheric pressure restoration are alternately performed. An exhausting device for vacuum exhaustion and a purge gas supply system of nitrogen gas or air for atmospheric pressure restoration are connected to the second load-lock chambers 29-1 and 29-2. For the purpose of pressure control, each of the internal pressure of the second load-lock chambers 29-1 and 29-2 is measured by a pressure gauge. In order to facilitate the vacuum exhaustion and the atmospheric pressure restoration, volumes of the second load-lock chambers 29-1 and 29-2 are set to be as small as possible after satisfying necessary functions. As shown in FIG. 12, the second load-lock chambers 29-1 and 29-2 and the atmospheric transfer chamber 25 are interconnected via respective gate valves 54-1 and 54-2 and the second load-lock chambers 29-1 and 29-2 and the second transfer chamber 30 are interconnected via respective gate valves 55-1 and 55-2.

The second vacuum transfer robot 58 includes a Z axis movement mechanism for elevating a substrate W in the Z axis direction so that the substrate W can be loaded into the two upper and lower second load-lock chambers 29-1 and 29-2. The upper second load-lock chamber 29-1 is provided with a fixed lifter for supporting the substrate W. The lower second load-lock chamber 29-2 is provided with a lifter 75 for supporting the substrate W and a lifter drive 76 for elevating the lifter 75. When the atmospheric transfer robot 60-1 or 60-2 or the second vacuum transfer robot 58 carries the substrate W into the second load-lock chamber 29-1 or 29-2, the lifter 75 is in a descending state without any substrate W thereon. When the carrying-in of the substrate W is completed, the lifter ascends to receive the substrate W from the atmospheric transfer robots 60-1 or 60-2, or the second vacuum transfer robot 58.

A second load-lock module is configured with the second load-lock chambers 29-1 and 29-2, the exhausting device, the purge gas supply system, the pressure gauge, the lifters 74 and 75 and the like. The lifters provided in the second load-lock chambers may be of a fixed type, as the first load-lock chambers. The second load-lock module may include a heating/cooling device.

The interior of the second transfer chamber 30 is vacuum-exhausted by the exhausting device. The cover 39 (see FIG. 4) can be opened to clean the interior of the second transfer chamber 30 or check the second vacuum transfer robot 58. The second vacuum transfer robot 58 is provided within the second transfer chamber 30. A second transfer module is configured with the second transfer chamber 30 and the second vacuum transfer robot 58. The second vacuum transfer robot 58 also includes a pair of frog leg type transfer mechanisms having the same structure and operation as the pair of frog leg type transfer mechanisms shown in FIG. 5A.

Operations of the second load-lock module and the second transfer module are as follows. As shown in FIG. 9, when the atmospheric transfer robot 60-1 or 60-2 loads a substrate W into the second load-lock chamber 29-1 or 29-2, the gate valve 73 or 74 of the atmospheric transfer chamber 25 side of the second load-lock chamber 29-1 or 29-2 is closed so that the second load-lock chamber 29-1 or 29-2 can be vacuum-exhausted. When the second load-lock chamber 29-1 or 29-2 is in a vacuum state, the gate valve 71 or 72 of the transfer chamber 30 side is opened so that the second load-lock chamber 29-1 or 29-2 can communicate with the second transfer chamber 30. The second vacuum transfer robot 58 introduces (carries) the unprocessed substrate W from the second load-lock chamber 29-1 or 29-2 into the second transfer chamber 30 under a depressurized state and loads the carried-in unprocessed substrate W into the second processing chamber 24-1 or 24-2.

When a predetermined process is completed in the second processing chamber 24-1 or 24-2, the second vacuum transfer robot 58 introduces (carries) the processed substrate W from the second processing chamber 24-1 or 24-2 into the second transfer chamber 30 and then, passes the processed substrate W to the other second processing chamber 24-1 or 24-2 for subsequent process or one of the second load-lock chambers 29-1 and 29-2. When the substrate W is passed to the second load-lock chamber 29-1 or 29-2, the gate valve 71 or 72 of the second transfer chamber 30 side is closed and the gate valve 73 or 74 of the atmospheric transfer chamber 25 side is opened. Thereafter, the second load-lock chamber 29-1 or 29-2 into which the substrate W is carried is restored to the atmospheric pressure and then, the atmospheric transfer robot 60-1 or 60-2 takes the processed substrate W out of the second load-lock chamber 29-1 or 29-2 and returns the taken substrate W to one of the cassettes on the ports 21-1 to 21-6.

The atmospheric transfer robots 60-1 and 60-2, the first vacuum transfer robot 56, the second vacuum transfer robot 58 and the like are controlled by a controller such as a computer or the like.

Figure 13:
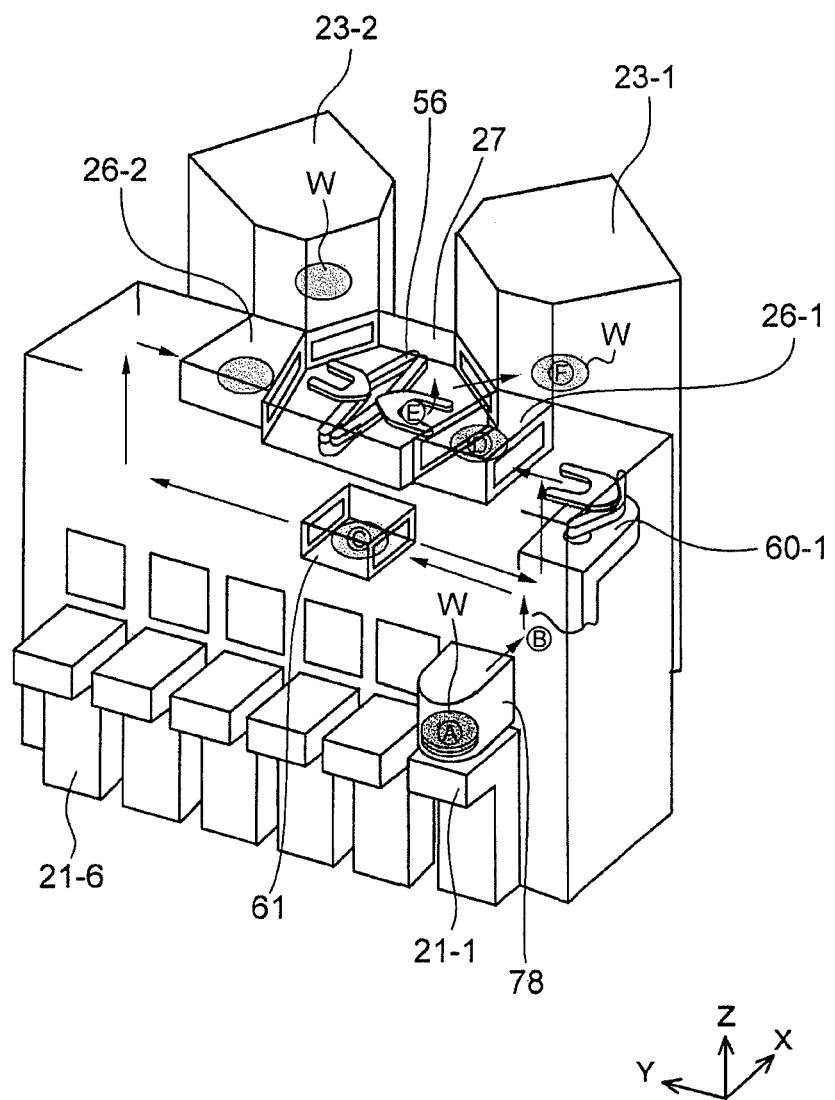
FIG. 13 is a perspective view showing a flow of a substrate in the first transfer unit.

FIG. 13 shows a flow of a substrate from a cassette on one of the ports 21-1 to 21-6, e.g., on the port 21-1, to the first processing chamber 23-1 or 23-2. One atmospheric transfer robot 60-1 introduces an unprocessed substrate W from a cassette 78 on the port 21-1 into the atmospheric transfer chamber 25 (A→B).

Next, the atmospheric transfer robot 60-1 carries the substrate to the orienter 61 and loads the substrate W on the orienter 61 for detecting a direction of the substrate W by detecting a notch or an orientation flat (B→C).

Next, the atmospheric transfer robot 60-1 takes out the substrate W aligned in the orienter 61 and loads it into one first load-lock chamber 26-1 (C→D). Here, after one atmospheric transfer robot 60-1 transfers the substrate W to the orienter 61, the other atmospheric transfer robot 60-2 may take the substrate W out of the orienter 61 and loads it into the other first load-lock chamber 26-2.

When the first load-lock chamber 26-1 is vacuum-exhausted, the first vacuum transfer robot 56 of the first transfer chamber 27 takes the substrate W out of the first load-lock chamber 26-1 and passes it to one first processing chamber 23-1 via the first transfer chamber 27 (D→E→F).

The substrate W processed in the first processing chamber 23-1 is loaded into the other first processing chamber 23-2 or is returned to the first load-lock chamber 26-1 by the first vacuum transfer robot 56 (the substrate may be moved between the two first processing chambers 23-1 and 23-2 or may be returned to the first load-lock chamber 26-1 via one processing chamber). The substrate W returned to the load-lock chamber 26-1 is returned to the cassette 78 on the port 21-1 by the atmospheric transfer robot 60-1.

It is preferable that substrate transfer pass lengths from the orienter 61 to the first processing chambers 23-1 and 23-2 via the first transfer unit 28 are set to be equal to each other regardless of which of the two first load-lock chambers 26-1 and 26-2 the pass goes through. In this case, times taken to transfer the substrate W from the orienter 61 to the first processing chambers 23-1 and 23-2 can be made approximately equal to each other with use of any of the two atmospheric transfer robots 60-1 and 60-2 and transfer times before and after the processing can be made equal to each other, which can result in increased processing compatibility.

Figure 14:
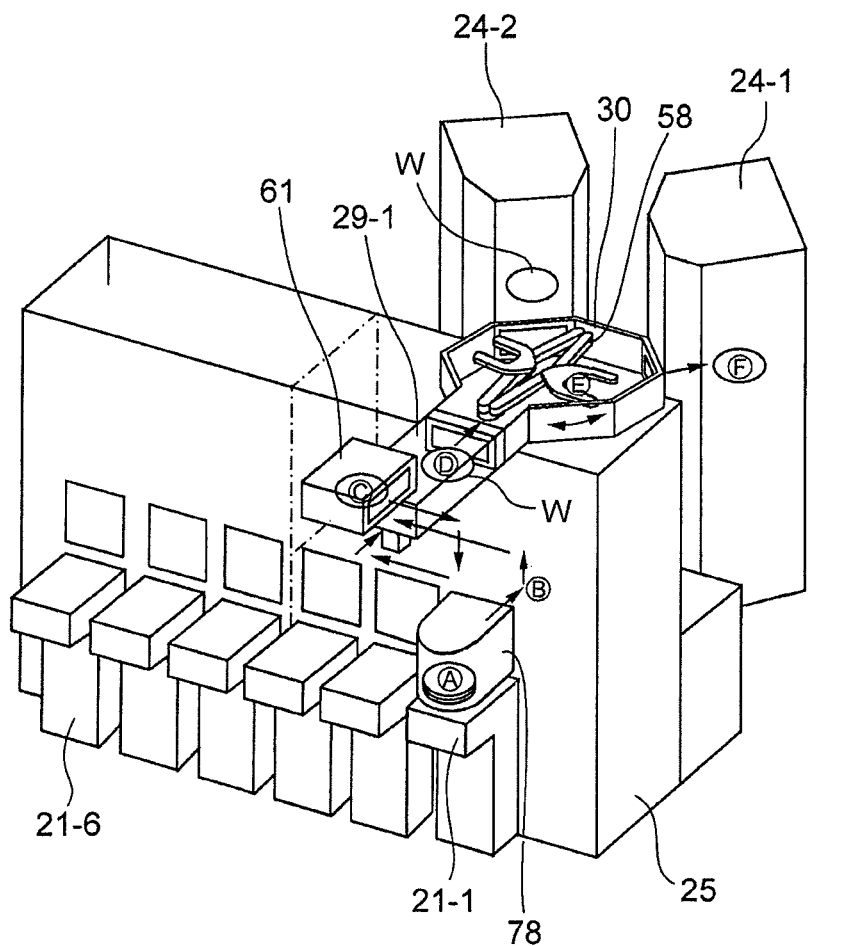
FIG. 14 is a perspective view showing a flow of a substrate in the second transfer unit.

FIG. 14 shows a flow of a substrate from a cassette 78 on one of the ports 21-1 to 21-6, e.g., on the port 21-1, to the second processing chamber 24-1. One atmospheric transfer robot 60-1 introduces an unprocessed substrate W from a cassette 78 on the port 21-1 into the atmospheric transfer chamber 25 (A→B). Next, the atmospheric transfer robot 60-1 carries the substrate W to the orienter 61 and loads the substrate W onto the orienter 61 (B→C). Next, the atmospheric transfer robot 60-1 takes out the substrate aligned on the orienter 61 and loads it into one second load-lock chamber 29-1 (C→D). Here, after one atmospheric transfer robot 60-1 transfers the substrate W to the orienter 61, the other atmospheric transfer robot 60-2 may take the substrate W out of the orienter 61 and load it into the other second load-lock chamber 29-2. When the second load-lock chamber 26-1 is vacuum-exhausted, the second vacuum transfer robot 58 of the second transfer chamber 30 takes the substrate W out of the second load-lock chamber 29-1 and passes it to the second processing chamber 24-1 via the second transfer chamber 30 (D→E→F).

The substrate W processed in the second processing chamber 24-1 is loaded into the other second processing chamber 24-2 or is returned to the second load-lock chamber 29-1 by the second vacuum transfer robot 58 (the substrate W may be moved between the two second processing chambers 24-1 and 24-2 or may be returned to the second load-lock chamber 29-1 via one processing chamber). The substrate W returned to the second load-lock chamber 29-1 is returned to the cassette 78 on the port 21-1 by the atmospheric transfer robot 60-1. It is preferable that substrate transfer pass lengths from the orienter 61 to the second processing chambers 24-1 and 24-2 via the second transfer unit 31 are set to be substantially equal to each other through either of the two second load-lock chamber 29-1 or 29-2. In this case, times taken to transfer the substrate W from the orienter 61 to the second processing chambers 24-1 and 24-2 can be made approximately equal to each other with use of any of the two atmospheric transfer robots 60-1 and 60-2 and transfer times before and after the processing can be made equal to each other, which can result in increased processing compatibility.

In comparison between the flows of the substrates in FIGS. 13 and 14, a first transfer process of transferring the substrate W into the first processing chamber 23-1 or 23-2 via the first load-lock chamber 26-1 or 26-2 and the first transfer chamber 27 and a second transfer process of transferring the substrate W into the second processing chamber 24-1 or 24-2 via the second load-lock chamber 29-1 or 29-2 and the second transfer chamber 30 have different distances from the loader module 22 to the respective processing chambers. However, since these processes are performed with the same number of exchange processes, it is possible to increase process compatibility in the first and second transfer processes.

Figure 15:
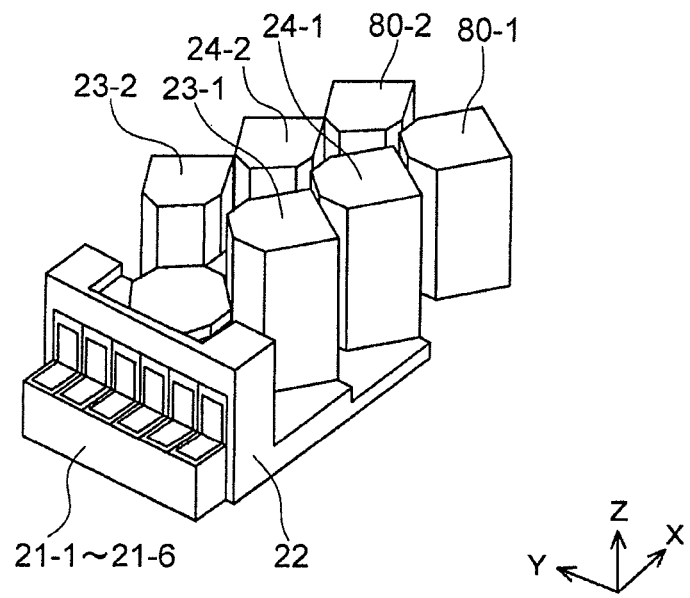
FIG. 15 is a perspective view showing an example of an additional third transfer unit to the substrate processing system in accordance with the first embodiment.

FIG. 15 is a perspective view showing an example of planar deployment of two additional third processing chambers 80-1 and 80-2 in addition to the two first processing chambers 23-1 and 23-2 and the two second processing chambers 24-1 and 24-2. The third processing chambers 80-1 and 80-2 are disposed father from the loader module 22 than the first processing chambers 23-1 and 23-2 and the second processing chambers 24-1 and 24-2. The third processing chambers 80-1 and 80-2 are disposed at separated planar positions without vertical overlap with any of the first processing chambers 23-1 and 23-2 and the second processing chambers 24-1 and 24-2.

Figure 16:
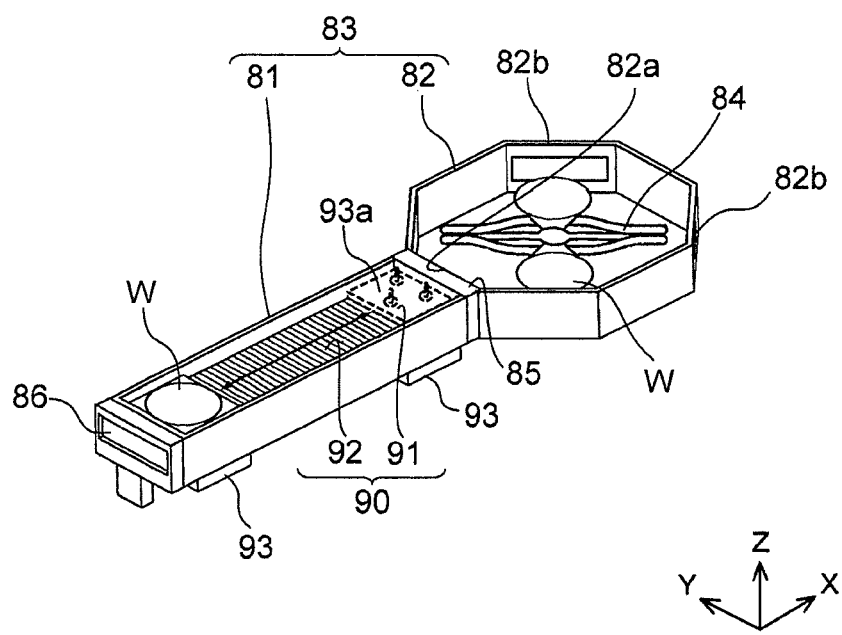
FIG. 16 is a perspective view of a third load-lock chamber and a third transfer chamber forming a third transfer unit.

The third processing chambers 80-1 and 80-2 are connected to the loader module 22 via a third transfer chamber 82 and a third load-lock chamber 81 (see FIG. 16). Here, the third load-lock chamber 81 and the third transfer chamber 82 are collectively referred to as a third transfer unit 83. The third transfer unit 83 transfers a substrate W to the third processing chambers 80-1 and 80-2 independent of the first transfer unit 28 and the second transfer unit 31. The third transfer unit 83 extends in a direction (X direction) perpendicular to the longitudinal direction (Y direction) of the loader module 22. The third transfer unit 83 passes between the two first processing chambers 23-1 and 23-2 and between the two second processing chambers 24-1 and 24-2. The length of the third transfer unit 83 in the depth direction (X direction) is longer than that of the second transfer unit 31. The third transfer unit 83 is disposed below the second transfer unit 31. At least portions of the first, second and third transfer units 28, 31 and 83 overlap with each other up to the midway of a pass from the loader module 22 to the third processing chambers 80-1 and 80-2, only the second and third transfer units 31 and 83 overlap with each other in the midway, and thereafter only the third transfer unit 83 exists.

As shown in FIG. 16, the third transfer unit 83 includes the third load-lock chamber 81 into which the substrate W is transferred by the atmospheric transfer robots 60-1 and 60-2 within the atmospheric transfer chamber 25, and the third transfer chamber 82 provided with a third vacuum transfer robot 84 to transfer the substrate W, which has been loaded into the third load-lock chamber 81, into the third processing chambers 80-1 and 80-2. The third load-lock chamber 81 and the third transfer chamber 82 are interconnected via a gate valve 85. The third load-lock chamber 81 and the atmospheric transfer chamber 25 are interconnected via a gate valve 86. A flow of a substrate from the third load-lock chamber 81 to the third processing chambers 80-1 and 80-2 is referred to as a "third transfer route."

The third transfer chamber 82 is formed to have a planar polygonal shape and the third load-lock chamber 81 is connected to one side 82a of the polygon (a side being opposite to the loader module 22) via the gate valve 85. The third processing chambers 80-1 and 80-2 are connected to other two sides 82b (sides inclined with respect to the longitudinal direction (Y direction) of the loader module 22 at the opposite side to the side 82a) of the third transfer chamber 82. The third processing chambers 80-1 and 80-2 are arranged to have a V shape with respect to the third transfer chamber 82. Substrates W are loaded into or unloaded from the third processing chamber 82 along the V line. The arrangement angle of the two third processing chambers 80-1 and 80-2 is equal to the arrangement angle of the two second processing chambers 24-1 and 24-2 and the arrangement angle of the two first processing chambers 23-1 and 23-2. The third vacuum transfer robot 84 placed in the third transfer chamber 82 includes a pair of frog leg transfer mechanisms, like the first and second vacuum transfer robots 56 and 58.

The third load-lock chamber 81 extends from the loader module 22 toward the third transfer chamber 82. The third load-lock chamber 81 includes a movement mechanism 90 which moves the substrate W linearly in the longitudinal direction (X direction). The movement mechanism 90 has a stage 91 and a brushless linear motor 92 which moves the stage 91. The stage 91 is provided with a lifter 93a for supporting the substrate W, and a lifter drive 93 for elevating the lifter 93a. As the third transfer chamber 82 is disposed at a position farther from the loader module 22 than the second transfer chamber 30, it is difficult to make direct exchange of the substrate W between the atmospheric transfer robots 60-1 and 60-2 and the third vacuum transfer robot 84. Accordingly, the third load-lock chamber 81 is provided with the movement mechanism 90 to transfer the substrate W between the atmospheric transfer robots 60-1 and 60-2 and the third vacuum transfer robot 84.

Operations of the third load-lock module and the third transfer module are as follows. When the atmospheric transfer robot 60-1 or 60-2 loads a substrate W onto the stage 91 of the third load-lock chamber 81, the gate valve 86 of the atmospheric transfer chamber 25 side of the third load-lock chamber 81 is closed so that the third load-lock chamber 81 can be vacuum-exhausted. While vacuum exhaustion of the third load-lock chamber 81 is being carried out, the movement mechanism 90 moves the stage 91 mounted with the substrate W toward the third transfer chamber 82. By performing the vacuum exhaustion and the movement of the stage 91 simultaneously, the time taken for the movement of the stage 91 will not cause deterioration of a throughput. When the third load-lock chamber 81 is in a vacuum state, the gate valve 85 of the third transfer chamber 82 side is opened so that the third load-lock chamber 81 can communicate with the third transfer chamber 82. The third vacuum transfer robot 84 receives the substrate W from the stage 91 transferred by the movement mechanism 90 and passes it to the third processing chamber 80-1 or 80-2.

Figure 17:
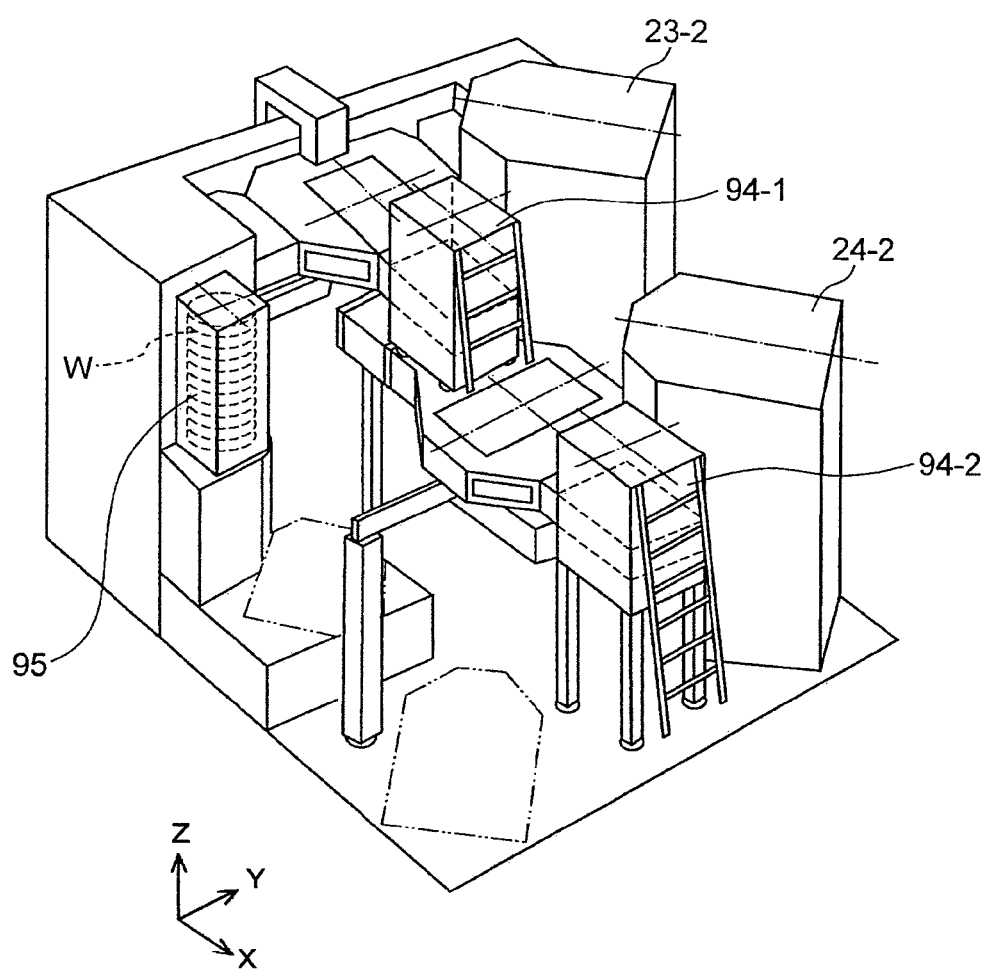
FIG. 17 is a rear side perspective view showing an example of an addition of a storage and small processing chambers to the substrate processing system in accordance with the first embodiment.

FIG. 17 shows an example of attachment of small processing chambers 94 and a storage 95 by using empty spaces of the substrate processing system. In this example, an empty space between a pair of first processing chambers 23-1 (not shown) and 23-2 arranged in a V shape is used to connect the small processing chamber 94 to the first transfer chamber 27. In addition, an empty space between a pair of second processing chambers 24-1 (not shown) and 24-2 arranged in a V shape is used to connect the small processing chamber 94 to the second transfer chamber 30. The storage 95 is connected to the atmospheric transfer chamber 25 by using an empty space between the atmospheric transfer chamber 25 and the first processing chambers 23-1 and 23-2, which are arranged at acute angles (in acute angle directions) with respect to the longitudinal direction (Y direction) of the atmospheric transfer chamber 25. An example of the small processing chamber 94 may include a post-processing chamber for annealing and stabilizing a plasma-processed substrate or a deposition gas chamber for heating and degasifying substrate W under a depressurized state. An example of the storage 95 may include a dummy storage for accommodating a dummy substrate or a purge storage for purging residual gas of a substrate W. The dummy substrate is transferred into the first and second processing chambers 23-1, 23-2, 24-1 and 24-2 until a process is stabilized. In addition, a module for cleaning a substrate rear side may be provided to be connected to the atmospheric transfer chamber 25. The small processing chambers 94 and the storage 95 may be provided without changing a footprint.

In the embodiment shown in FIG. 17, for example, for a wiring forming process forming a multilayer interconnection structure on a semiconductor device, the first processing chamber 23-1, the first processing chamber 23-2, and the small processing chambers 94 may be used as a barrier film sputtering device, a Cu sputtering device, and an annealing device, respectively. In the process of forming a multilayer interconnection structure on a semiconductor wafer, a wafer including an interlayer insulating film having a wiring groove formed thereon is first transferred to the small processing chamber 94 where a precure is performed by a PVD (Physical Vapor Deposition).

Subsequently, the wafer is transferred to the first processing chamber 23-1 where a barrier film such as TiN or the like is formed on the interlayer insulating film by using a sputtering device. The wafer is transferred from the first processing chamber 23-1 to the first processing chamber 23-2 where Cu is deposited on the barrier film by using a sputtering device. Such a series of steps is successively performed under depressurized environments via the first transfer chamber 27.

Figure 18A:
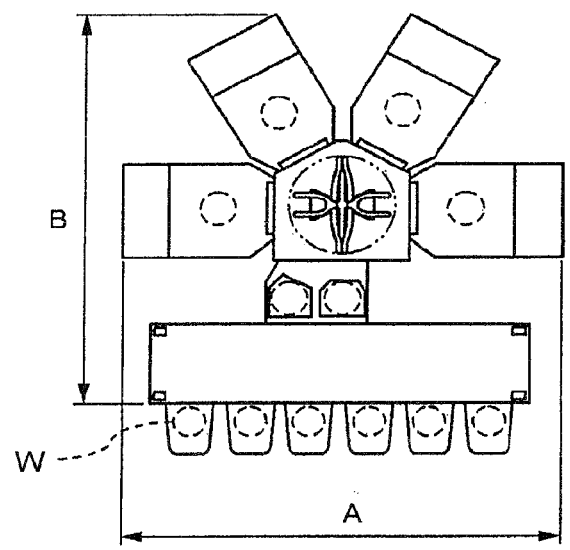
FIGS. 18A and 18B are plan views showing comparison in footprint between a conventional cluster type substrate processing system and the substrate processing system in accordance with the first embodiment, FIG. 18A showing a conventional cluster type substrate processing system including four processing chambers and FIG. 18B showing the substrate processing system in accordance with the first embodiment, including four processing chambers.
Figure 18B:
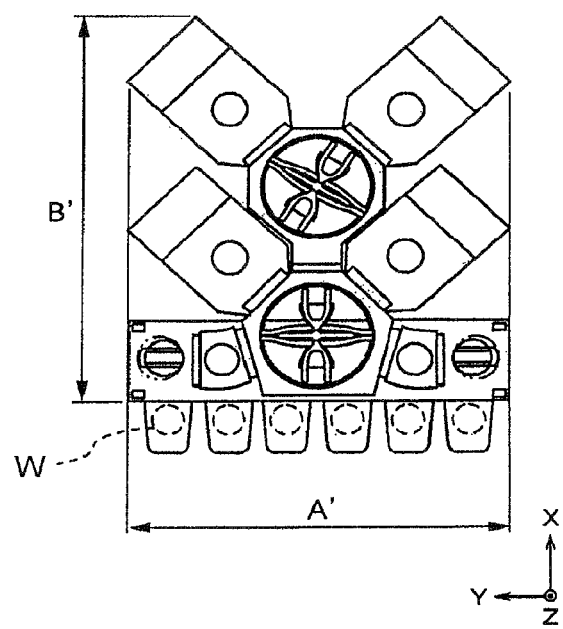
Figure 19A:
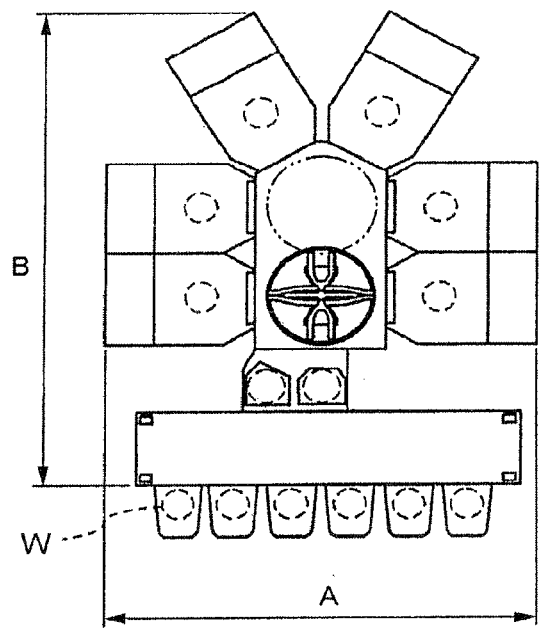
FIGS. 19A and 19B are plan views showing comparison in footprint between a conventional cluster type substrate processing system and the substrate processing system in accordance with the first embodiment, FIG. 19A showing a conventional cluster type substrate processing system including six processing chambers and FIG. 19B showing the substrate processing system in accordance with the first embodiment, including six processing chambers.
Figure 19B:
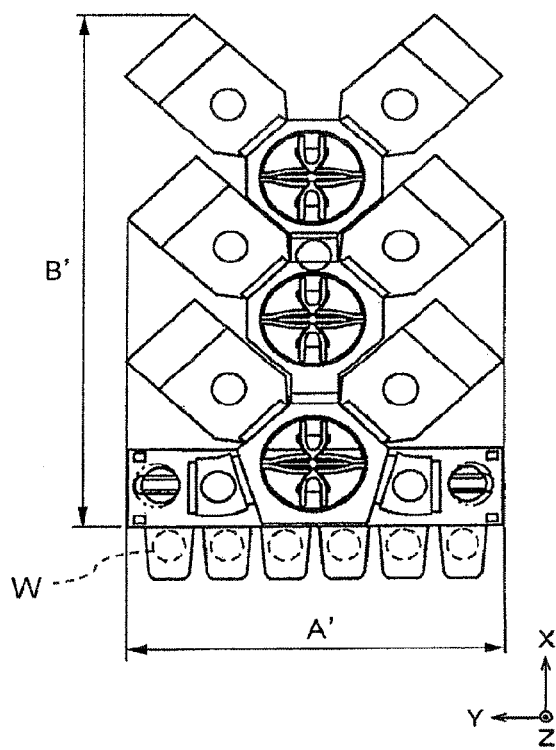

FIGS. 18A to 19B are plan views showing comparison in footprint between a conventional cluster type substrate processing system (FIG. 18A) and the substrate processing system in accordance with the first embodiment of the present invention (FIG. 18B). FIGS. 18A and 18B, and 19A and 19B show four processing chambers and six processing chambers, respectively. In FIGS. 18A to 19B, the processing chambers are sized to process a 450 mm wafer. As shown in FIGS. 18A and 18B, when the number of processing chambers is four, by configuring the processing chambers as the present embodiment, a width dimension was decreased from A to A' and a depth dimension was decreased from B to B'. The overall area was reduced from 31.1 m$^2$ to 26.5 m$^2$. As shown in FIGS. 19A and 19B, when the number of processing chambers is six, a width dimension was substantially decreased from A to A', while a depth dimension was increased from B to B'. The overall area was reduced from 38.6 m$^2$ to 36.6 m$^2$.

Figure 20:
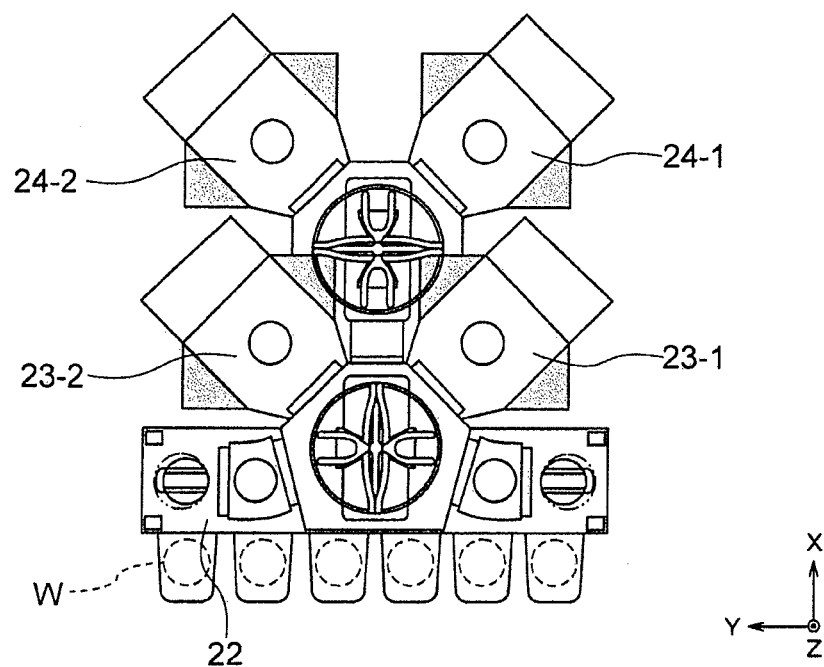
FIG. 20 is a plan view showing empty regions adjacent to processing chambers of the substrate processing system in accordance with the first embodiment.
Figure 21A:
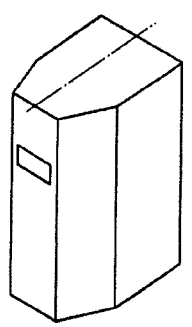
FIGS. 21A and 21B are perspective views of a processing chamber changed in design with effective use of the empty regions, FIG. 21A showing a view before making a design change while FIG. 21B showing a view after making the design change.
Figure 21B:
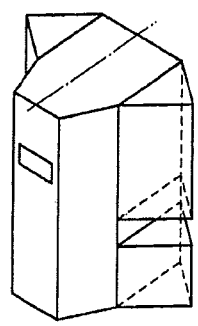

As shown in FIG. 20, in the present embodiment, not only a footprint is reduced but also there exist empty areas which correspond to shadowed areas around the first and second processing chambers 23-1, 23-2, 24-1 and 24-2. These empty areas can be used to secure checking spaces around the first and second processing chambers 23-1, 23-2, 24-1 and 24-2. In addition, these empty areas can be used to change the first and second processing chambers 23-1, 23-2, 24-1 and 24-2 from the shape shown in FIG. 21A to the shape shown in FIG. 21B and increase a degree of freedom in design of the first and second processing chambers 23-1, 23-2, 24-1 and 24-2.

Figure 22:
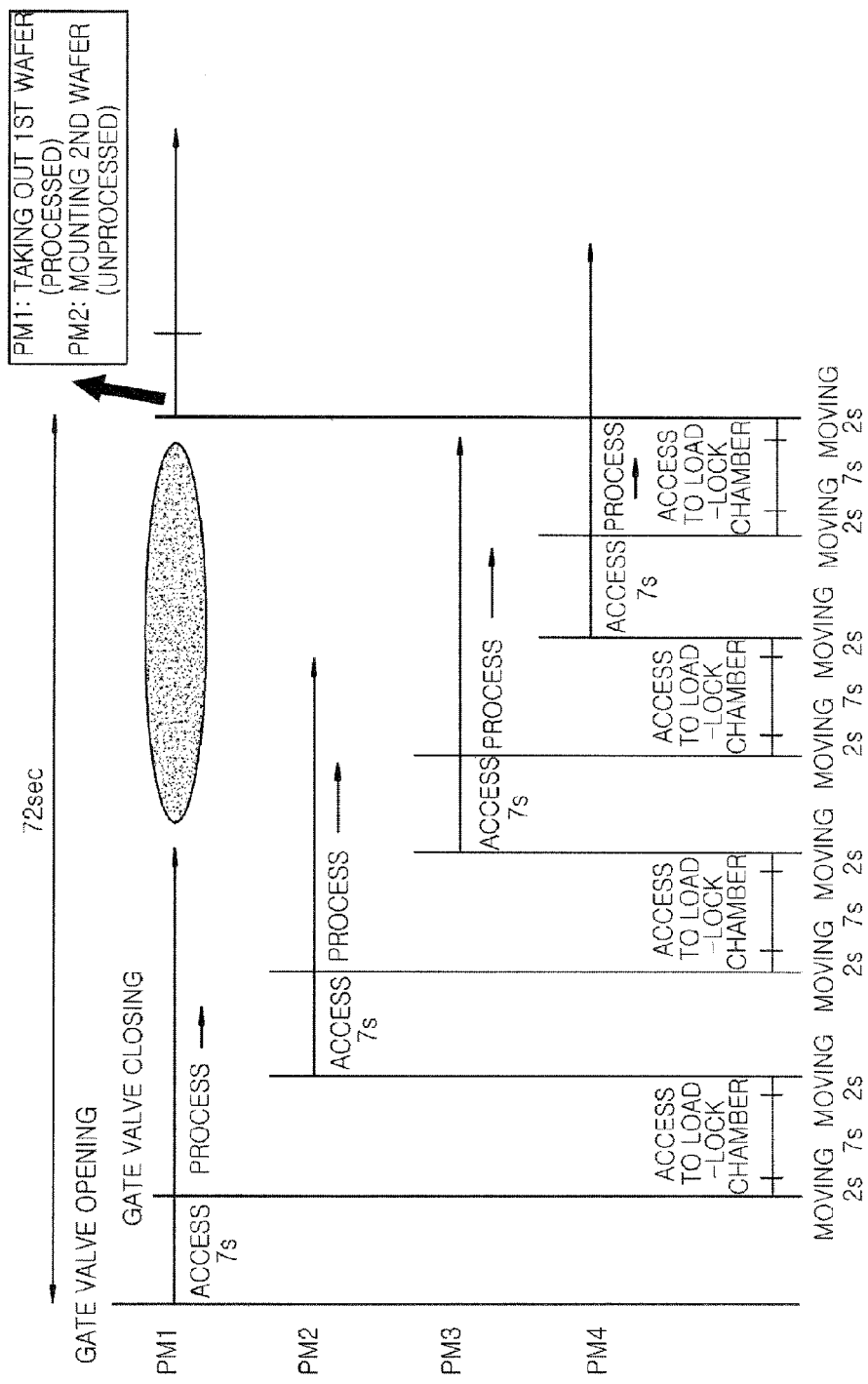
FIG. 22 is a time chart for explaining a throughput of a conventional cluster type substrate processing system.
Figure 23:
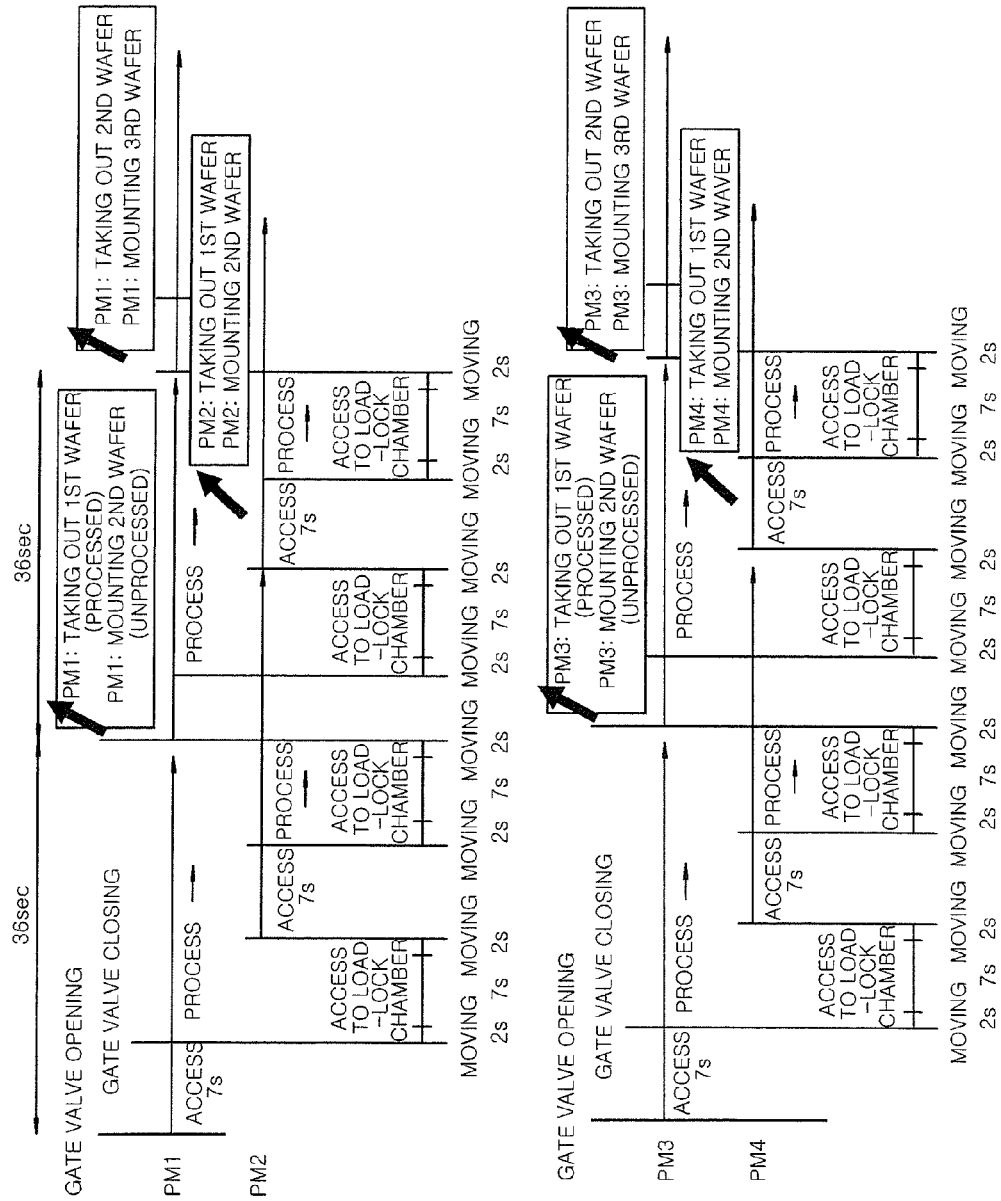
FIG. 23 shows a time chart for explaining a throughput of the substrate processing system in accordance with the first embodiment.

FIGS. 22 and 23 are time charts for comparison in throughput between a conventional cluster type substrate processing system and the substrate processing system in accordance with the first embodiment of the present invention. FIG. 22 is the time chart of the conventional cluster type substrate processing system. As shown in FIG. 22, it is assumed that four processing chambers are connected to a central transfer chamber. It is also assumed that it takes 7 seconds for the vacuum transfer robot of the transfer chamber to extend/contract an arm and transfer/receive a substrate W and takes 2 seconds to rotate the arm to move to a next position. Description on opening/closing of gate valves is omitted since it is performed in a shorter time.

A throughput from where a vacuum transfer robot of transfer chamber transfers an unprocessed substrate W to a processing chamber PM1 (hereinafter, simply referred to as "PM1") is considered. First, it takes 7 seconds for the vacuum transfer robot to access PM1, pass the substrate W to PM1 and return to its original position. PM1 received the substrate W begins a process. Next, the vacuum transfer robot begins to transfer an unprocessed substrate W to a processing chamber PM2. In order to receive the unprocessed substrate W, the vacuum transfer robot is rotated toward a load-lock chamber (for 2 seconds), accesses the load-lock chamber to receive the substrate W (for 7 seconds) and is rotated toward PM2 (for 2 seconds). Then, the vacuum transfer robot accesses PM2 and passes the unprocessed substrate W to PM2 (for 7 seconds). PM2 received the unprocessed substrate W begins a process.

Similarly, the vacuum transfer robot transfers the unprocessed substrate W to processing chambers PM3 and PM4. Once the unprocessed substrate W is transferred to PM4, the vacuum transfer robot directs toward the load-lock chamber (for 2 seconds), accesses the load-lock chamber to receive the unprocessed substrate W from the load-lock chamber (for 7 seconds) and is rotated toward PM1 (for 2 seconds). In this phase, one cycle for which the vacuum transfer robot transfers the unprocessed substrates W to the four processing chambers is ended. A thick arrow indicates a timing at which one cycle is ended. In this example, it takes 72 seconds to end one cycle. Thereafter, the vacuum transfer robot accesses PM1 to receive the processed substrate W from PM1 and passes an unprocessed substrate W to PM1.

An elliptical portion indicates a standby time of PM1. If a processing time of PM1 is less than 65 seconds, PM1 needs to wait until it receives a new substrate W from the vacuum transfer robot although the process has been ended. The shorter the processing time of PM1 is, the longer the standby time is.

FIG. 23 is a time chart of the substrate processing system in accordance with the first embodiment of the present invention. The substrate processing system in accordance with the first embodiment of the present invention includes two vacuum transfer robots, each of which is responsible for two processing chambers. For calculation of a throughput, the gate opening/closing time, the extension/contraction time of arms of the vacuum transfer robots and the rotation time of the arms match with conventional substrate processing systems.

First, it takes 7 seconds for the first vacuum transfer robot to access PM1 and transfer a substrate W to PM1. PM1 which received the substrate W begins a process. Next, in order to transfer an unprocessed substrate W to PM2, the first vacuum transfer robot is rotated toward a load-lock chamber (for 2 seconds), accesses the load-lock chamber to receive the substrate W (for 7 seconds) and is rotated toward PM2 (for 2 seconds). Then, the vacuum transfer robot accesses PM2 and passes the unprocessed substrate W to PM2 (for 7 seconds). Once the unprocessed substrate W is passed to PM2, the vacuum transfer robot directs toward the load-lock chamber (for 2 seconds), accesses the load-lock chamber to receive the unprocessed substrate W from the load-lock chamber (for 7 seconds) and is rotated toward PM1 (for 2 seconds). Thus, one cycle is ended since the first vacuum transfer robot is only responsible for two processing chambers. Since one cycle is 36 seconds, there occurs no standby time in PM1 in a process whose process time exceeds 29 seconds. However, in a shorter process whose process time is less than 29 seconds, a throughput becomes two times as large as the conventional cluster type substrate processing system shown in FIG. 22.

Similarly, when the second vacuum transfer robot accesses PM3 and PM4, one cycle is 36 seconds and a throughput is doubled in a shorter process whose process time is less than 29 seconds. Since two vacuum transfer robots are provided, a throughput can be quadrupled in total in the shorter process.

(Embodiment 2)

Figure 24:
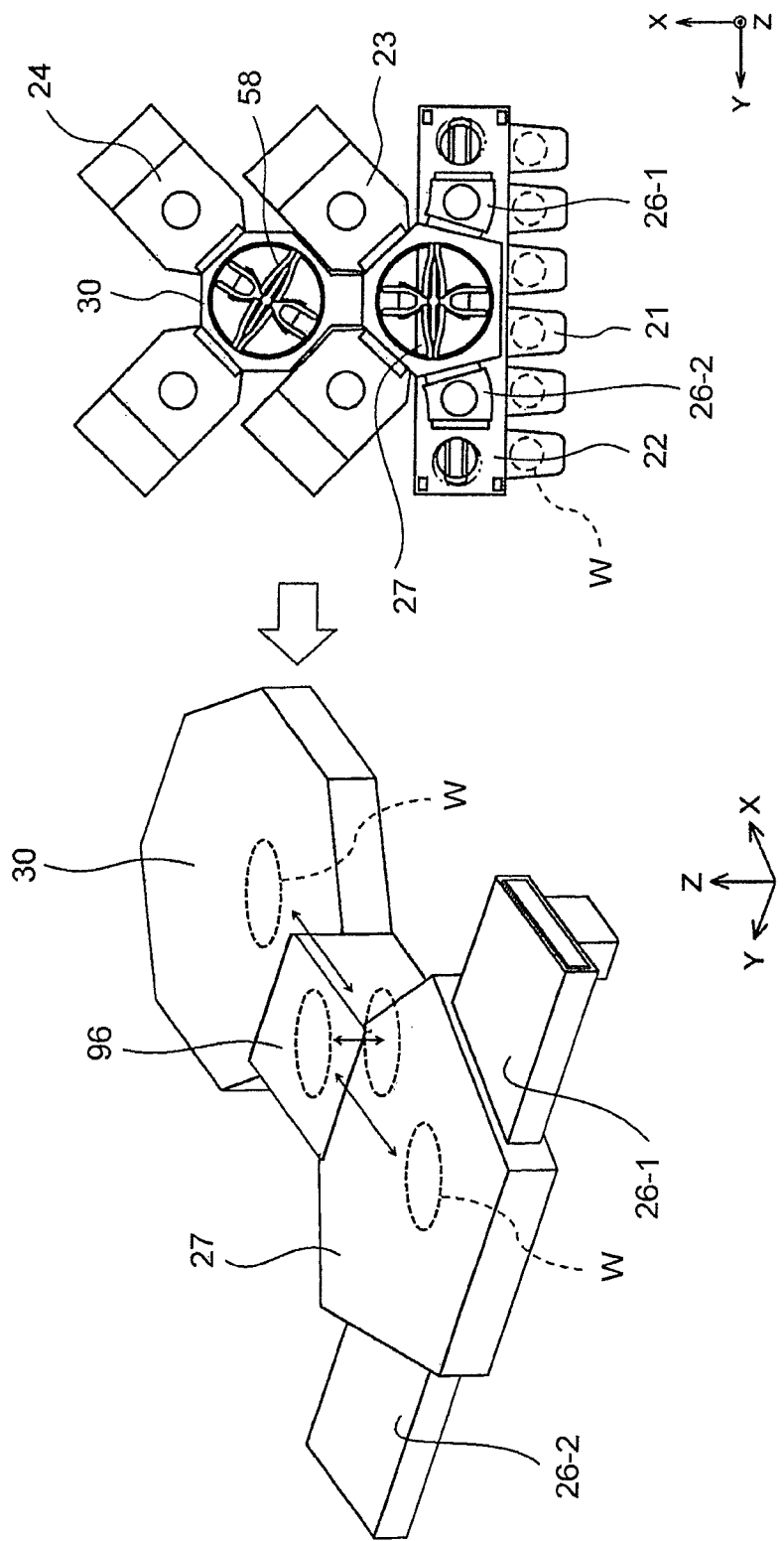
FIG. 24 is a plan view of a substrate processing system in accordance with a second embodiment of the invention.

FIG. 24 shows a substrate processing system in accordance with a second embodiment of the present invention. In this embodiment, the second transfer chamber 30 is connected to the first transfer chamber 27 via a connection chamber 96, instead of being connected to the loader module 22 via the second load-lock chambers 29-1 and 29-2. Since the first transfer chamber 27 and the second transfer chamber 30 have different heights, the connection chamber 96 is provided with an elevation mechanism (an elevator) for elevating a substrate W.

The loader module 22, the first load-lock chambers 26-1 and 26-2, the first transfer chamber 27, the first processing chambers 23-1 and 23-2 and the second processing chambers 24-1 and 24-2 have the same configurations as those in the substrate processing system in accordance with the first embodiment and therefore, explanation thereof will be omitted while using the same reference numerals.

Since the first transfer chamber 27 and the second transfer chamber 30 are interconnected via the connection chamber 96, the substrate processing system in accordance with the second embodiment provides a foot print smaller than those of conventional planar-arranged multi chamber type substrate processing systems. In addition, the substrate can be moved between the first processing chambers 23-1 and 23-2 and the second processing chambers 24-1 and 24-2 (i.e., continuously processed in vacuum). In addition, the connection chamber 96 may be provided to be connected to the second load-lock chamber, in which case a degree of freedom of transfer can be improved. A gate valve may be provided between the connection chamber 96 and the first transfer chamber 27, the second transfer chamber 30 or the second load-lock chamber. In this case, it is insured that the chambers are independent to improve a degree of freedom of maintenance.

In the second embodiment, for example, for contact formation in a FEOL process of a semiconductor device, the first processing chamber 23-1 is used as a plasma CVD device for forming a Ti film, the first processing chamber 23-2 is used as a thermal CVD device for forming a TiN film, and the second processing chambers 24-1 and 24-2 connected to the second transfer chamber 30 connected to the first transfer chamber 27 via the connection chamber 96 are used as a thermal CVD device for forming, e.g., a W plug. These devices are used to form a contact plug in a hole formed on a source/drain region. A wafer formed with a contact hole is first transferred into the first processing chamber 23-1 and is formed with a Ti layer to cover the hole by a plasma CVD (Chemical Vapor Deposition).

Next, the wafer is transferred from the first processing chamber 23-1 into the first processing chamber 23-2 and is formed with a TiN layer on the Ti layer by a thermal CVD. Thereafter, the wafer is transferred into the second transfer chamber 30 via the connection chamber 96, is loaded into the second processing chamber 24-1 or 24-2 and is formed with a W plug by using a thermal CVD device.

Such a series of processes can be successively performed under vacuum environments via the connection chamber 96. The Ti/TiN film forming process and the W plug forming process may be independently performed in parallel without passing through the connection chamber 96. A vacuum continuous processing method of moving a wafer between processing chambers via transfer units and the connection chamber 96 and a processing method of performing individual processes in parallel may be appropriately selected in accordance with contents of the processes by a software of the substrate transfer processing system.

Examples of substrate processing systems including the first and second processing chambers and the additional third processing chambers have been illustrated in the first and second embodiments of the present invention. However, the present invention is not limited to the substrate processing system including the first and second processing chambers or first to third processing chambers but may be implemented with a transfer module for transferring a substrate W into the corresponding processing chambers. An embodiment of the transfer module is derived by separating the first and second processing chambers or the first to third processing chambers from the embodiments of the substrate processing system.

Figure 25:
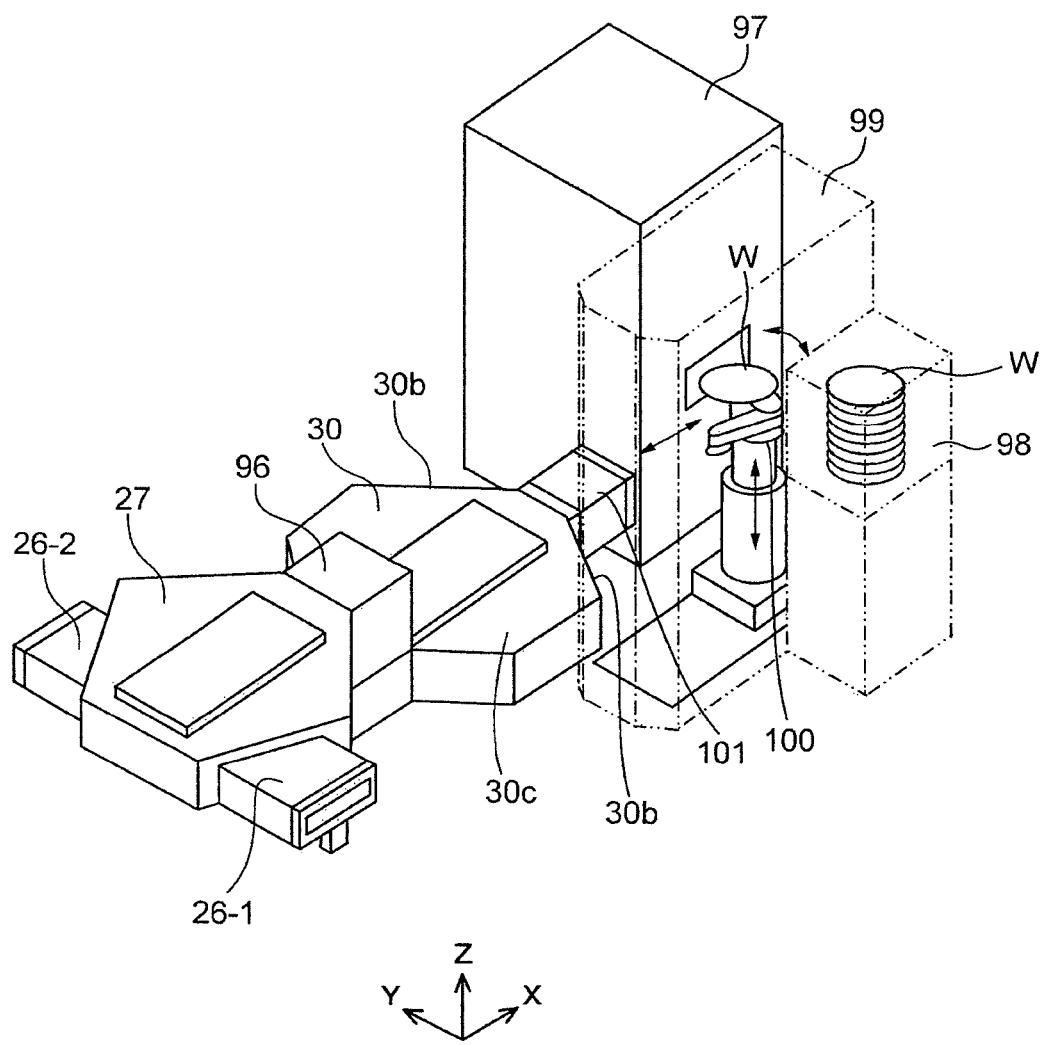
FIG. 25 is a perspective view showing an example of addition of an inspection device and a storage to the substrate processing system in accordance with the second embodiment of the invention.

FIG. 25 shows an example of adding an inspection device 97 and a dummy storage 98, as options, to the substrate processing system of the second embodiment. As shown in FIG. 4, a space is defined in a portion corresponding to the side 30c between two sides 30b of the second transfer chamber 30 (sides inclined with respect to the longitudinal direction (Y direction) of the loader module 22 at the opposite side to the loader module 22) to which the two second processing chambers 24-1 and 24-2 are connected. This space is used to connect an atmospheric transfer chamber 99 to the side 30c of the second transfer chamber 30 via a load-lock chamber 101. The atmospheric transfer chamber 99 is provided with an atmospheric transfer robot 100 which receives a substrate W from the load-lock chamber 101 and transfers it to the inspection device 97 or the dummy storage 98. Instead of the atmospheric transfer robot 100, a vacuum transfer robot may be used to transfer the substrate to the inspection device 97 under vacuum or take the substrate out of the dummy storage 98 under vacuum.

In a conventional substrate processing system, the inspection device 97 is connected to the loader module 22. Like this example, by connecting the inspection device 97 to the second transfer chamber 30, inline checking, i.e., checking the substrate W immediately after a process is completed in the second processing chambers 24-1 and 24-2, may be performed and the inspected substrate W may be returned to the second processing chambers 24-1 and 24-2 to be processed again.

The inspection device 97 and the dummy storage 98 may be connected to the second transfer chamber 30 of the substrate processing system in accordance with the first embodiment. In addition, the inspection device 97 and the dummy storage 98 may be connected to each of the first transfer chamber 27 and the second transfer chamber 30 of the substrate processing system in accordance with the first embodiment. In addition, a port for mounting a cassette for receiving processed substrates may be provided at a side surface of the atmospheric transfer chamber 99. In this case, an inline type transfer processing system having different inlet and outlet of the processed substrate W may be constructed and the transfer route of the substrate W and the device layout may be configured in a variety of ways.

(Embodiment 3)

Figure 26:
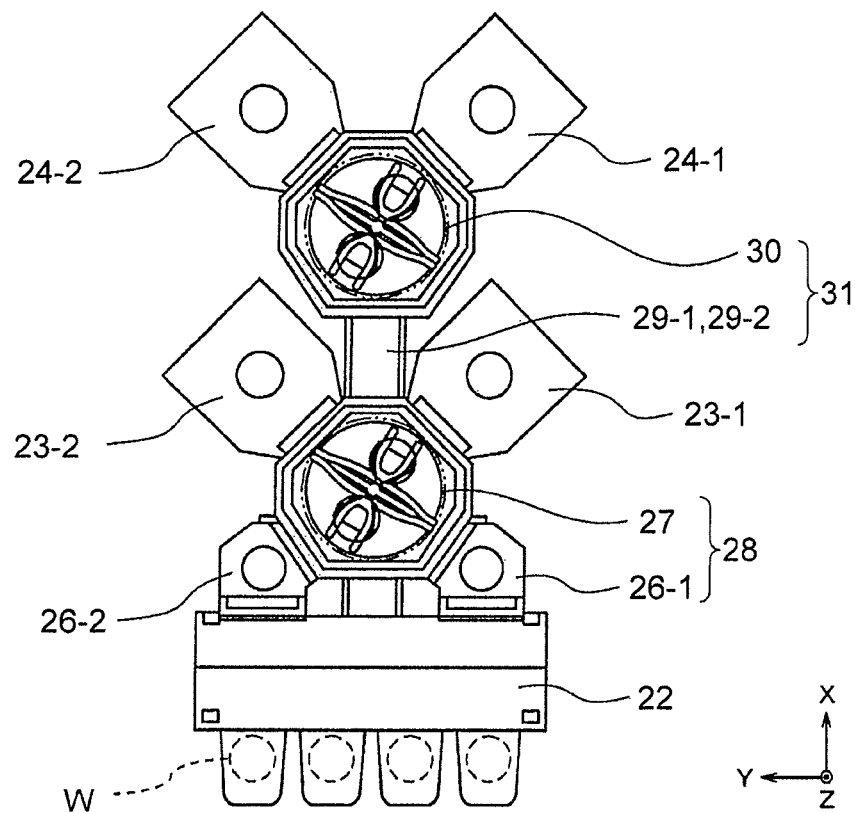
FIG. 26 is a plan view of a substrate processing system in accordance with a third embodiment of the invention.

FIG. 26 is a plan view of a substrate processing system in accordance with a third embodiment of the invention. A substrate processing system of the present embodiment is different from the substrate processing system of the first embodiment in that the first load-lock chambers 26-1 and 26-2 and the first transfer chamber 27 of the first transfer unit 28 are not vertically overlapped with the loader module 22. The basic configurations of the first and second transfer units 28 and 31, e.g., the first transfer unit 28 including the first load-lock chambers 26-1 and 26-2 and the first transfer chamber 27, the second transfer unit 31 including the second load-lock chambers 29-1 and 29-2 and the second transfer chamber 30, and a portion of the first transfer unit 28 making vertical overlap with a portion of the second transfer unit 31, are the same as those in the substrate processing system of the first embodiment and therefore, explanation thereof will be omitted while using the same reference numerals.

In the present embodiment, since the first load-lock chambers 26-1 and 26-2 and the first transfer chamber 27 are not vertically overlapped with the loader module 22, the first transfer chamber 27 is disposed at a position separated from the loader module 22. The second transfer chamber 30 is also disposed at a position separated from the loader module 22. Accordingly, each of the second load-lock chambers 29-1 and 29-2 of the second transfer unit 31 is provided with a stage for moving a substrate W in one direction, like the third load-lock chamber 81 shown in FIG. 16.

The substrate processing system in accordance with the third embodiment can improve a throughput, similarly to the substrate processing system of the first embodiment, although it provides substantially the same footprint as conventional cluster type substrate processing systems. The substrate processing system in accordance with the third embodiment can obtain a throughput which is four times as large as that of the conventional cluster type substrate processing systems.

(Embodiment 4)

Figure 27:
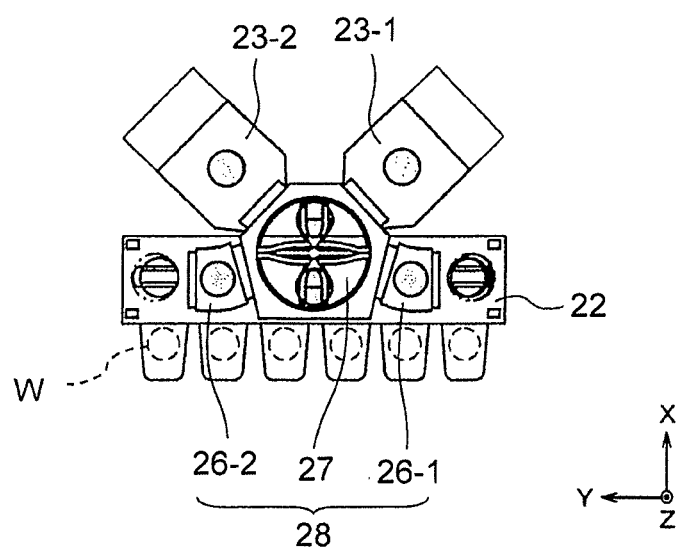
FIG. 27 is a plan view of a substrate processing system in accordance with a fourth embodiment of the invention. the invention.

FIG. 27 shows a substrate processing system in accordance with a fourth embodiment of the present invention. A substrate processing system of the present embodiment is different from the substrate processing system of the first embodiment in that the former includes only the upper transfer unit 28 (see FIG. 5B) of the substrate processing system of the first embodiment without including the lower transfer unit 31 (see FIG. 5C). A transfer unit 28 of the present embodiment has the same configuration as that of the upper transfer unit 28 of the substrate processing system of the first embodiment. That is, the transfer unit 28 includes the load-lock chambers 26-1 and 26-2 and the transfer chamber 27. At least portions of the load-lock chambers 26-1 and 26-2 and at least a portion of the transfer chamber 27 are vertically overlapped with the loader module 22.

The substrate processing system in accordance with the fourth embodiment results in a decreased footprint so much as at least the portions of the load-lock chambers 26-1 and 26-2 and the portion of the transfer chamber 27 can do, although it provides the same throughput as conventional cluster type substrate processing systems.

Figure 28:
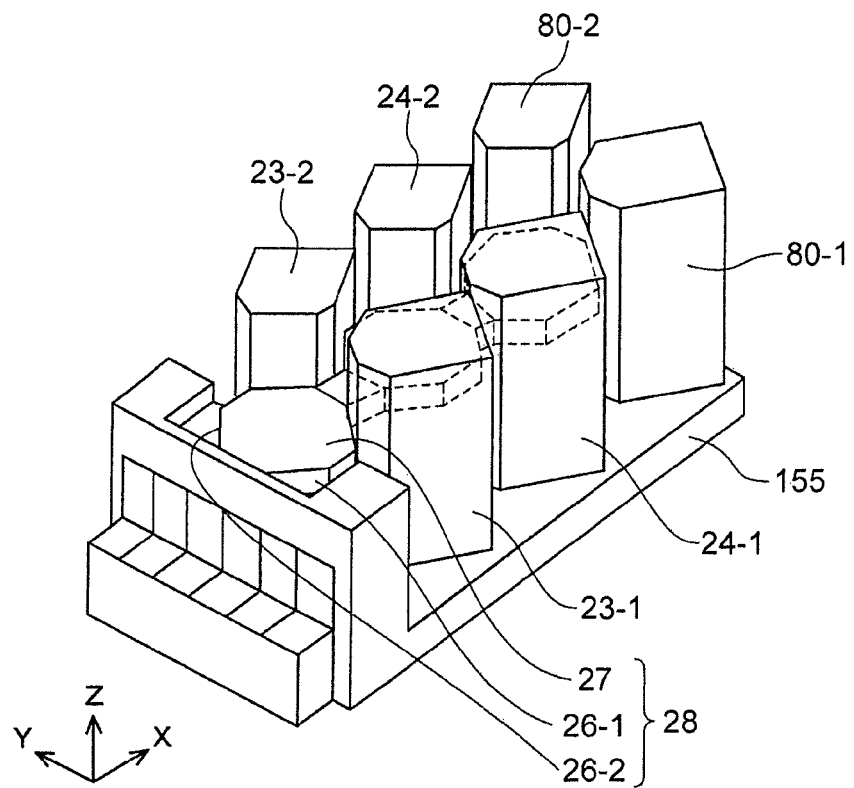
FIG. 28 is a perspective view showing the substrate processing system in accordance with a modification of the fourth embodiment of the invention.
Figure 29:
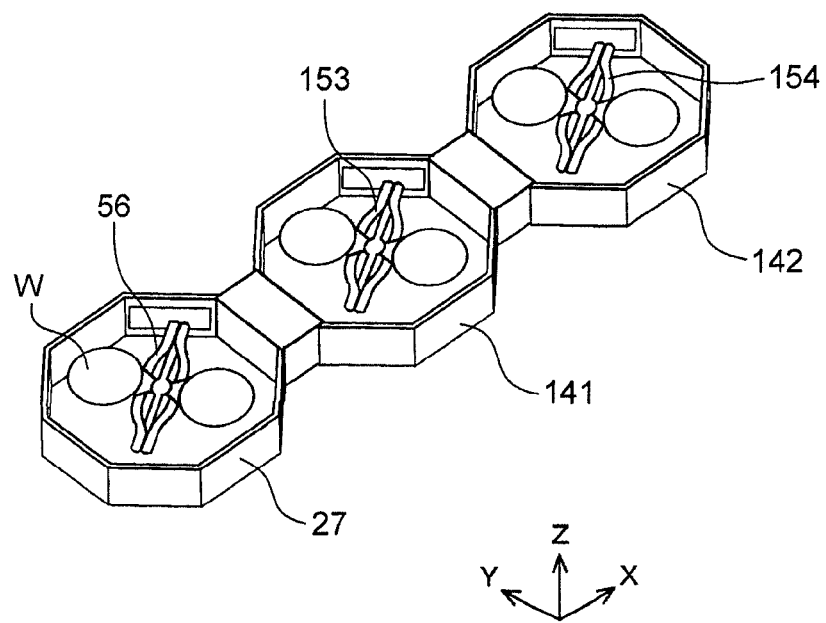
FIG. 29 is a perspective view showing connection of transfer chambers of the substrate processing system in accordance with the modification of the fourth embodiment of the invention.

FIGS. 28 and 29 show a modification of the substrate processing system in accordance with the fourth embodiment. In this modification, at least portions of the load-lock chambers 26-1 and 26-2 and a portion of the transfer chamber 27 are vertically overlapped with the loader module 22, as the substrate processing system in accordance with the fourth embodiment. Two connection chambers 141 and 142 are connected in series to the transfer chamber 27. The connection chambers 141 and 142 are provided with respective vacuum transfer robots 153 and 154. At least one transfer chamber, e.g., two processing chambers 24-1 and 24-2 or two processing chambers 80-1 and 80-2, is connected to each of the connection chambers 141 and 142. The two processing chambers 24-1 and 24-2 or 80-1 and 80-2 connected to each of connection chambers 141 and 142 are laid out to have a V shape, as the substrate processing system in accordance with the first embodiment shown in FIG. 5A. That is, the two processing chambers 24-1 and 24-2 are formed into the V shape by lines connecting the centers of respective processing chambers 24-1 and 24-2 to the center of the connection chamber 141 and a substrate W is loaded into or unloaded from the processing chambers 24-1 and 24-2 along this V line. In addition, the two processing chambers 80-1 and 80-2 are formed into the V shape by lines connecting the centers of respective processing chambers 80-1 and 80-2 with the center of the connection chamber 142 and a substrate W is loaded into or unloaded from the processing chambers 80-1 and 80-2 along this V line.

When a substrate W is transferred into the processing chamber 23-1 or 23-2, the substrate is transferred via the transfer chamber 27. When a substrate W is transferred into the processing chamber 24-1 or 24-2, the substrate W is transferred via the transfer chamber 27 and the connection chamber 141. When a substrate W is transferred into the processing chamber 80-1 or 80-2, the substrate W is transferred via the transfer chamber 27, the connection chamber 141 and the connection chamber 142.

A substrate exchange mechanism (not shown) and a lifter for supporting the substrate W are provided at a connection portion between the first transfer chamber 27 and the connection chamber 141 and at a connection portion between the connection chamber 141 and the connection chamber 142. When the substrate W is transferred from the first transfer chamber 27 into the connection chamber 142, the substrate W is once held on the lifter of the connection portion by the vacuum transfer robot 56 in the first transfer chamber 27.

The substrate W held on the lifter is transferred into the processing chamber 24-1 or 24-2 connected to the connection chamber 141 or onto the lifter in the connection portion connected with the connection chamber 142 via the connection chamber 141 by the vacuum transfer robot 153 within the connection chamber 141. The wafer W on the lifter is also transferred into the processing chamber 80-1 or 80-2 connected to the connection chamber 142 by the vacuum transfer robot 154 via the connection chamber 142. The lifter may be provided with a lifter drive for elevating the substrate W and the substrate exchange mechanism may be a cassette for accommodating a plurality of substrates W. Gate valves may be provided at the connection portions to interpose the chambers.

Since the transfer chamber 27 is connected to the concave portion 25a of the loader module 22, the transfer height of the substrate W is greater than usual. In order to utilize the processing chambers used in other systems, the processing chambers may be mounted on a base 155 without changing in design of the processing chambers.

The substrate processing system in accordance with the fourth embodiment provides a decreased footprint so much as at least the portions of the load-lock chambers 26-1 and 26-2 and the portion of the transfer chamber 27 can do.

(Embodiment 5)

Figure 30:
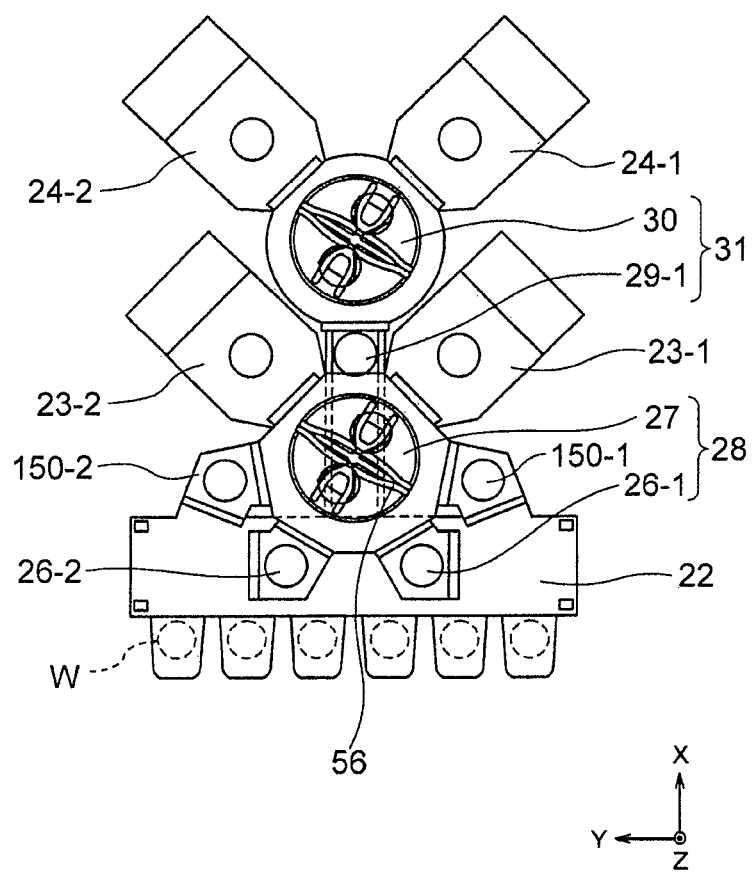
FIG. 30 is a plan view of a substrate processing system in accordance with a fifth embodiment of the invention.

FIG. 30 is a plan view of a substrate processing system in accordance with a fifth embodiment of the present invention. This embodiment also includes the first transfer unit 28 and the second transfer unit 31. At least one of the first processing chambers 23-1 and 23-2 is connected to the first transfer chamber 27 and at least one of the second processing chambers 24-1 and 24-2 is connected to the second transfer chamber 30. The first transfer chamber 27 of the first transfer unit 28 and the second load-lock chamber 29-1 of the second transfer unit 31 are vertically overlapped.

In the present embodiment, the total four first load-lock chambers 26-1, 26-2, 150-1 and 150-2, two on the top of the loader module and two on the side surfaces of the loader module, are provided. The first load-lock chambers 26-1 and 26-2 on the top of the loader module 22 are vertically overlapped with the loader module 22 and the first load-lock chambers 150-1 and 150-2 on the side surfaces of the loader module 22 are not vertically overlapped with the loader module 22. The two first load-lock chambers 150-1 and 150-2 on the side surfaces may have an additional purge storage function, for example. The purge storage is configured to hold a plurality of substrates W and remove residual gas on the substrates.

The substrate processing system in accordance with the fifth embodiment can provide a decreased footprint since the first load-lock chambers 26-1 and 26-2 and the transfer chamber 27 are vertically overlapped with the loader module 22 and the first transfer unit 28 and the second transfer unit 31 make overlap with each other.

In addition, the atmospheric transfer robot of the loader module 22 may transfer substrates into the load-lock chambers 150-1 and 150-2 for each cassette. In addition, the vacuum transfer robot 56 provided in the first transfer chamber 27 may take substrates W out of cassettes within the load-lock chambers 150-1 and 150-2, one by one, and transfer them into the processing chambers 23-1 and 23-2.

(Embodiment 6)

Figure 31:
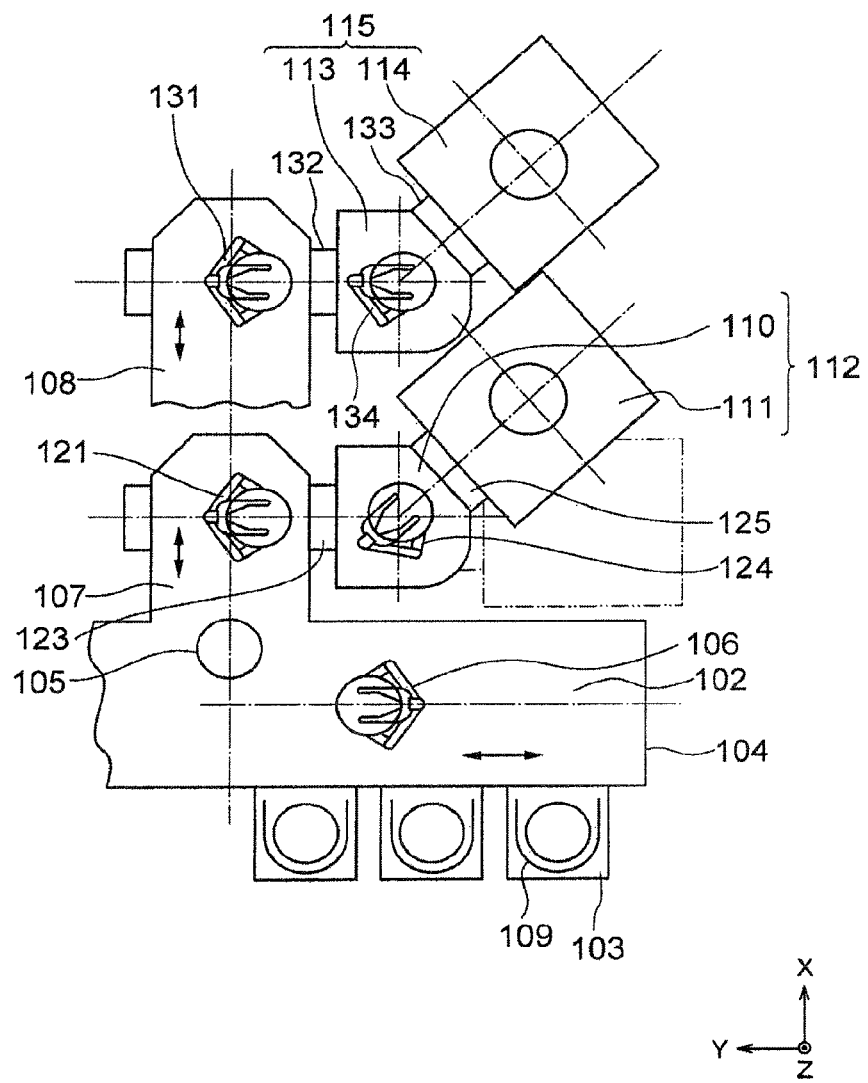
FIG. 31 is a plan view of a substrate processing system in accordance with a sixth embodiment of the invention.
Figure 32:
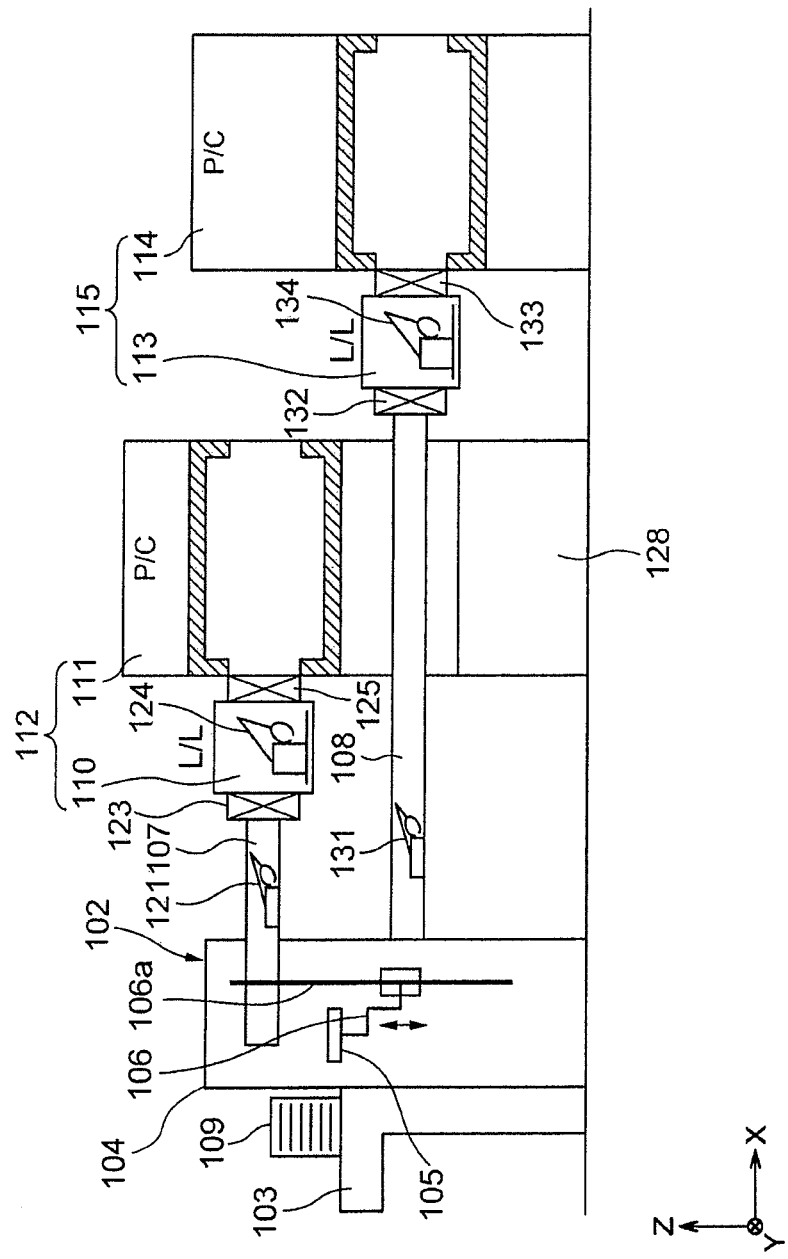
FIG. 32 is a vertical cross sectional view of the substrate processing system in accordance with the sixth embodiment of the invention.

FIGS. 31 and 32 show a substrate processing system in accordance with a sixth embodiment of the invention. FIG. 31 is a plan view of the substrate processing system and FIG. 32 is a vertical sectional view of the substrate processing system. In the substrate processing system in accordance with the present embodiment, two vacuum transfer units are not vertically overlapped but two atmospheric transfer units are vertically overlapped. The loader module 102 is provided with a plurality of ports 103 on which a plurality of cassettes can be arranged in a line.

An atmospheric transfer chamber 104 extends in the arrangement direction (Y direction) of the plurality of ports 103. The atmospheric transfer chamber 104 is provided with an atmospheric transfer robot 106 for taking substrates W out of the cassettes set on the ports 103. The atmospheric transfer robot 106 has a Z axis. Two atmospheric transfer robots 106 are provided at both sides of the atmospheric transfer chamber 104 in the longitudinal direction (Y direction).

A first atmospheric transfer unit 107 extending from the loader module 102 to at least one processing chamber unit, e.g., two first processing chamber units 112, for performing a process is connected to the loader module 102. The first atmospheric transfer unit 107 extends in a direction (X direction) perpendicular to the longitudinal direction (Y direction) of the loader module 102. The first atmospheric transfer unit 107 is provided with a first atmospheric transfer robot 121 for transferring the substrates W, which have been transferred by the atmospheric transfer robot 106 in the loader module 102, into the first processing chamber unit 112. The first atmospheric transfer unit 107 and the loader module 102 have no gate valve therebetween because both transfer the substrate W in an atmosphere. In the center of the loader module 102 in the longitudinal direction (Y direction), an orienter 105 is provided and recognizes notches and the like of substrate W to perform alignment (positioning) of the substrate W.

The first processing chamber unit 112 is connected to the first atmospheric transfer unit 107. The first processing chamber unit 112 includes a first load-lock chamber 110 into which the substrates W are transferred by the first atmospheric transfer robot 121 and a first processing chamber 111 for processing the substrate W. The first load-lock chamber 110 is formed in a small room where vacuum exhaustion and atmospheric pressure restoration are alternately performed. The first load-lock chamber 110 and the first atmospheric transfer unit 107 are interconnected via a gate valve 123. The first load-lock chamber 110 is provided with a first vacuum transfer robot 124.

The first processing chamber 111 is connected to the first load-lock chamber 110 via a gate valve 125. The first processing chamber 111 is configured to perform at least one process or a set of processes selected from a group consisting of film forming, etching, asking, oxidation, nitriding, doping, diffusion and the like. A line connecting the center of the first load-lock chamber 110 and the center of the first processing chamber 111 intersects at an acute angle with the longitudinal direction (Y direction) of the loader module 102. The two first processing chamber units 112 are connected to the first atmospheric transfer unit 107 such that they make a V shape. Substrates are loaded into or unloaded from the first processing chambers 111 along the V line.

Operations of the first atmospheric transfer robot 121 and the first vacuum transfer robot 124 are as follows. The atmospheric transfer robot 106 of the loader module 102 takes an unprocessed substrate out of a cassette 109 on a port 103 and loads it on an orienter 105. The substrate aligned in the orienter 105 is transferred to a first substrate exchange mechanism (not shown), which is provided in the first atmospheric transfer unit 107 near the loader module 102, by the atmospheric transfer robot 106. The first atmospheric transfer robot 121 receives the substrate from the first substrate exchange mechanism and transfers it into the first load-lock chamber 110. Thereafter, the gate valve 123 of the first atmospheric transfer unit 107 side of the first load-lock chamber 110 is closed so that the first load-lock chamber 110 can be vacuum-exhausted. When the first load-lock chamber 110 is in a vacuum state, the gate valve 125 of the first processing chamber 111 side is opened so that the first load-lock chamber 110 can communicate with the first transfer chamber 111. The first vacuum transfer robot 124 takes the unprocessed substrate out of the first load-lock chamber 110 and loads it into the first processing chamber 111.

When a predetermined process is completed in the first processing chamber 111, the first vacuum transfer robot 124 takes the processed substrate W out of the first processing chamber 111 and loads it into the first load-lock chamber 110. Thereafter, the gate valve 125 of the first processing chamber 111 side can be closed so that the first load-lock chamber 110 can be restored to the atmospheric pressure and then, the gate valve 123 of the first atmospheric transfer unit 107 side can be opened. The first atmospheric transfer robot 121 takes the processed substrate out of the first load-lock chamber 110 and transfers it to the atmospheric transfer robot 106 via the first substrate exchange mechanism. The atmospheric transfer robot 106 returns the processed substrate W to the cassette 109 on the port 103.

A second atmospheric transfer unit 108 extending from the loader module 102 to at least one processing chamber unit, e.g., two second processing chamber units 115, for performing a process is provided below the first atmospheric transfer unit 107. The second atmospheric transfer unit 108 is connected to the loader module 102 and extends in a direction (X direction) perpendicular to the longitudinal direction (Y direction) of the loader module 102. The first atmospheric transfer unit 107 and the second atmospheric transfer unit 108 make partially vertical overlap. The length of the second atmospheric transfer unit 108 is longer than that of the first atmospheric transfer unit 107. The second atmospheric transfer unit 108 is provided with a second atmospheric transfer robot 131 for transferring the substrate W, which has been received from the atmospheric transfer robot 106, into the second processing chamber unit 115 and transferring the substrate W unloaded from the second processing chamber unit 115 to the atmospheric transfer robot 106. The second atmospheric transfer unit 108 and the loader module 102 have no gate valve at their connection portion because both transfer the substrates W in an atmosphere.

The second processing chamber unit 115 is connected to the second atmospheric transfer unit 108. The second processing chamber unit 115 includes a second load-lock chamber 113 into which the substrate is transferred by the second atmospheric transfer robot 131, and a second processing chamber 114 for processing the substrate W. The second load-lock chamber 113 is formed in a small room where vacuum exhaustion and atmospheric pressure restoration are alternately performed. The second load-lock chamber 113 and the second atmospheric transfer unit 108 are interconnected via a gate valve 132. The second load-lock chamber 113 is provided with a second vacuum transfer robot 134.

The second processing chamber 114 is connected to the second load-lock chamber 113 via a gate valve 133. The second processing chamber 114 is configured to perform at least one process or a set of processes selected from a group consisting of film forming, etching, ashing, oxidation, nitriding, doping, diffusion and the like. A line connecting the center of the second load-lock chamber 113 and the center of the second processing chamber 114 intersects at an acute angle with the longitudinal direction (Y direction) of the loader module 102. The two second processing chamber units 115 are connected to the second atmospheric transfer unit 108 such that they make a V shape. Substrates are loaded into or unloaded from the second processing chambers 114 along the V line.

The first processing chamber unit 112 and the second processing chamber unit 115 are not vertically overlapped and are arranged at positions separated from each other in a plan view. As shown in FIG. 32, the first processing chamber 111 is placed at a position higher than the second processing chamber 114 and is installed on a base 128.

Operations of the second atmospheric transfer robot 131 and the second vacuum transfer robot 134 are as follows. When the atmospheric transfer robot 106 transfers an unprocessed substrate W to a second substrate exchange mechanism (not shown) provided in the second atmospheric transfer unit 108, the second atmospheric transfer robot 131 receives the substrate W and transfers it into the second load-lock chamber 113. Thereafter, the gate valve 132 of the second atmospheric transfer unit 108 side of the second load-lock chamber 113 is closed so that the second load-lock chamber 113 can be vacuum-exhausted. When the second load-lock chamber 113 is in a vacuum state, the gate valve 133 of the second processing chamber 114 side is opened so that the second load-lock chamber 113 can communicate with the second processing chamber 114. The second vacuum transfer robot 134 takes the substrate W out of the second load-lock chamber 113 and transfers it into the second processing chamber 114.

When a predetermined process is completed in the second processing chamber 114, the second vacuum transfer robot 134 takes the processed substrate W out of the second processing chamber 114 and loads it into the second load-lock chamber 113. Thereafter, the gate valve 133 of the second processing chamber 114 side is closed so that the second load-lock chamber 113 can be restored to the atmospheric pressure and then, the gate valve 132 of the second atmospheric transfer unit 108 side can be opened. The second atmospheric transfer robot 131 takes the processed substrate W out of the second load-lock chamber 113 and transfers it to the atmospheric transfer robot 106 via the second substrate exchange mechanism. The atmospheric transfer robot 106 returns the processed substrate W to the cassette 109 on the port 103.

Since the first atmospheric transfer unit 107 and the second atmospheric transfer unit 108 have a layered structure, the substrate processing system in accordance with the sixth embodiment provides a foot print smaller than those of conventional planar-arranged multi chamber type substrate processing systems. In addition, a throughput (number of substrates processed per unit time) can be improved by providing a plurality of atmospheric transfer units 107 and 108 connected to the loader module.

Embodiment 7

Figure 33:
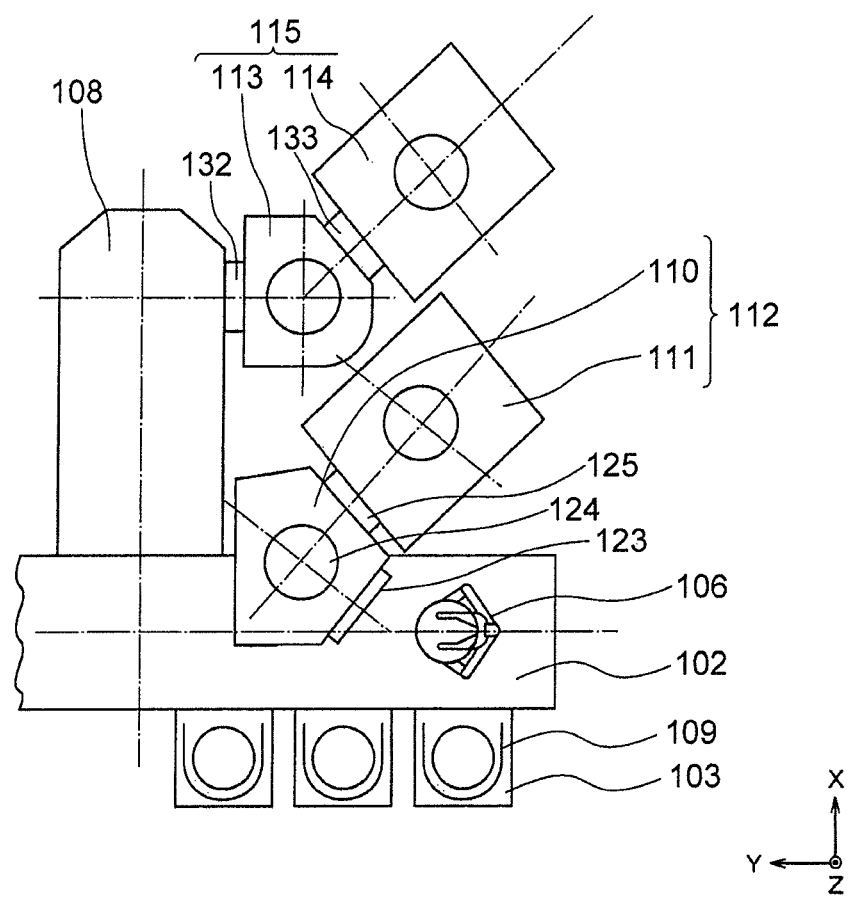
FIG. 33 is a plan view of a substrate processing system in accordance with a seventh embodiment of the invention.

FIG. 33 shows a substrate processing system in accordance with a seventh embodiment of the invention. In the present embodiment, the first load-lock chamber 110 of the first processing chamber unit 112 makes partial overlap with the loader module 102. The first load-lock chamber 110 and the first processing chamber unit 112 have substantially the same structures as those in the substrate processing system of the sixth embodiment and therefore, explanation thereof will omitted while using the same reference numerals.

The atmospheric transfer robot 106 transfers a substrate W into the first load-lock chamber 110 directly. Thereafter, the gate valve 123 of the loader module 102 side of the first load-lock chamber 110 is closed so that the first load-lock chamber 110 can be vacuum-exhausted. When the first load-lock chamber 110 is in a vacuum state, the gate valve 125 of the first processing chamber 111 side is opened so that the first load-lock chamber 110 can communicate with the first processing chamber 111. The first vacuum transfer robot 124 within the first load-lock chamber 110 takes the unprocessed substrate W out of the first load-lock chamber 110 and transfers it into the first processing chamber 111.

The loader module 102 is connected with the second atmospheric transfer unit 108 extending to the second processing chamber unit 115 for performing a process. The second processing chamber unit 115 is connected to the second atmospheric transfer unit 108. The second processing chamber unit 115 includes the second load-lock chamber 113 and the second processing chamber 114. The second atmospheric transfer unit 108, the second load-lock chamber 113 and the second processing chamber 114 have the same configuration as those of the sixth embodiment and therefore, explanation thereof will be omitted while using the same reference numerals.

In accordance with the seventh embodiment, since the first load-lock chamber 110 of the first processing chamber unit 112 makes partial vertical overlap with the loader module 102, the first processing chamber 111 can be disposed in proximity to the loader module 102 and accordingly the second processing chamber 114 can be also disposed in proximity to the loader module 102. Accordingly, the seventh embodiment can provide a footprint smaller than that of the sixth embodiment.

The present invention is not limited to the above-described embodiments but may be implemented in other various ways without departing from the scope of the invention. For example, the substrate processing system is not limited to semiconductor device manufacturing apparatuses but may be applied to other apparatuses for manufacturing a FPD (Flat Panel Display), an organic EL (Electro Luminescence), a solar cell and the like.

Although it has been illustrated in the above embodiments that the whole of the first load-lock chamber and a portion of the first transfer chamber are vertically overlapped with the loader module, at least a portion of the first load-lock chamber and/or at least a portion of the second transfer chamber may are vertically overlapped with the loader module.

Although it has been illustrated in the above embodiments that the loader module is disposed on a floor, it may be disposed near a ceiling. In this case, a space below the loader module may be used as a space where processing chambers are disposed. In addition, the loader module may be installed on an upper floor of a factory, while the first and second transfer units and the first and second processing chambers may be installed in a lower floor of the factory.

The number of connected processing chambers is not particularly limited and the arbitrary number of processing chambers may be connected to the loader module.

DESCRIPTION OF REFERENCE NUMERALS

21-1 to 21-6 port
22 loader chamber
23-1, 23-2 first processing chamber
24-1, 24-2 second processing chamber
25 atmospheric transfer chamber
26-1, 26-2 first load-lock chamber
27 first transfer chamber
28 first transfer unit
29-1, 29-2 second load-lock chamber
30 second transfer chamber
31 second transfer unit
42 base
56 first vacuum transfer unit
58 second vacuum transfer unit
60-1, 60-2 atmospheric transfer robot
61 orienter
78 cassette
80-1, 80-2 third processing chamber
81 third load-lock chamber
82 third transfer chamber
83 third transfer unit
84 third vacuum transfer robot
95 dummy storage
96 connection chamber
97 inspection device
98 dummy storage

What is claimed is:
1. A substrate processing system comprising:
a loader module which is provided with a plurality of ports configured to receive a plurality of cassettes accommodating therein first substrates and second substrates, and an atmospheric transfer robot;
a first transfer unit configured to transfer the first substrates between the loader module and at least one first processing chamber for processing the first substrates; and
a second transfer unit which is provided at a height different from that of the first transfer unit and is configured to transfer the second substrates between the loader module and at least one second processing chamber for processing the second substrates,
wherein the first transfer unit includes a first load-lock chamber, into which the first substrates are transferred by the atmospheric transfer robot, and a first transfer chamber provided with a first vacuum transfer robot for transferring the first substrates, which have been loaded into the first load-lock chamber, into said at least one first processing chamber,
wherein the second transfer unit includes a second load-lock chamber, into which the second substrates are transferred by the atmospheric transfer robot, and a second transfer chamber provided with a second vacuum transfer robot for transferring the second substrates, which have been loaded into the second load-lock chamber, into said at least one second processing chamber, and
wherein said at least one first processing chamber and said at least one second processing chamber are not vertically overlapped and at least a portion of the first transfer unit and at least a portion of the second transfer unit are vertically overlapped,
wherein at least a portion of the first load-lock chamber and a portion of the first transfer chamber are vertically overlapped with the loader module, and
wherein, when the portion of the first transfer chamber is placed on the loader module, a support member supporting the first transfer chamber is provided to prevent a weight of the first transfer chamber from being applied to the loader module.

2. The substrate processing system of claim 1, wherein the first transfer chamber of the first transfer unit and the second load-lock chamber of the second transfer unit are vertically overlapped.

3. The substrate processing system of claim 1, wherein the ports are arranged in a line in a plan view, and the loader module includes an atmospheric transfer chamber which is elongated in an arrangement direction of the ports and which is provided with the atmospheric transfer robot,
- an extension of a line connecting the center of each of said at least one first processing chamber to the center of the first transfer chamber intersects with the arrangement direction of the ports at an acute angle in a plan view, and
- an extension of a line connecting the center of each of said at least one second processing chamber to the center of the second transfer chamber intersects with the arrangement direction of the ports at an acute angle in a plan view.

4. The substrate processing system of claim 3, wherein the first transfer chamber is connected with two first processing chambers,
- the second transfer chamber is connected with two second processing chambers,
- a V shape is made by lines respectively connecting the centers of the two first processing chambers to the center of the first transfer chamber in a plan view, and
- a V shape is made by lines respectively connecting the centers of the two second processing chambers with the center of the second transfer chamber in a plan view.

5. The substrate processing system of claim 4, wherein the two first processing chambers are arranged closer to the loader module than the two second processing chambers, and
- the second transfer unit is arranged in a space between the two first processing chambers.

6. The substrate processing system of claim 4, wherein the two first processing chambers are respectively arranged to be directed in directions of the lines connecting the centers of the two first processing chambers with the center of the first transfer chamber, and
- the two second processing chambers are respectively arranged to be directed in directions of the lines connecting the centers of the two second processing chambers with the center of the second transfer chamber.

7. The substrate processing system of claim 6, wherein the first substrates are transferred into/out of the first processing chambers along the lines connecting the centers of the first processing chambers to the center of the first transfer chamber, and
- the second substrates are transferred into/out of the second processing chambers along the lines connecting the centers of the second processing chambers to the center of the second transfer chamber.

8. The substrate processing system of claim 1, wherein the loader module is provided with an additional atmospheric transfer robot so that two atmospheric transfer robots are provided.

9. The substrate processing system of claim 8, wherein the ports are arranged in a line in a plan view, and the loader module includes an atmospheric transfer chamber which is extended along the arrangement direction of the ports,
- the atmospheric transfer chamber has an orienter for substrate alignment in the longitudinal center of the atmospheric transfer chamber, and the two atmospheric transfer robots arranged on longitudinally opposite sides of the atmospheric transfer chamber, and
- each of the two atmospheric transfer robots is able to access the orienter, the first load-lock chamber and the second load-lock chamber.

10. The substrate processing system of claim 9, wherein the first transfer unit includes an additional first load-lock chamber so that two first load-lock chambers are provided, and the second transfer unit includes an additional second load-lock chamber so that two second load-lock chambers are provided.

11. The substrate processing system of claim 10, wherein a length of a substrate transfer pass from the orienter to the first processing chamber via the first transfer unit remains unchanged whether the substrate transfer path goes through either of the two first load-lock chambers, and
- a length of a substrate transfer pass from the orienter to the second processing chamber via the second transfer unit remains unchanged whether the substrate transfer path goes through either of the two second load-lock chambers.

12. The substrate processing system of claim 1, wherein an inspection device for inspecting a substrate and a storage for accommodating the substrate are connected to each of at least one of the first transfer chamber and the second transfer chamber.

13. The substrate processing system of claim 1, wherein said at least one first processing chamber is arranged closer to the loader module than said at least one second processing chamber, and
- the first transfer unit is disposed above the second transfer unit.

14. The substrate processing system of claim 13, wherein said at least one first processing chamber is mounted on a base such that an installation plane on which said at least one first processing chamber is installed becomes higher than an installation plane on which said at least one second processing chamber is installed.

15. The substrate processing system of claim 1, wherein at least one of a gas supply system and a radio frequency power supplying unit is provided at an upper portion of at least one of said at least one first processing chamber and said at least one second processing chamber, and a gas exhausting unit for vacuum-exhausting the interiors of said at least one first processing chamber and said at least one second processing chamber is provided at a lower portion of at least one of said at least one first processing chamber and said at least one second processing chamber.

16. The substrate processing system of claim 1, wherein the ports are arranged in a line in a plan view, and the loader module includes an atmospheric transfer chamber which is extended in an arrangement direction of the ports and is provided with the atmospheric transfer robot, and
- the first and second transfer units are connected to the atmospheric transfer chamber which is elongated in the arrangement direction of the plurality of ports.

17. The substrate processing system of claim 16, wherein the loader module is configured to be able to be bisected at the longitudinal center thereof.

18. The substrate processing system of claim 1, further comprising a third transfer unit which is configured to transfer third substrates accommodated in the cassettes and is provided at a position having a height different from those of the first and second transfer units while extending from the loader module to at least one third processing chamber for executing a process,
- wherein the third transfer unit includes a third load-lock chamber, into which the third substrates are transferred by the atmospheric transfer robot, and a third transfer chamber which is provided with a third vacuum transfer robot for transferring the third substrates, which have been transferred into the third load-lock chamber, into said at least one third processing chamber, said at least one third processing chamber is not vertically overlapped with said at least one first processing chamber and said at least one second processing chamber, and at least a portion of the first transfer unit, at least a portion of the second transfer unit and at least a portion of the third transfer unit are vertically overlapped.

19. The substrate processing system of claim 18, wherein the third processing chamber is arranged farther from the loader module than the first processing chamber and the second processing chamber, the third load-lock chamber of the third transfer unit is extended from the loader module toward the third transfer chamber, and the third load-lock chamber is provided with a movement mechanism for linearly moving the third substrates in a longitudinal direction of the third load-lock chamber.

20. The substrate processing system of claim 1, wherein at least a portion of said at least one first processing chamber and at least a portion of said at least one second processing chamber are overlapped with each other in a side view.

21. A substrate processing system comprising:
a loader module which is provided with a plurality of ports configured to receive a plurality of cassettes accommodating therein first substrates and second substrates and an atmospheric transfer robot; and
a first transfer unit configured to transfer the first substrates between the loader module and at least one first processing chamber for processing the first substrates,
wherein the first transfer unit includes a first load-lock chamber, into which the first substrates are transferred by the atmospheric transfer robot, and a first transfer chamber provided with a first vacuum transfer robot for transferring the first substrates, which have been loaded into the first load-lock chamber, into said at least one first processing chamber,
the loader module is provided with a connection port configured to connect a second transfer unit, which is provided at a position having a height different from that of the first transfer unit and transfers the second substrates between the loader module and at least one second processing chamber for processing the second substrates,
the second transfer unit includes a second load-lock chamber, into which the second substrates are transferred by the atmospheric transfer robot, and a second transfer chamber provided with a second vacuum transfer robot for transferring the second substrates, which have been loaded into the second load-lock chamber, into said at least one second processing chamber,
at least a portion of the first transfer unit and at least a portion of the second transfer unit are vertically overlapped, and
said at least one first processing chamber and said at least one second processing chamber are not vertically overlapped,
wherein at least a portion of the first load-lock chamber and a portion of the first transfer chamber are vertically overlapped with the loader module, and
wherein, when the portion of the first transfer chamber is placed on the loader module, a support member supporting the first transfer chamber is provided to prevent a weight of the first transfer chamber from being applied to the loader module.

22. The substrate processing system of claim 21, wherein at least a portion of said at least one first processing chamber and at least a portion of said at least one second processing chamber are overlapped with each other in a side view.

23. The substrate processing system of claim 21, wherein at least a portion of said at least one first processing chamber and at least a portion of said at least one second processing chamber are overlapped with each other in a side view.

24. A substrate processing system comprising:
a loader module which is provided with a plurality of ports configured to receive a plurality of cassettes accommodating therein first substrates and second substrates and an atmospheric transfer robot;
a first load-lock chamber which is connected to the loader module and into which the first substrates are transferred by the atmospheric transfer robot;
a first transfer chamber which is provided with a first vacuum transfer robot for transferring the first substrates, which have been transferred into the first load-lock chamber, into at least one first processing chamber for executing a process,
a first transfer unit configured to transfer the first substrates between the loader module and said at least one first processing chamber for processing the first substrates; and
a second transfer unit which is provided at a height different from that of the first transfer unit and is configured to transfer the second substrates between the loader module and at least one second processing chamber for processing the second substrates, and
wherein the first transfer unit includes the first load-lock chamber into which the first substrates are transferred by the atmospheric transfer robot, and the first transfer chamber provided with the first vacuum transfer robot for transferring the first substrates, which have been loaded into the first load-lock chamber, into said at least one first processing chamber,
the second transfer unit includes a second load-lock chamber into which the second substrates are transferred by the atmospheric transfer robot, and a second transfer chamber provided with a second vacuum transfer robot for transferring the second substrates, which have been loaded into the second load-lock chamber, into said at least one second processing chamber,
at least a portion of the first load-lock chamber or the first transfer chamber is vertically overlapped with the loader module,
said at least one first processing chamber and said at least one second processing chamber are not vertically overlapped, and
at least a portion of the first transfer unit and at least a portion of the second transfer unit are vertically overlapped.

25. The substrate processing system of claim 24, wherein at least a portion of said at least one first processing chamber and at least a portion of said at least one second processing chamber are overlapped with each other in a side view.

26. A transfer module comprising:
a loader module which is provided with a plurality of ports configured to receive a plurality of cassettes accommodating therein first substrates and second substrates and an atmospheric transfer robot;
a first transfer unit including a first load-lock chamber, which is connected to the loader module and into which the first substrates are transferred by the atmospheric transfer robot, and a first transfer chamber which is connected to the first load-lock chamber and is provided with a first vacuum transfer robot for transferring the first substrates transferred into the first load-lock chamber; and a second transfer unit including a second load-lock chamber, which is connected to the loader module and into which the second substrates are transferred by the atmospheric transfer robot, and a second transfer chamber which is connected to the second load-lock chamber and is provided with a second vacuum transfer robot for transferring the second substrates transferred into the second load-lock chamber, wherein the first transfer unit and the second transfer unit are provided at positions having different heights, at least a portion of the first transfer unit and at least a portion of the second transfer unit are vertically overlapped, and the second transfer chamber is arranged farther from the loader module than the first transfer chamber, and wherein the first transfer chamber and the second transfer chamber are configured to be connected to at least one first processing chamber and at least one second processing chamber, respectively, and wherein the first transfer chamber and the second transfer chamber are not vertically overlapped, so that, when connected to the first transfer chamber and the second transfer chamber, each of said at least one first processing chamber is not vertically overlapped to any of said at least one second processing chamber.

27. The transfer module of claim 26, wherein at least a portion of the first load-lock chamber is vertically overlapped with the loader module.

28. The transfer module of claim 27, wherein the first transfer chamber of the first transfer unit and the second load-lock chamber of the second transfer unit are vertically overlapped.

29. The transfer module of claim 26, wherein the loader module is provided with an additional atmospheric transfer robot so that two atmospheric transfer robots are provided.

30. The transfer module of claim 26, wherein the ports are arranged in a line in a plan view, and the loader module includes an atmospheric transfer chamber which is extended in an arrangement direction of the ports and is provided with the atmospheric transfer robot, and the first and second transfer units are connected to the atmospheric transfer chamber which is extended in the arrangement direction of the ports.

31. The transfer module of claim 26, further comprising a third transfer unit including a third load-lock chamber, which is connected to the loader module and into which third substrates accommodated in the cassettes are transferred by the atmospheric transfer robot, and a third transfer chamber which is connected to the third load-lock chamber and is provided with a third vacuum transfer robot for transferring the third substrates transferred into the third load-lock chamber, wherein the third transfer unit is provided at a position having a height different from those of the first transfer unit and the second transfer unit, said at least a portion of the first transfer unit, said at least a portion of the second transfer unit and at least a portion of the third transfer unit are vertically overlapped, and the third transfer chamber of the third transfer unit is arranged farther from the loader module than the first transfer chamber of the first transfer unit and the second transfer chamber of the second transfer unit.

32. A transfer module comprising:

a loader module which is provided with a plurality of ports configured to receive a plurality of cassettes accommodating therein first substrates and second substrates and an atmospheric transfer robot; and a first transfer unit including a first load-lock chamber, which is connected to the loader module and into which the first substrates are transferred by the atmospheric transfer robot, and a first transfer chamber which is connected to the first load-lock chamber and is provided with a first vacuum transfer robot for transferring the first substrates transferred into the first load-lock chamber, wherein the loader module is provided with a connection port configured to connect with a second transfer unit which is provided at a position having a height different from that of the first transfer unit and transfers the second substrates, the second transfer unit includes a second load-lock chamber into which the second substrates are transferred by the atmospheric transfer robot and a second transfer chamber which is connected to the second load-lock chamber and is provided with a second vacuum transfer robot for transferring the second substrates transferred into the second load-lock chamber, at least a portion of the first transfer unit and at least a portion of the second transfer unit are vertically overlapped, the second transfer chamber is arranged farther from the loader module than the first transfer chamber, and wherein the first transfer chamber and the second transfer chamber are configured to be connected to at least one first processing chamber and at least one second processing chamber, respectively, and wherein the first transfer chamber and the second transfer chamber are not vertically overlapped, so that, when connected to the first transfer chamber and the second transfer chamber, each of said at least one first processing chamber is not vertically overlapped to any of said at least one second processing chamber.

33. A transfer module comprising:

a loader module which is provided with a plurality of ports configured to receive a plurality of cassettes accommodating therein first substrates and second substrates and an atmospheric transfer robot;

a first transfer unit including a first load-lock chamber, which is connected to the loader module and into which the first substrates are transferred by the atmospheric transfer robot, and a first transfer chamber which is connected to the first load-lock chamber and is provided with a first vacuum transfer robot for transferring the first substrates transferred into the first load-lock chamber; and a second transfer unit including a second load-lock chamber, which is connected to the loader module and into which the second substrates are transferred by the atmospheric transfer robot, and a second transfer chamber which is connected to the second load-lock chamber and is provided with a second vacuum transfer robot for transferring the second substrates transferred into the second load-lock chamber, wherein the first transfer unit and the second transfer unit are provided at positions having different heights, at least a portion of the first transfer chamber of the first transfer unit and at least a portion of the second load-lock chamber of the second transfer unit are vertically overlapped, and the second transfer chamber is arranged farther from the loader module than the first transfer chamber.

34. A transfer module comprising:

a loader module which is provided with a plurality of ports configured to receive a plurality of cassettes accommodating therein first substrates and second substrates and an atmospheric transfer robot; and a first transfer unit including a first load-lock chamber, which is connected to the loader module and into which the first substrates are transferred by the atmospheric transfer robot, and a first transfer chamber which is provided with a first vacuum transfer robot for transferring the first substrates transferred into the first load-lock chamber, wherein at least a portion of the first load-lock chamber or the first transfer chamber are vertically overlapped with the loader module, and the loader module is provided with a connection port configured to connect with a second transfer unit which is provided at a position having a height different from that of the first transfer unit and transfers the second substrates;

wherein the second transfer unit includes a second load-lock chamber, into which the second substrates are transferred by the atmospheric transfer robot, and a second transfer chamber which is connected to the load-lock chamber and is provided with a second vacuum transfer robot for transferring the second substrates transferred into the second load-lock chamber under a vacuum, at least a portion of the first transfer unit and at least a portion of the second transfer unit are vertically overlapped, and the second transfer chamber is arranged farther from the loader module than the first transfer chamber.

35. A substrate processing system comprising:

a loader module which is provided with a plurality of ports configured to receive a plurality of cassettes accommodating therein first substrates and second substrates, and an atmospheric transfer robot;

a first transfer unit configured to transfer the first substrates between the loader module and at least one first processing chamber for processing the first substrates; and a second transfer unit which is provided at a height different from that of the first transfer unit and is configured to transfer the second substrates between the loader module and at least one second processing chamber for processing the second substrates, wherein the first transfer unit includes a first load-lock chamber, into which the first substrates are transferred by the atmospheric transfer robot, and a first transfer chamber provided with a first vacuum transfer robot for transferring the first substrates, which have been loaded into the first load-lock chamber, into said at least one first processing chamber, wherein the second transfer unit includes a second load-lock chamber, into which the second substrates are transferred by the atmospheric transfer robot, and a second transfer chamber provided with a second vacuum transfer robot for transferring the second substrates, which have been loaded into the second load-lock chamber, into said at least one second processing chamber, and wherein said at least one first processing chamber and said at least one second processing chamber are not vertically overlapped and at least a portion of the first transfer unit and at least a portion of the second transfer unit are vertically overlapped, wherein at least a portion of the first load-lock chamber and a portion of the first transfer chamber are vertically overlapped with the loader module, wherein the first transfer chamber is connected with two first processing chambers, wherein the second transfer chamber is connected with two second processing chambers, wherein the two first processing chambers are arranged closer to the loader module than the two second processing chambers, and wherein the second transfer unit is arranged in a space between the two first processing chambers.

* * * * *